(12) United States Patent
Asamizu

(10) Patent No.: US 10,876,220 B2
(45) Date of Patent: *Dec. 29, 2020

(54) SIC EPITAXIAL WAFER, MANUFACTURING APPARATUS OF SIC EPITAXIAL WAFER, FABRICATION METHOD OF SIC EPITAXIAL WAFER, AND SEMICONDUCTOR DEVICE

(71) Applicant: ROHM CO., LTD., Kyoto (JP)

(72) Inventor: Hirokuni Asamizu, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/740,025

(22) Filed: Jan. 10, 2020

(65) Prior Publication Data

US 2020/0149188 A1 May 14, 2020

Related U.S. Application Data

(63) Continuation of application No. 16/397,662, filed on Apr. 29, 2019, now Pat. No. 10,570,529, which is a
(Continued)

(30) Foreign Application Priority Data

Sep. 16, 2015 (JP) ................. 2015-182974

(51) Int. Cl.
*C30B 29/36* (2006.01)
*C30B 25/20* (2006.01)
(Continued)

(52) U.S. Cl.
CPC .............. *C30B 29/36* (2013.01); *C23C 16/42* (2013.01); *C30B 25/183* (2013.01); *C30B 25/20* (2013.01);
(Continued)

(58) Field of Classification Search
CPC ....... C30B 29/36; C30B 25/18; C30B 25/183; C30B 25/20; C23C 16/42; H01L 29/12;
(Continued)

(56) References Cited

U.S. PATENT DOCUMENTS 10,323,335 B2 * 6/2019 Asamizu ................. H01L 29/32
10,323,355 B2 6/2019 Alberts et al.
(Continued)

FOREIGN PATENT DOCUMENTS

JP 2000-319099 11/2000
JP 2002-261275 9/2002
(Continued)

OTHER PUBLICATIONS

Song et al., "Basal plane dislocation conversion near the epilayer/ substrate interface in epitaxial growth of 40° off-axis 4H-SiC", Journal of Crystal Growth 371, (2013), pp. 94-101.
(Continued)

*Primary Examiner* — Monica D Harrison
(74) *Attorney, Agent, or Firm* — Hamre, Schumann, Mueller & Larson, P.C.

(57) ABSTRACT

A SiC epitaxial wafer includes: a substrate having an off angle of less than 4 degrees; and a SiC epitaxial growth layer disposed on the substrate having the off angle of less than 4 degrees, wherein an Si compound is used for a supply source of Si, and a C compound is used as a supply source of C, for the SiC epitaxial growth layer, wherein the uniformity of carrier density is less than 10%, and the defect density is less than 1 count/cm$^2$; and a C/Si ratio of the Si compound and the C (carbon) compound is within a range of 0.7 to 0.95. There is provide a high-quality SiC epitaxial wafer excellent in film thickness uniformity and uniformity of carrier den-
(Continued)

sity, having the small number of surface defects, and capable of reducing costs, also in low-off angle SiC substrates on SiC epitaxial growth.

10 Claims, 30 Drawing Sheets

Related U.S. Application Data continuation of application No. 15/918,434, filed on Mar. 12, 2018, now Pat. No. 10,323,335, which is a continuation of application No. PCT/JP2016/074794, filed on Aug. 25, 2016.

(51) Int. Cl.

| | | |
|---|---|---|
| *C23C 16/42* | (2006.01) | |
| *H01L 29/78* | (2006.01) | |
| *H01L 29/872* | (2006.01) | |
| *H01L 29/12* | (2006.01) | |
| *H01L 21/02* | (2006.01) | |
| *C30B 25/18* | (2006.01) | |
| *H01L 29/16* | (2006.01) | |
| *H01L 29/32* | (2006.01) | |

(52) U.S. Cl.
CPC .... *H01L 21/0262* (2013.01); *H01L 21/02378* (2013.01); *H01L 21/02433* (2013.01); *H01L 21/02447* (2013.01); *H01L 21/02529* (2013.01); *H01L 29/12* (2013.01); *H01L 29/1608* (2013.01); *H01L 29/32* (2013.01); *H01L 29/78* (2013.01); *H01L 29/872* (2013.01); *H01L 21/0242* (2013.01); *H01L 21/02376* (2013.01); *H01L 21/02389* (2013.01); *H01L 29/7802* (2013.01); *H01L 29/7813* (2013.01)

(58) Field of Classification Search
CPC ..... H01L 29/16; H01L 29/16; H01L 29/1608; H01L 29/32; H01L 29/78; H01L 29/87; H01L 29/872; H01L 21/02; H01L 21/023; H01L 21/0237; H01L 21/02378; H01L 21/024; H01L 21/0243; H01L 21/02433; H01L 21/0244; H01L 21/02447; H01L 21/025; H01L 21/0252; H01L 21/02529; H01L 21/026; H01L 21/0262
USPC .......................................................... 257/77
See application file for complete search history.

(56) References Cited

U.S. PATENT DOCUMENTS

| | | |
|---|---|---|
| 2012/0146056 A1 | 6/2012 | Momose et al. |
| 2012/0231615 A1 | 9/2012 | Shiomi et al. |
| 2012/0280254 A1 | 11/2012 | Muto et al. |
| 2013/0049014 A1 | 2/2013 | Aigo et al. |
| 2013/0062628 A1 | 3/2013 | Das et al. |
| 2013/0320357 A1 | 12/2013 | Aigo et al. |
| 2014/0252378 A1 | 9/2014 | Ota et al. |
| 2014/0339571 A1 | 11/2014 | Momose et al. |
| 2015/0072100 A1 | 3/2015 | Genba et al. |
| 2015/0233018 A1 | 8/2015 | Genba et al. |

FOREIGN PATENT DOCUMENTS

| | | |
|---|---|---|
| JP | 4839646 B2 | 9/2006 |
| JP | 2006-321707 A | 11/2006 |
| JP | 2011-49496 A | 3/2011 |
| JP | 2011-121847 A | 6/2011 |
| JP | 2013-121898 A | 6/2013 |
| JP | 2013-239606 | 11/2013 |
| JP | 2014-175412 A | 9/2014 |
| JP | 2014-192163 | 10/2014 |
| JP | 2015-2207 A | 1/2015 |
| JP | 2015-51895 A | 3/2015 |
| WO | 2011/114858 | 9/2011 |
| WO | 2011/142470 A1 | 11/2011 |
| WO | 2012/144614 A1 | 10/2012 |
| WO | 2013/036376 A2 | 3/2013 |

OTHER PUBLICATIONS

Masumoto et al., "Conversion of basal plane dislocations to threading edge dislocations in growth of epitaxial layers on 4H-SiC substrates with a vicinal off-angle", Material Science Forum vols. 778-780, (2014) pp. 99-102.
Tamura et al.,"Homo-epitaxial growth on 2° off-cut 4H-SiC(0001) Si-face substrates using H2—SiH4—C3H8CVD system", Material Science Forum vols. 778-780, (2014), pp. 214-217.
Lilja et al., "Improved Epilayer Surface Morphology on 2° off-cut 4H-Sic Substrates", Material Science Forum vols. 778-780, (2014), pp. 206-209.
Via et al., "Epitaxial growth on 150 mm 2° off wafers", Material Science Forum vols. 821-823, (2015), pp. 157-160.
K. Kojima et al., "Reducing the wafer off angle for 4H-SiC homoepitaxy", ECS Transactions 58 (4), (2013), pp. 111-117.
Official Action dated Aug. 4, 2020 in the counterpart Japanese Patent Application No. 2019-160200, 11 pages including machine translation.

* cited by examiner

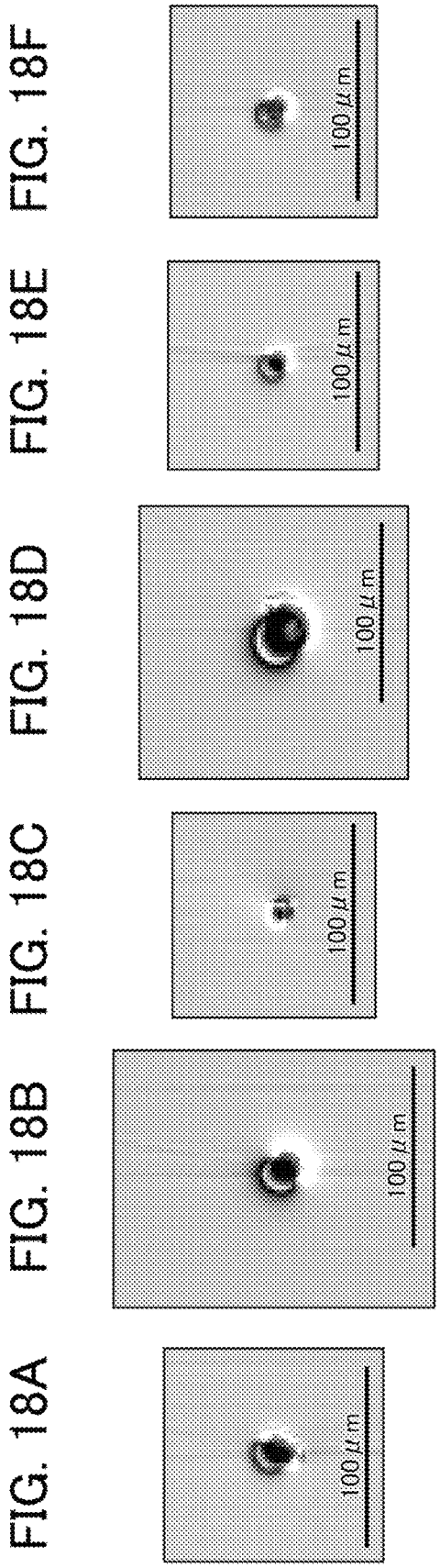

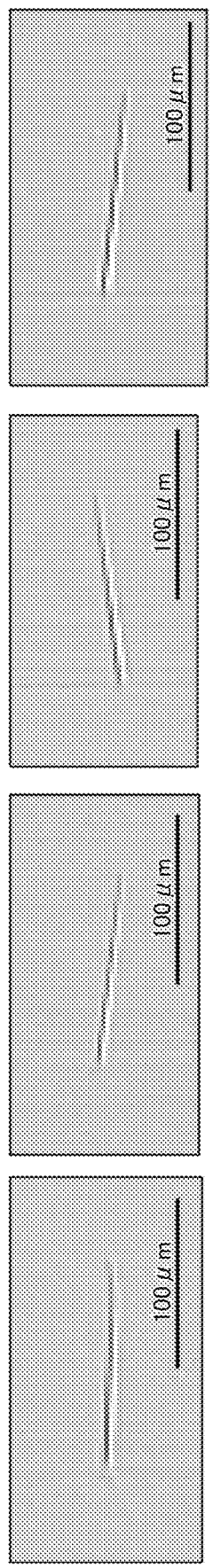

FIG. 21A
FIG. 21B
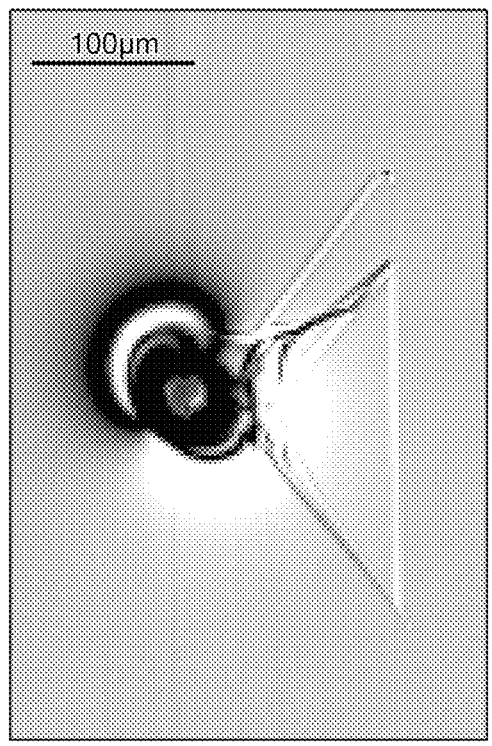
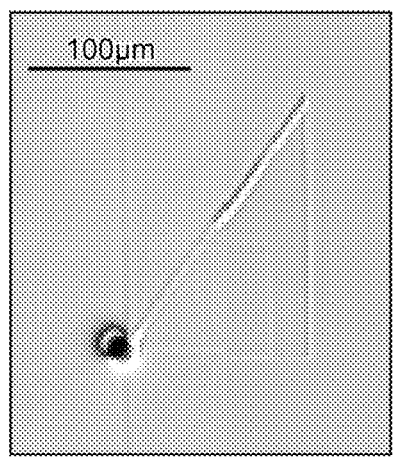

SIC EPITAXIAL WAFER, MANUFACTURING APPARATUS OF SIC EPITAXIAL WAFER, FABRICATION METHOD OF SIC EPITAXIAL WAFER, AND SEMICONDUCTOR DEVICE

CROSS REFERENCE TO RELATED APPLICATIONS

This is a continuation application (CA) of PCT Application No. PCT/JP2016/074794, filed on Aug. 25, 2016, which claims priority to Japan Patent Application No. P2015-182974 filed on Sep. 16, 2015 and is based upon and claims the benefit of priority from prior Japanese Patent Applications No. P2015-182974 filed on Sep. 16, 2015 and PCT Application No. PCT/JP2016/074794, filed on Aug. 25, 2016, the entire contents of each of which are incorporated herein by reference.

FIELD

The embodiments described herein relate a SiC epitaxial wafer, a manufacturing apparatus of the SiC epitaxial wafer, a fabrication method of the SiC epitaxial wafer, and a semiconductor device.

BACKGROUND

In recent years, much attention has been given to Silicon Carbide (SiC) semiconductors capable of realizing high breakdown voltage, high current use, low on resistance, high degree of efficiency, power consumption reduction, high speed switching, etc., since the SiC semiconductors have wider bandgap energy and higher breakdown voltage performance at high electric field, compared with Silicon (Si) semiconductors or Gallium Arsenide (GaAs) semiconductors. The SiC has received attention also in terms of environmental protections since occurrence of carbon dioxide gas ($CO_2$) can be reduced due to the low power consumption performance thereof.

Recently, the SiC devices have been applied to many applicable fields, e.g. air-conditioning apparatuses (air-conditioners), solar power generation systems, automobile systems, and train-vehicle systems.

Since SiC compound semiconductors capable of taking equal to or greater than 200 types of crystal polymorphisms, there may be stable structures different between a substrate (bulk) and an epitaxial growth layer formed on the substrate. Accordingly, the epitaxial growth layer formed on the SiC substrate having an off angle is 0 degree may include many crystal defects. Accordingly, it is general to provide an off angle in the substrate in order to form the SiC epitaxial growth layer.

In such a situation, one of the important problems in a case of applying the SiC is a point of cost. As a detail of the costs of SiC devices, wafer costs account for approximately 50%, SiC epitaxial growth costs account for approximately 22%, and fabrication process costs account for approximately 28%. For example, it is advantageous to use 150-mm (6-inch) φ wafers in terms of reducing the SiC device fabrication costs per unit area. However, it is general to use substrates having an off angle of 4 degrees, as the present 6-inch φ SiC wafers.

One method for a cost reduction of the SiC devices is to reduce such an off angle of the SiC substrate. However, if low-off angle substrates are used, it is difficult to realize high-quality epitaxial growth.

There has also already been reported results of SiC epitaxial growth performed on 4H—SiC substrates having an off angle of 2 degrees, from some groups. According to these reports, doping uniformity and film thickness uniformity can be satisfactorily controlled. However, occurrence of step bunching is increased and a triangular defect density is also increased, compared with SiC epitaxial growth on the SiC substrates having the off angle of 4 degrees. On the other hand, occurrence of the triangular defect can be relatively suppressed under high growth temperatures.

SUMMARY

Also for such low-off angle SiC substrates on the SiC epitaxial growth layers, it is desired to provide a SiC epitaxial growth technique which is capable of reducing occurrence of such step bunching or a triangular defect density, and is excellent in film thickness uniformity and uniformity of carrier density in a tradeoff relationship with the reduction of the defect density, and is capable of reducing the costs.

The embodiments provide: a high-quality SiC epitaxial wafer excellent in film thickness uniformity and uniformity of carrier density, having the small number of surface defects, and capable of reducing costs, also in low-off angle SiC substrates on SiC epitaxial growth; a manufacturing apparatus of such a SiC epitaxial wafer; a fabrication method of such a SiC epitaxial wafer; and a semiconductor device.

According to one aspect of the embodiments, there is provided a SiC epitaxial wafer comprising: a substrate having low-off angle of less than 4 degrees; and a SiC epitaxial growth layer disposed on the substrate, wherein an Si compound is used for a supply source of Si, and a Carbon (C) compound is used as a supply source of Carbon (C), for the SiC epitaxial growth layer, wherein the uniformity of carrier density is less than 10%, and the defect density is less than 1 count/$cm^2$; and a C/Si ratio between the Si compound and the Carbon (C) compound is within a range of 0.7 to 0.95.

According to another aspect of the embodiments, there is provided a fabrication method of a SiC epitaxial wafer comprising: preparing a SiC ingot, cutting the prepared SiC ingot with an off angle of less than 4 degrees, and polishing the cut SiC ingot to form a SiC bare wafer; removing a cut surface of the SiC bare wafer to form a SiC substrate having the off angle of less than 4 degrees; and crystal-growing a SiC epitaxial growth layer on the SiC substrate, wherein a material gas to be supplied contains an Si compound used as a supply source of Si, and Carbon (C) compound used as a supply source of Carbon (C), wherein the uniformity of carrier density is less than 10%, and the defect density is less than 1 count/$cm^2$; and a C/Si ratio between the Si compound and the Carbon (C) compound is within a range of 0.7 to 0.95.

According to still another aspect of the embodiments, there is provided a manufacturing apparatus of a SiC epitaxial wafer comprising: a gas injection port; a gas exhaust port; a heating unit; and a reactor, wherein a material gas supplied when forming the SiC epitaxial growth layer on the substrate having the off angle of less than 4 degrees contains an Si compound used as a supply source of Si, and Carbon (C) compound used as a supply source of Carbon (C), wherein the uniformity of carrier density is less than 10%, and the defect density is less than 1 count/$cm^2$; and a C/Si ratio between the Si compound and the Carbon (C) compound is within a range of 0.7 to 0.95.

According to yet another aspect of the embodiments, there is provided a semiconductor device comprising the above-mentioned SiC epitaxial wafer.

According to the embodiments, there can be provided: the high-quality SiC epitaxial wafer excellent in film thickness uniformity and uniformity of carrier density, having the small number of surface defects, and capable of reducing costs, also in low-off angle SiC substrates on SiC epitaxial growth; the manufacturing apparatus of such a SiC epitaxial wafer; the fabrication method of such a SiC epitaxial wafer; and the semiconductor device.

BRIEF DESCRIPTION OF DRAWINGS

FIG. 18A shows a defect which occurs when the SiC epitaxial growth layer is formed on the SiC substrate having the off angle of 2 degrees, which is an example of a downfall.

FIG. 18B shows a defect which occurs when the SiC epitaxial growth layer is formed on the SiC substrate having the off angle of 2 degrees, which is another example of the downfall.

FIG. 18C shows a defect which occurs when the SiC epitaxial growth layer is formed on the SiC substrate having the off angle of 2 degrees, which is still another example of the downfall.

FIG. 18D shows a defect which occurs when the SiC epitaxial growth layer is formed on the SiC substrate having the off angle of 2 degrees, which is yet another example of the downfall.

FIG. 18E shows a defect which occurs when the SiC epitaxial growth layer is formed on the SiC substrate having the off angle of 2 degrees, which is further example of the downfall.

FIG. 18F shows a defect which occurs when the SiC epitaxial growth layer is formed on the SiC substrate having the off angle of 2 degrees, which is still further example of the downfall.

FIG. 19A shows a defect which occurs when the SiC epitaxial growth layer is formed on the SiC substrate having the off angle of 2 degrees, which is an example of a carrot defect.

FIG. 19B shows a defect which occurs when the SiC epitaxial growth layer is formed on the SiC substrate having the off angle of 2 degrees, which is another example of a carrot defect.

FIG. 19C shows a defect which occurs when the SiC epitaxial growth layer is formed on the SiC substrate having the off angle of 2 degrees, which is still another example of a carrot defect.

FIG. 19D shows a defect which occurs when the SiC epitaxial growth layer is formed on the SiC substrate having the off angle of 2 degrees, which is yet another example of a carrot defect.

FIG. 21A shows defects which occur when the SiC epitaxial growth layer is formed on the SiC substrate having the off angle of 2 degrees, which is an example of a downfall and a triangular defect.

FIG. 21B shows defects which occur when the SiC epitaxial growth layer is formed on the SiC substrate having the off angle of 2 degrees, which is another example of a downfall and a triangular defect.

DESCRIPTION OF EMBODIMENTS

Figure 1A:
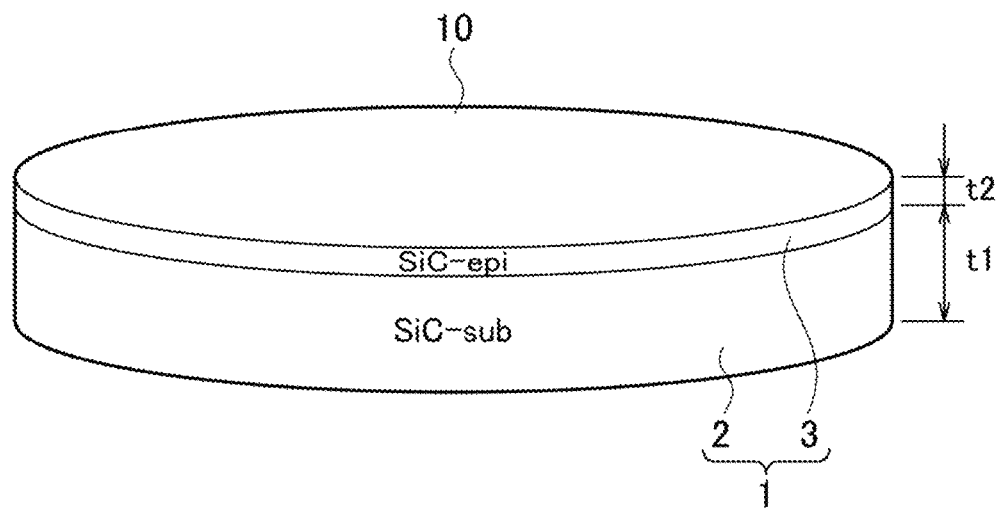
FIG. 1A is a schematic bird's-eye view configuration diagram of a SiC epitaxial wafer according to the embodiments.

Next, the embodiments will be described with reference to drawings. In the description of the following drawings, the identical or similar reference numeral is attached to the identical or similar part. However, it should be noted that the drawings are schematic and therefore the relation between thickness and the plane size and the ratio of the thickness differs from an actual thing. Therefore, detailed thickness and size should be determined in consideration of the following explanation.

Of course, the part from which the relation and ratio of a mutual size differ also in mutually drawings is included.

Moreover, the embodiments shown hereinafter exemplify the apparatus and method for materializing the technical idea; and the embodiments do not specify the material, shape, structure, placement, etc. of each component part as the following. The embodiments may be changed without departing from the spirit or scope of claims.

Embodiments

As shown in FIG. 1A, a SiC epitaxial wafer 1 according to the embodiments includes: a substrate 2 having an off angle of less than 4; and a SiC epitaxial growth layer 3 disposed on the substrate 2. In the embodiments, an Si (silicon) compound is used for a supply source of Si (silicon), and a Carbon (C) compound is used as a supply source of Carbon (C), for the SiC epitaxial growth layer 3. In this context, uniformity of carrier density may be less than 10% and a defect density is less than 1 count/$cm^2$; and a C/Si ratio between the Si compound and the Carbon (C) compound may be within a range of 0.7 to 0.95.

Figure 1B:
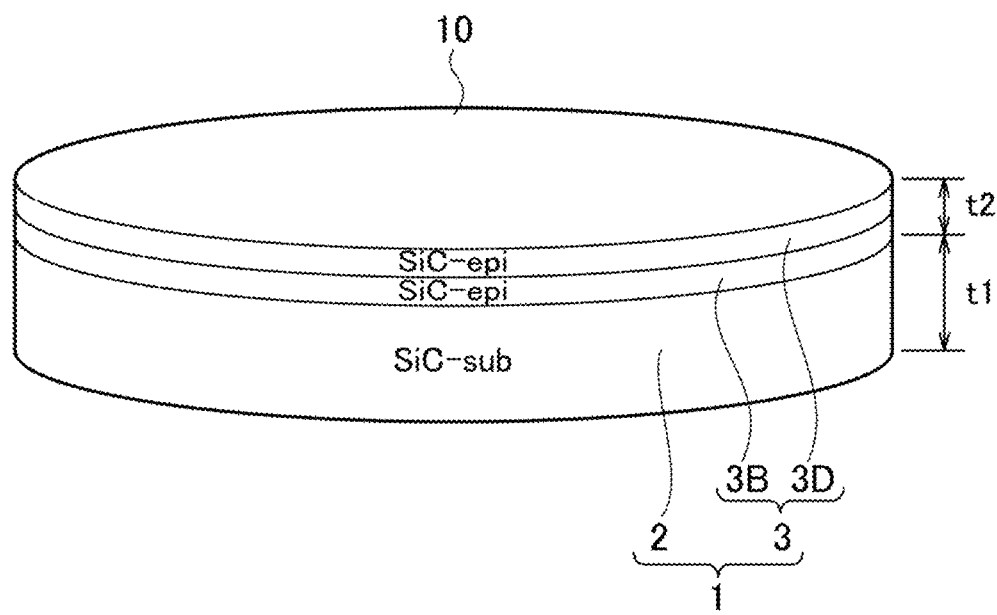
FIG. 1B is a schematic bird's-eye view configuration diagram of the SiC epitaxial wafer according to the embodiments, in which a SiC epitaxial growth layer includes a double layer structure having a buffer layer and a drift layer.

Moreover, as shown in FIG. 1B, the SiC epitaxial wafer 1 according to the embodiments may include: a substrate 2 having an off angle of less than 4; and a SiC epitaxial growth layer 3 disposed on the substrate 2, wherein the SiC epitaxial growth layer 3 may include a buffer layer 3B disposed on the substrate 2, and a drift layer 3D disposed on the buffer layer 3B. The uniformity of carrier density is less than 10%, and the defect density is less than 0.5 count/$cm^2$; and the C/Si ratio between the Si compound and the Carbon (C) compound in the buffer layer 3B is controlled to be lower than the C/Si ratio between the Si compound and the Carbon (C) compound in the drift layer 3D.

Moreover, the off angle of less than 4 degrees may be an angle of 2 degrees, for example.

Moreover, a diameter of the substrate having the off angle may be equal to or greater than 100 mm, for example.

Moreover, a growth temperature of the SiC epitaxial growth layer 3 may be within a range of 1630° C. to 1690° C.

Moreover, a growth pressure of the SiC epitaxial growth layer 3 may be within a range of 3 kPa to 11 kPa.

Moreover, a flow rate of carrier gas at the time of formation of the SiC epitaxial growth layer 3 may be within a range of 100 slm to 150 slm. In this context, the units "slm" is standard liter/min, and is a unit expressing a flow rate per minute under 1 atm at 0° C. by the liter.

The Si compound may contain any one material of $SiH_4$, $SiH_3F$, $SiH_2F_2$, $SiHF_3$, or $SiFP_4$, for example. Other compounds containing chlorine (Cl) may be used as the Si compound.

Moreover, the C compound may contain any one material of $C_3H_8$, $C_2H_4$, $C_2H_2$, $CF_4$, $C_2F_6$, $C_3F_8$, $C_4F_6$, $C_4F_8$, $CsF_8$, $CHF_3$, $CH_2F_2$, $CH_3F$, or $C_2HF_5$. Other compounds containing chlorine (Cl) may be used as the C compound.

Moreover, the SiC epitaxial growth layer 3 may contain any one material of 4H—SiC, 6H—SiC, 2H—SiC, or 3C—SiC.

The substrate 2 having an off angle of less than 4 may contain 4H—SiC or 6H—SiC. Any one BN, AlN, $Al_2O_3$, $Ga_2O_3$, diamond, carbon, or graphite may be contained instead of the SiC.

In the SiC epitaxial growth for the SiC epitaxial wafer according to the embodiments, at least one of $H_2$, Ar, HCl, and the $F_2$ is applicable as carrier gas.

As materials for dopant, nitrogen (N) or Trimethylaluminium (TMA: $(CH_3)_3Al$) is applicable.

(SiC Epitaxial Wafer)

A schematic bird's-eye view configuration of the SiC epitaxial wafer according to the embodiments is illustrated as shown in FIG. 1A or 1B.

The SiC epitaxial wafer 1 contains 4H—SiC, for example; and includes a SiC substrate 2 having an off angle of less than 4 degrees, and a SiC epitaxial growth layer 3 laminated on the SiC substrate 2. A thickness t1 of the SiC substrate 2 is approximately 200 μm to approximately 500 μm, for example, and a thickness t2 of the SiC epitaxial growth layer 3 is approximately 4 μm to approximately 100 μm, for example.

Moreover, as shown in FIG. 1B, the SiC epitaxial growth layer 3 may include a double layer structure between the buffer layer 3B and the drift layer 3D, wherein: the uniformity of carrier density may be less than 10%, and the defect density may be less than 0.5 count/cm$^2$; and the C/Si ratio between the Si compound and the Carbon (C) compound in the buffer layer 3B may be controlled to be lower than the C/Si ratio between the Si compound and the Carbon (C) compound in the drift layer 3D.

(Crystal Structure)

Figure 2A:
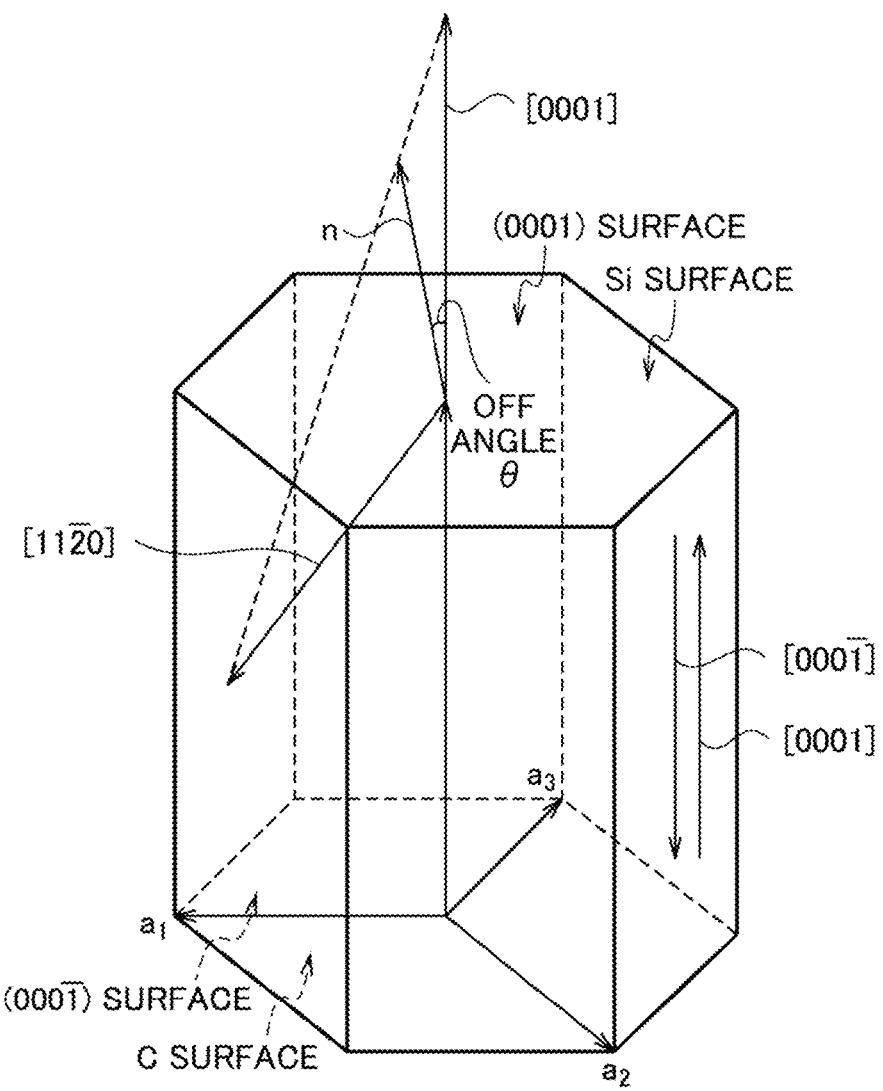
FIG. 2A is a schematic bird's-eye view configuration diagram showing a unit cell of a 4H—SiC crystal applicable to the SiC epitaxial wafer according to the embodiments.
Figure 2B:
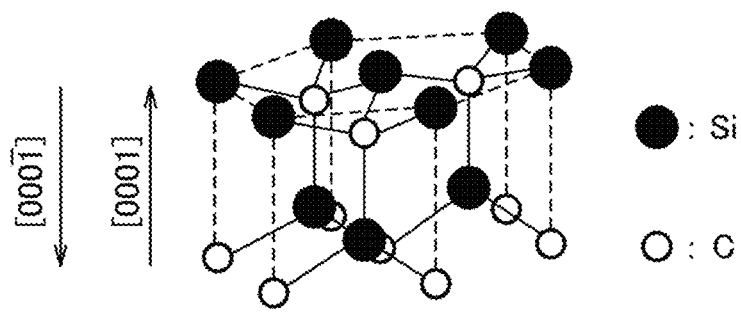
FIG. 2B is a schematic configuration diagram showing a two-layer portion of the 4H—SiC crystal.
Figure 2C:
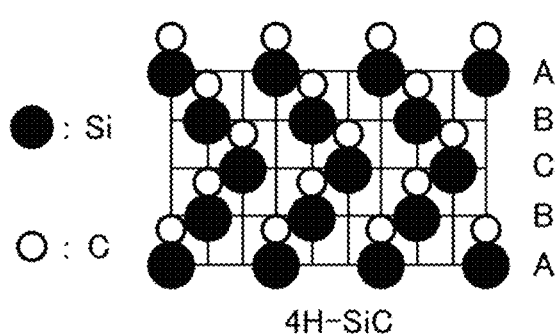
FIG. 2C is a schematic configuration diagram showing the unit cell of the 4H—SiC crystal.

FIG. 2A shows a schematic bird's-eye view configuration of a unit cell in a 4H—SiC crystal applicable to the SiC epitaxial wafer 1 according to the embodiments, FIG. 2B shows a schematic configuration of a two layer portion of the 4H—SiC crystal, and FIG. 2C shows a schematic configuration of a unit cell of the 4H—SiC crystal.

Figure 3:
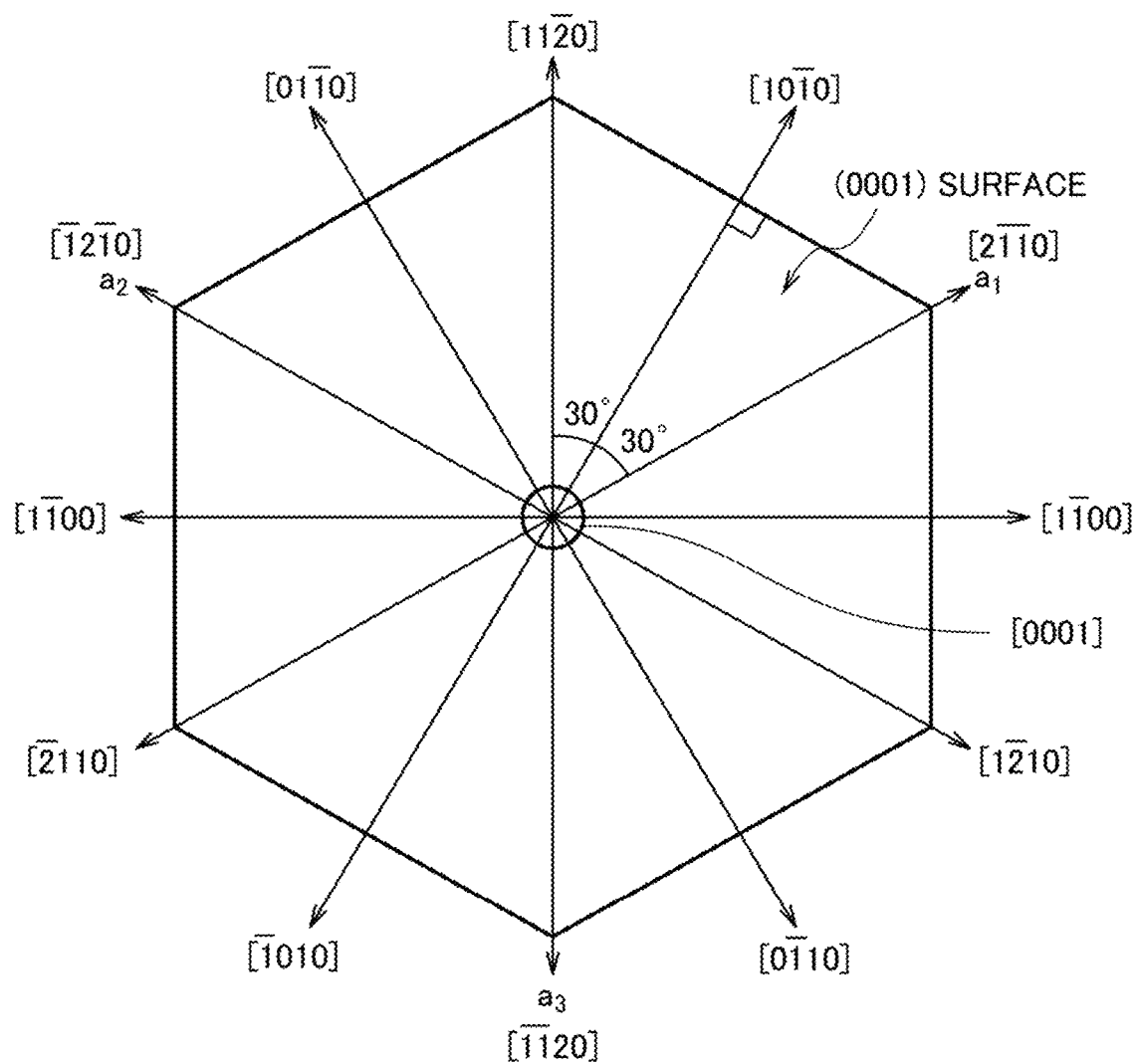
FIG. 3 is a schematic configuration diagram showing the unit cell of the 4H—SiC crystal shown in FIG. 2A observed from directly above a (0001) surface.

Moreover, FIG. 3 shows a schematic configuration of the unit cell of the 4H—SiC crystal structure of shown in FIG. 2A observed from directly above a (0001) surface.

As shown in FIGS. 2A to 2C, the crystal structure of the 4H—SiC can be approximated with a hexagonal system, and four C atoms are bound with respect to one Si atom. The four C atoms are positioned at four vertexes of a regular tetrahedron in which the Si atom is disposed at a center thereof. In the four C atoms, one Si atom is positioned in [0001] axial direction with respect to the C atom, and other three C atoms are positioned at a [000-1] axis side with respect to the Si atom.

The [0001] axis and [000-1] axis are along the axial direction of the hexagonal prism, and a surface (top surface of the hexagonal prism) using the [0001] axis as a normal line is (0001) surface (Si surface). On the other hand, a surface (bottom surface of the hexagonal prism) using the [000-1] axis as a normal line is (000-1) surface (C surface).

Moreover, directions vertical to the [0001] axis, and passing along the vertexes not adjacent with one another in the hexagonal prism observed from directly above the (0001) surface are respectively a1 axis [2-1-10], a2 axis [-12-10], and a3 axis [-1-120].

As shown in FIG. 3, a direction passing through the vertex between the a1 axis and the a2 axis is [11-20] axis, a direction passing through the vertex between the a2 axis and the a3 axis is [-2110] axis, and a direction passing through the vertex between the a3 axis and the a1 axis is [1-210] axis.

The axes which are incline at an angle of 30 degrees with respect to each axis of the both sides, and used as the normal line of each side surface of the hexagonal prism, between each of the axes of the above-mentioned six axes passing through the respective vertexes of the hexagonal prism, are respectively [10-10] axis, in the clockwise direction sequentially from between the a1 axis and the [11-20] axes, [1-100] axis, [0-110] axis, [-1010] axis, [-1100] axis, and [01-10] axis. Each surface (side surface of the hexagonal prism) using these axes as the normal line is a crystal surface right-angled to the (0001) surface and the (000-1) surface.

(Fabrication Method of SiC Epitaxial Wafer)

A fabrication method of the SiC epitaxial wafer according to the embodiments includes: preparing a SiC ingot 13, cutting the prepared SiC ingot 13 with an off angle θ of less than 4 degrees, and polishing the cut SiC ingot to form a SiC bare wafer 14; removing a cut surface of the SiC bare wafer 14 to form a SiC substrate 2 having an off angle of less than 4 degrees; forming an oxide film 16 on a principal surface of the SiC substrate 2; removing the oxide film 16; and crystal-growing a SiC epitaxial growth layer on the SiC substrate 2 having the off angle of less than 4 degrees. In the embodiments, a material gas to be supplied contains an Si compound used as a supply source of Si, and Carbon (C) compound used as a supply source of Carbon (C). In this context, uniformity of carrier density may be less than 10% and a defect density is less than 1 count/cm$^2$; and a C/Si ratio between the Si compound and the Carbon (C) compound is within a range of 0.7 to 0.95.

Moreover, the crystal-growing the SiC epitaxial growth layer 3 may include: crystal-growing a buffer layer 3B on the SiC substrate 2; and crystal-growing a drift layer 3D on the buffer layer 3B. In this context, uniformity of carrier density may be less than 10% and a defect density is less than 0.5 count/cm$^2$; and a C/Si ratio of the buffer layer 3B is controlled to be lower than a C/Si ratio of the drift layer 3D.

The off angle θ may be 2 degrees.

Moreover, a diameter of the substrate having the off angle may be equal to or greater than 100 mm, for example.

Moreover, a growth temperature of the SiC epitaxial growth layer 3 may be within a range of 1630° C. to 1690° C.

Moreover, a growth pressure of the SiC epitaxial growth layer 3 may be within a range of 3 kPa to 11 kPa.

Moreover, a flow rate of carrier gas at the time of formation of the SiC epitaxial growth layer 3 may be within a range of 100 slm to 150 slm.

Moreover, the SiC epitaxial growth layer 3 may contain any one of 4H—SiC, 6H—SiC, 2H—SiC, or 3C—SiC.

For example, the SiC bare wafer 14 was obtained by cutting the 4H—SiC ingot with an off angle of 2 degrees in the [11-20] axis direction with respect to the (0001) surface. A diameter of the SiC bare wafer 14 is approximately 150 mm.

Subsequently, the surface where the SiC bare wafer 14 is cut out is subjected to the polishing process, and then a suitable surface for the epitaxial wafer was obtained. In the polishing process, including a bevel process of the wafer edge, etc., the polished surface was finished by utilizing a chemical effect since it is not sufficiently able to remove processing damage merely by mechanical processes.

Before the epitaxial growth, the polished surface is sufficiently washed in order to clean the surface. In the embodiments, RCA washing, brush washing, functional-water washing, megasonic washing, etc. can be used, as a washing method.

A pressure in a reactor after disposing the wafer is kept at approximately 3 kPa to approximately 11 kPa, for example. $H_2$ used as a carrier gas of the materials is supplied into the reactor. An Ar gas may be supplied thereinto instead of $H_2$. By mixing HCl or HF to the carrier gas, a vapor phase reaction can be reduced, generation of particles on the epitaxial wafer can be suppressed, and thereby a high quality wafer can be supplied.

Figure 4A:
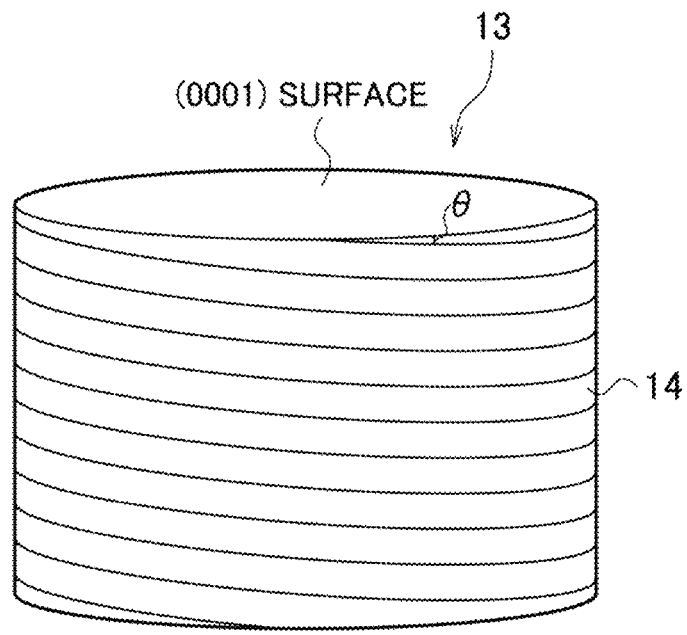
FIG. 4A is a process chart of: preparing a hexagonal-crystal SiC ingot; cutting the SiC ingot with an off angle θ of less than 4 degrees with respect to the (0001) surface; and then polishing the cut SiC ingot to form a plurality pieces of SiC bare wafers, in a schematic bird's-eye view structure diagram showing a fabrication method of the SiC epitaxial wafer according to the embodiments.
Figure 4B:
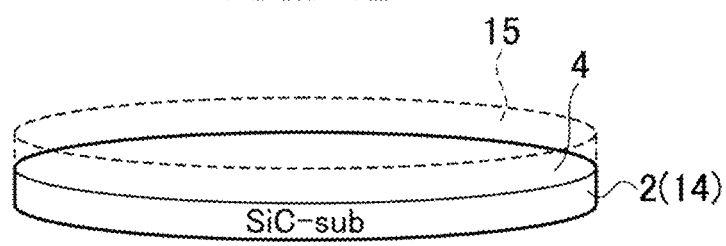
FIG. 4B is a process chart of removing a cut surface ((0001) surface) of the SiC bare wafer by equal to or greater than 500 nm, after a machining process.
Figure 4C:
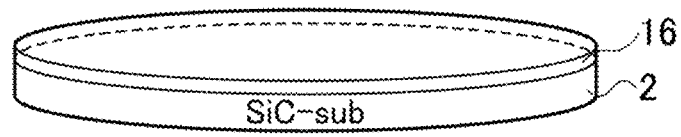
FIG. 4C is a process chart of forming an oxide film on a main face of the SiC substrate by applying an oxidation treatment to the main face ((0001) surface) of the SiC substrate.
Figure 4D:
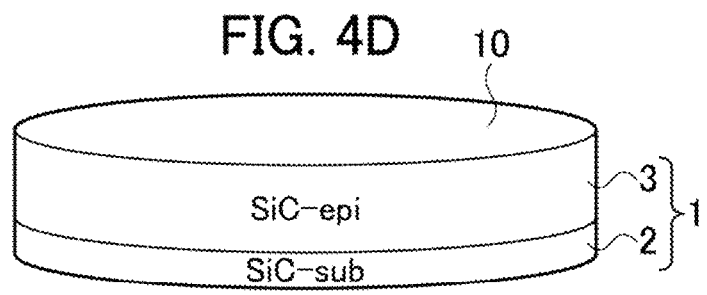
FIG. 4D is a process chart of forming a SiC epitaxial growth layer on a SiC substrate having an off angle of less than 4 degrees.

FIG. 4A shows the processing step of preparing a hexagonal-crystal SiC ingot 13, and cutting the SiC ingot 13 with an off angle θ of less than 4 degrees with respect to the (0001) surface, and polishing the cut SiC ingot 13 to form a plurality pieces of SiC bare wafers 14, in a schematic bird's-eye view configuration showing the fabrication method of the SiC epitaxial wafer according to the embodiments. Moreover, FIG. 4B shows the processing step of removing the cut surface 15 of the SiC bare wafer 14 after the machining process. Furthermore, FIG. 4C shows the processing step of forming an oxide film on the principal surface 4 of the SiC substrate 2 by applying an oxidation treatment to the principal surface 4 of the SiC substrate 2. Still further, FIG. 4D shows the processing step of forming a SiC epitaxial growth layer 3 on the SiC substrate 2.

(a) Firstly, as shown in FIG. 4A, the hexagonal-crystal SiC ingot 13 is prepared. Subsequently, a plurality pieces of the SiC bare wafer 14 are obtained by cutting the SiC ingot 13 with the off angle θ of less than 4 degrees in the [11-20] axis direction with respect to the (0001) surface. Next, the cut surface 15 ((0001) surface) of the SiC bare wafer 14 is polished by a machining process, such as lap processing etc.

(b) Subsequently, as shown in FIG. 4B, the cut surface 15 ((0001) surface) is removed by equal to or greater than approximately 500 nm, for example. As a removing method, Chemical Mechanical Polishing (CMP) technology, plasma etching technology, etc. are applicable, for example. Preferably, plasma etching may be applied. Although it is required for relative long time for CMP with less damage to remove the surface by equal to or greater than 500 nm since the SiC is an extremely hard material, the removing process will be completed in a short time, e.g., approximately 20 minutes, if the plasma etching is used. Due to an improvement of polishing technique, it is possible to remove the damaged layer in approximately 20 minutes per one wafer even if CMP is used, and therefore the plasma etching or the CMP can appropriately be selected. On the other hand, with regard to the cut surface 15 of the SiC bare wafer 14, the damage received by the plasma etching is small since the SiC is extremely hard. The damaged layer on the cut surface 15 of the SiC bare wafer 14 generated by the machining process after the cutting process is sufficiently removed by the above-mentioned removing process, and thereby the SiC substrate 2 having a thickness t1 of approximately 200 μm to approximately 500 μm is obtained.

(c) Subsequently, as shown in FIG. 4C, an oxidation treatment is applied on the principal surface 4 ((0001) surface) of the SiC substrate 2, and thereby the oxide film 16 is formed on the principal surface 4 of the SiC substrate 2. The oxidation treatment may be performed with a dry oxidation method or a wet oxidation method. Although illustration is omitted, the aforementioned oxide film 16 is formed also in a back side surface and a peripheral surface of the SiC substrate 2. Then, the oxide film 16 is removed using a fluoric acid (HF). By applying the formation process and the removing process of the oxide film 16, the damaged layer which cannot be removed by neither the CMP nor the plasma etching, and an altered layer (damaged layer) generated at the time of applying the CMP or plasma etching can be certainly removed from the cut surface 15 of the SiC bare wafer 14. The formation process and the removing process for the oxide film 16 may be performed only after the removing treatment of the cut surface 15 by equal to or greater than 500-nm thickness, but also only before the removing treatment or also before and after the removing treatment.

(d) Subsequently, as shown in FIG. 4D, the SiC epitaxial growth layer 3 is crystal-grown on the SiC substrate 2 having the off angle of less than 4 degrees.

As materials, $SiH_4$ and $C_3F_8$ are supplied thereto, for example. $SiH_4$ and $C_3F_8$ are respectively diluted with $H_2$ gas, and then are supplied into the reactor.

The epitaxial growth temperature may be within a range of approximately 1630° C. to approximately 1690° C., for example, and may properly be approximately 1680° C.

As a result of inspecting the epitaxially grown wafer surface, a surface-roughness defect density containing particles on the wafer was equal to or less than 0.07 $cm^{-2}$. Namely, only approximately ten defects are generated on a 150 mm wafer, and thereby a high quality wafer with few surface unevenness defects can be obtained.

Moreover, the growth surfaces may be the c surface, the (11-20) surface, or the (10-10) surface.

6H—SiC can also be used therefor instead of 4H—SiC. The wafer is heated at a temperature within a range of 1630° C. to 1690° C., and the $C_3H_8$ diluted with hydrogen is supplied into the reactor, in order to perform the SiC homoepitaxial growth. $SiHF_3$ can also be used for materials instead of $SiH_4$.

Figure 5:
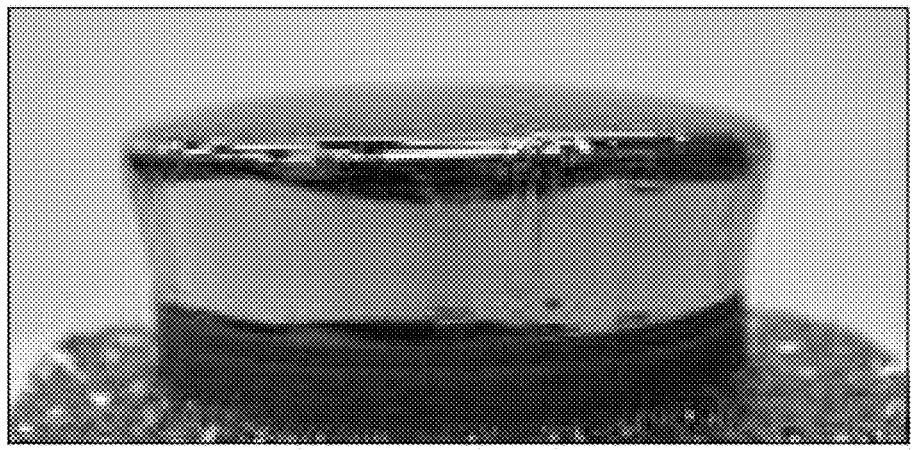
FIG. 5 shows an example of a photograph of a hexagonal-crystal SiC ingot from which the SiC epitaxial wafer is cut.

FIG. 5 shows an example of a photograph of a hexagonal-crystal SiC ingot from which a SiC epitaxial wafer is cut. A length of bulk crystal of the hexagonal-crystal SiC ingot is approximately 30 mm.

Figure 6A:
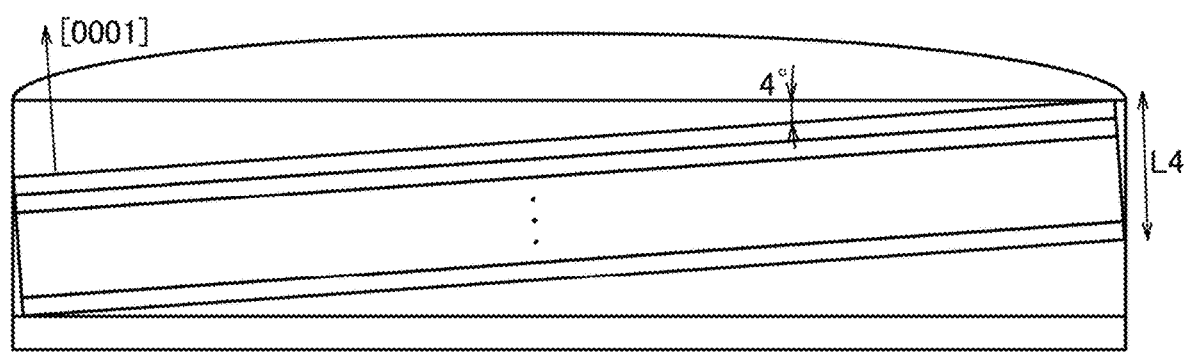
FIG. 6A is a schematic explanatory diagram showing an example of cutting the SiC epitaxial wafer from the SiC ingot at the off angle of 4 degrees, as a comparative example.
Figure 6B:
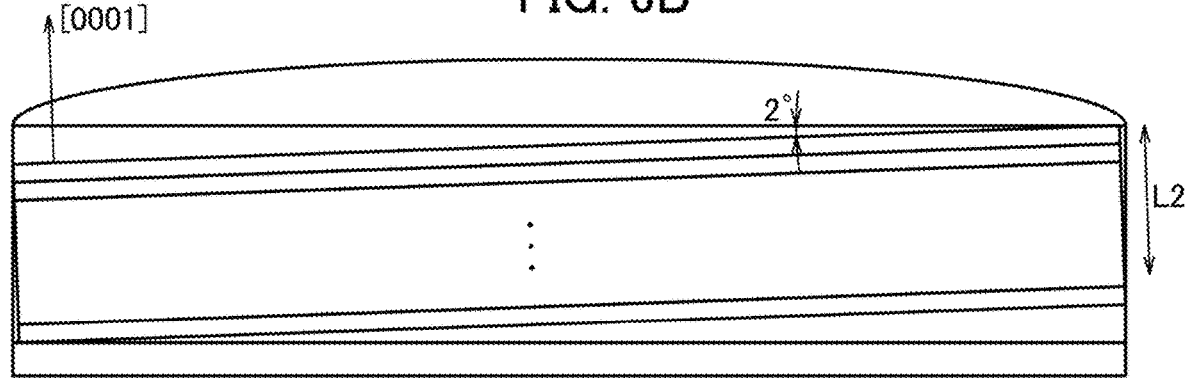
FIG. 6B is a schematic explanatory diagram showing an example of cutting the SiC epitaxial wafer from the SiC ingot at the off angle of two degrees.

FIG. 6A shows as schematic explanation of an example of cutting a SiC epitaxial wafer from the SiC ingot at an off angle of 4 degrees, as a comparative example. FIG. 6B shows a schematic explanation of an example of cutting a SiC epitaxial wafer from the SiC ingot at an off angle of two degrees.

The number of the SiC epitaxial wafers to be cut at the off angle of 4 degrees is 39, and the number of the SiC epitaxial wafers to be cut at the off angle of 2 degrees is 49, and thereby the number of the obtained wafers to be cut at the off angle of 2 degrees is increased by approximately 25%, where a thickness of a 6-inch φ wafer is 0.5 mm and a length of the bulk crystal is 30 mm. An occupied height L4 of the SiC epitaxial wafer to be cut at the off angle 4 of degrees is approximately 19.4 mm, in the bulk crystal having the length of 30 mm. On the other hand, an occupied height L2 of the SiC epitaxial wafer to be cut at the off angle 2 of degrees is approximately 24.6 mm.

Accordingly, wafer costs can be reduced by reducing the off angle of the substrate.

(Yield Curve)

Figure 7:
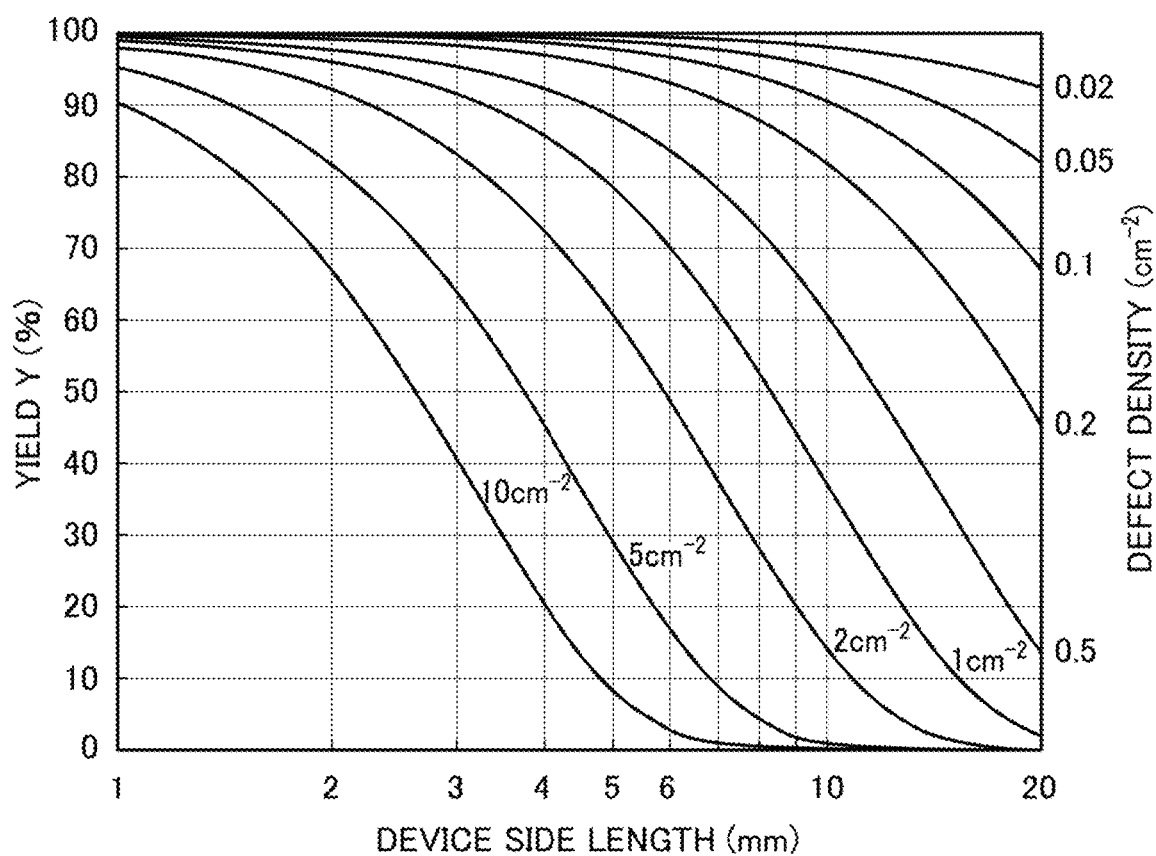
FIG. 7 is a relational chart between yield Y (%) and a device side length (mm), using a defect density (count(s)/cm$^2$) as a parameter.

FIG. 7 shows a relationship between yield Y (%) and a device side length (mm) of a square-shaped device, using a defect density ($cm^{-2}$) as a parameter.

In the case of the defect density is 0.2 count/$cm^2$, for example, if a SiC device of which the device side length is 10 mm is assumed, yield equal to or greater than 80% can be expected, and if a SiC device of which the device side length is 5 mm is assumed, yield equal to or greater than 95% can be expected.

On the one hand, in the case of an acceptable value of the defect density being equal to or less than 0.5 count/cm$^2$, yield is equal to or greater than 60% if a SiC device of which the device side length is 10 mm is assumed, but yield equal to or greater than 85% can be expected if a SiC device of which the device side length is 5 mm is assumed.

On the other hand, in the case of an acceptable value of the defect density being equal to or less than 1 count/cm$^2$, yield is equal to or greater than 35% if a SiC device of which the device side length is 10 mm is assumed, but yield equal to or greater than 75% can be expected if a SiC device of which the device side length is 5 mm is assumed.

(Conversion from BPD to TED and Off Angle of Substrate)

Figure 8A:
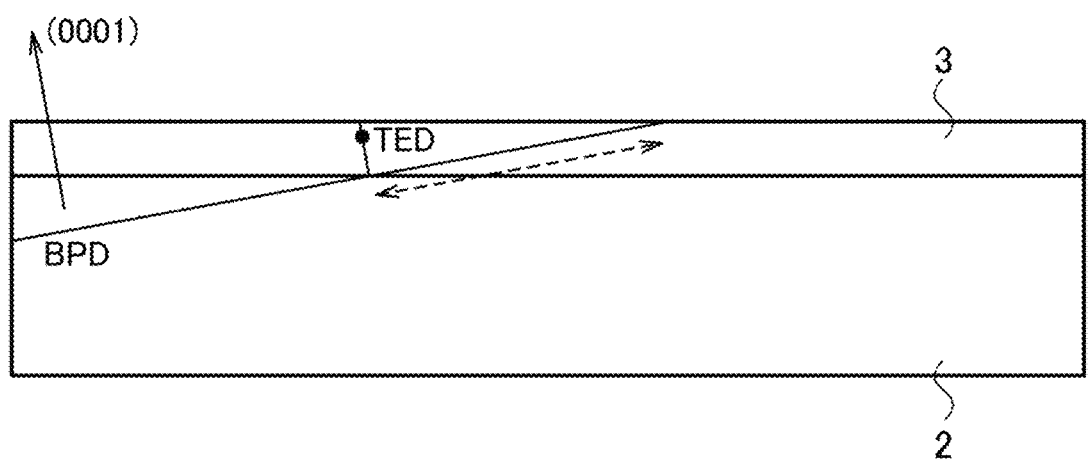
FIG. 8A is an explanatory diagram of an aspect of a conversion from a Basal Plane Dislocation (BPD) to a Threading Edge Dislocation (TED), in a case where an off angle is relatively large when forming the SiC epitaxial growth layer on the SiC substrate.
Figure 8B:
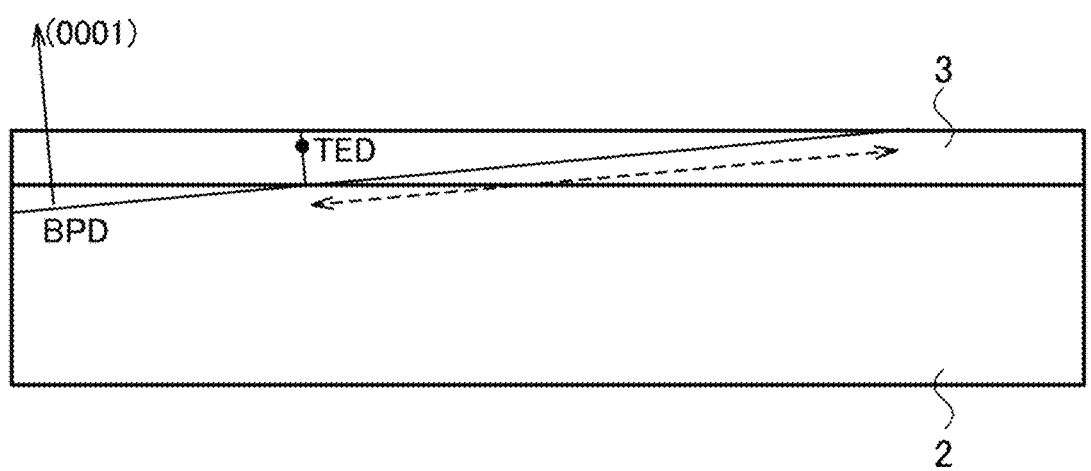
FIG. 8B is an explanatory diagram showing an aspect of the conversion from BPD to TED when the off angle is relatively small.

FIG. 8A shows an explanation of an aspect of a conversion from a Basal Plane Dislocation (BPD) to a Threading Edge Dislocation (TED), in a case where an off angle is relatively large when forming the SiC epitaxial growth layer on the low-off angle SiC substrate 2. FIG. 8B shows an explanation of an aspect of a conversion from the BPD to the TED, in a case where an off angle is relatively small.

A mechanism of increasing conversion probability from the basal plane dislocation (BPD) to the threading edge dislocation (TED) in the Sic epitaxial growth layer is as follows.

The BPD is extended in parallel to a c-plane (0001) of the SiC crystal in the hexagonal crystal structure, and the TED is extended in a direction vertically to the c-plane (0001).

SiC epitaxial growth by a Chemical Vapor Deposition (CVD) method advances by a step flow growth on the SiC substrate provided with an off angle.

When the SiC epitaxial growth layer is formed, the dislocation is transmitted to be extended from the SiC substrate to the SiC epitaxial growth layer, but the TED extended substantially to a layer thickness direction becomes shorter than the BPD extended substantially to be vertical to the layer thickness direction.

Since an energy of the TED of which a dislocation introduction (development) is short becomes small as the energy of the dislocation introduction (development) at the time of increasing the layer thickness of the SiC epitaxial growth layer, the BPD is easily converted into the TED.

An effect of the BPD being converted into the TED, it is more remarkable as the off angle to become small. If the off angle is varied from 4 degrees to 2 degrees, the length of the BPD to be extended by the SiC epitaxial growth becomes approximately twice as shown with the dashed line arrows in FIGS. 8A and 8B, and an energy difference in the case of being converted into the TED becomes large. Since the length of the BPD when not being converted becomes long and the energy difference of the dislocation introduction (decompression) between the TED and the BPD becomes large, if the off angle becomes small in particular, a conversion probability of the BPD to the TED becomes high.

For example, the conversion probability from the BPD to the TED when the layer thickness of the SiC epitaxial growth layer is 10 μm is 99.26% in a substrate having the off angle of 4 degrees, but is 99.97% in a substrate having the off angle of 1 degree.

According to the embodiments, there can be provided the high-quality SiC epitaxial wafer excellent in film thickness uniformity and uniformity of carrier density, having the small number of surface defects, and capable of reducing costs, also in low-off angle SiC substrates on SiC epitaxial growth.

According to the embodiments, it is possible to realize the SiC epitaxial growth capable of satisfying: excellent surface morphology equivalent to a SiC epitaxial growth layer formed on the substrate having the off angle of 4 degrees; uniformity of in-plane carrier density of a practical use level; and low defect density, in the SiC epitaxial growth layer formed on the 6-inch φ substrate having the off angle of 2 degrees.

The number of simultaneous processed wafers in the experiment is approximately three wafers, which are equivalent to 150 Φ mm (wafers. The number of the processed wafers can be further increased by applying first to fourth CVD apparatuses, mentioned below.

A layer thickness of a SiC epitaxial growth layer formed on the substrate having the off angle of 2 degrees is approximately 10.2 μm, for example.

Although a growth rate is a maximum of 40 μm/h in the SiC epitaxial growth layer formed on the substrate having the off angle of 4 degrees, a growth rate is approximately 9.8 μm/h, for example, in the SiC epitaxial growth layer formed on the substrate having the off angle of 2 degrees.

The film thickness uniformity can be approximately 1.2% in the SiC epitaxial growth layer formed on the substrate having the off angle of 2 degrees.

Doping concentration is approximately $1.5 \times 10^{16}$ cm$^{-3}$ in the SiC epitaxial growth layer formed on the substrate having the off angle of 4 degrees. On the other hand, the doping concentration can be approximately $1.0 \times 10^{16}$ cm$^{-3}$ in the SiC epitaxial growth layer formed on the substrate having the off angle of 2 degrees.

Uniformity of in-plane carrier density (σ/mean) is equal to or less than approximately 10% in the SiC epitaxial growth layer formed on the substrate having the off angle of 4 degrees. On the other hand, the uniformity thereof is equal to or less than approximately 7.0% in the SiC epitaxial growth layer formed on the substrate having the off angle of 2 degrees.

In the SiC epitaxial growth layer formed on the substrate having the off angle of 2 degrees, the uniformity of in-plane carrier density equivalent to that of the SiC epitaxial growth layer formed on the substrate having the off angle of 4 degrees can be obtained, keeping a morphology of the same degree as that of the SiC epitaxial growth layer formed on the substrate having the off angle of 4 degrees, up to the thickness of the epitaxial growth layer of approximately 10 μm.

Defect density (CANDELA) is 0.40 count/cm$^2$ in the SiC epitaxial growth layer formed on the substrate having the off angle of 4 degrees, but can be 0.16 count/cm$^2$ in the SiC epitaxial growth layer formed on the substrate having the off angle of 2 degrees.

Defect densities (SICA) is 0.69 count/cm$^2$ in the SiC epitaxial growth layer formed on the substrate having the off angle of 4 degrees, but can be 0.21 count/cm$^2$ in the SiC epitaxial growth layer formed on the substrate having the off angle of 2 degrees.

Carrot defect density is 0.44 count/cm$^2$ in the SiC epitaxial growth layer formed on the substrate having the off angle of 4 degrees, but can be 0.01 count/cm$^2$ in the SiC epitaxial growth layer formed on the substrate having the off angle of 2 degrees.

A result of reducing the surface defect density can be obtained by forming the substrate having the off angle of 2 degrees.

A conversion probability from the BPD to the TED in the layer thickness of 10 μm is within a range of 99.3 to 99.7% in the SiC epitaxial growth layer formed on the substrate having the off angle of 4 degrees, but can be within a range of 99.4% to 100% in the SiC epitaxial growth layer formed on the substrate having the off angle of 2 degrees. In this context, the defect density (CANDELA) is a defect density detected by a wafer surface inspection apparatus CANDELA made by KLA-Tencor Corporation. The CANDELA is configured to scan a laser light on a wafer surface, and detects particles and crystal defects on the wafer surface from a scattered light on the wafer surface.

The defect density (SICA) is a defect density detected by a wafer surface inspection apparatus SICA made by Lasertec Corporation. The SICA is capable of observing concavity and convexity in nanometer order on the surface of the SiC epitaxial growth layer by a confocal differential interference optical system. It is also possible to detect large step bunching and an epitaxial surface pit due to threading dislocation on the surface of the SiC epitaxial growth layer which affect reliability of SiC-MOS devices.

Moreover, an experimental result of reducing the carrot defect density has been confirmed if the off angle is changed from 4 degrees to 4 degrees. A mechanism thereof is as follows.

Although the carrot defect is a defect which grows up in a down step direction at the time of the epitaxial growth, with the threading screw dislocation (TSD) as a starting point, a length of the carrot defect occurring at the time of growing up the layer thickness of the epitaxial growth layer becomes long if the substrate off angle becomes small. If the off angle is changed from 4 degrees to 4 degrees, the length of the carrot defect becomes approximately twice. This has affected a magnitude relationship between an energy change due to an introduction of the carrot defect and an energy change in a case of being as in the TSD without occurrence of a carrot defect. As a result, if the off angle is changed from 4 degrees to 2 degrees, the carrot defect density is reduced.
(Epitaxial Growth Apparatus)

Figure 9A:
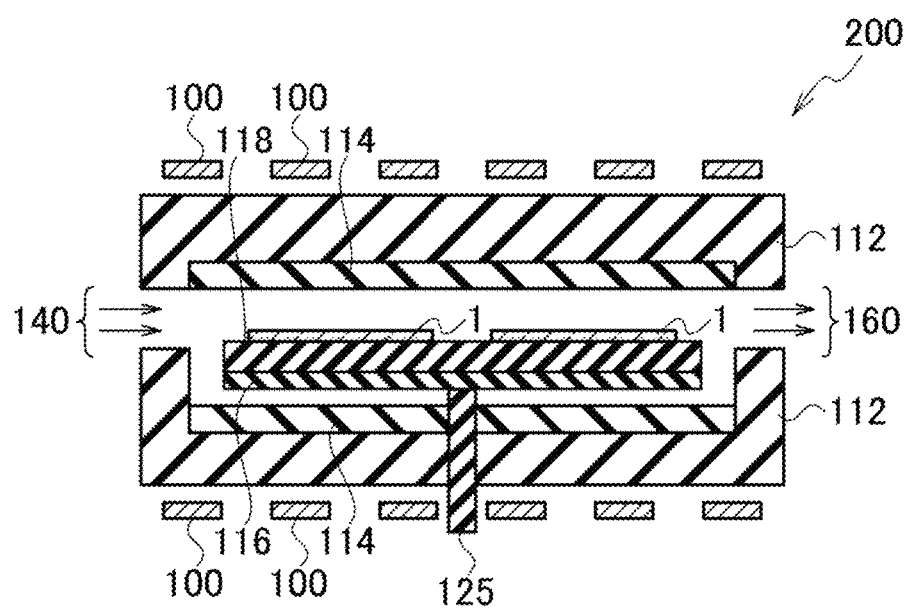
FIG. 9A is a schematic cross-sectional structure diagram in a gas flow channel direction showing an epitaxial growth apparatus applied when forming the SiC epitaxial growth layer on the SiC substrate having an off angle of 2 degrees according to the embodiments.
Figure 9B:
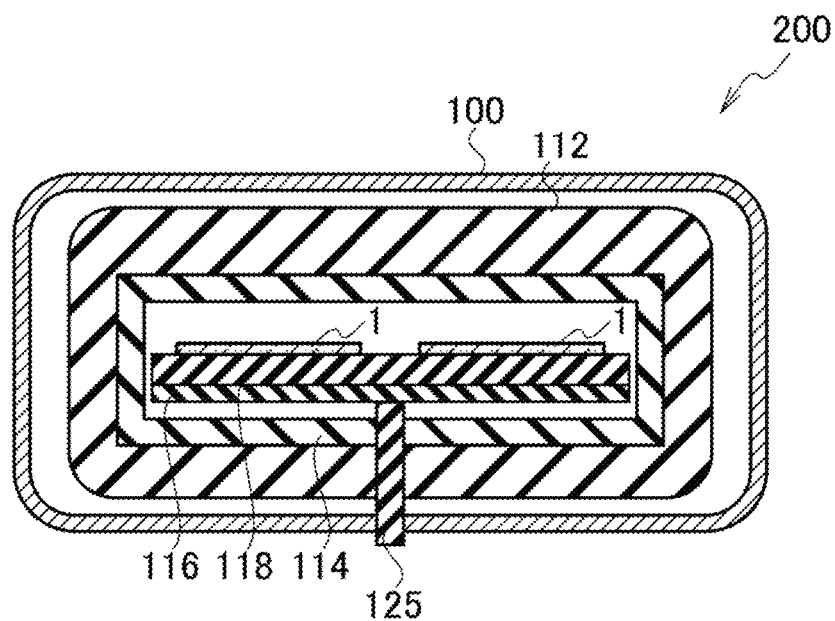
FIG. 9B is a schematic cross-sectional structure diagram in a direction vertical to the gas flow channel showing the epitaxial growth apparatus applied when forming the SiC epitaxial growth layer on the SiC substrate having the off angle of 2 degrees according to the embodiments.

FIG. 9A shows a schematic cross-sectional structure in a gas flow channel direction showing an epitaxial growth apparatus 200 applied when forming the SiC epitaxial growth layer on the low-off angle SiC substrate according to the embodiments, and FIG. 9B shows a schematic cross-sectional structure in a direction vertical to the gas flow channel.

As shown in FIGS. 9A and 9B, the epitaxial growth apparatus 200 according to the embodiments includes a gas injection port 140, a gas exhaust port 160, a heating unit 100, and a reactor. A material gas contains an Si compound used as a supply source of Si, and Carbon (C) compound used as a supply source of Carbon (C). The uniformity of carrier density may be less than 10%, and the defect density may be less than 1 count/cm$^2$; and a C/Si ratio between the Si compound and the Carbon (C) compound is within a range of 0.7 to 0.95.

As shown in FIG. 9A and FIG. 9B, the reactor includes a horizontal-type reactor, and a plurality pieces of the SiC epitaxial wafers 1 can be arranged in a face up manner in the horizontal-type reactor.

An induction heating method using a coil is adopted as a heating method of the heating unit 100.

The heating unit 100 is disposed via thermal insulation 112.

The SiC epitaxial wafers 1 are disposed on a holder plate 118 disposed between fixed susceptors 114. The holder plate 118 is disposed so as to be rotatable on a rotating susceptor 116 connected to a rotating-susceptor supporting base 125.

The fixed susceptor 114 and the rotating susceptor 116 are composed by including a structural member made from carbon. The structural member made from carbon generates heat, and the SiC epitaxial wafers 1 are heated by being contacted with the structural member made from carbon via the holder plate 118, or the SiC epitaxial wafers 1 are heated by a heated radiation from the structural member made from carbon. The holder plate 118 and the rotating-susceptor supporting base 125 can be composed by including a structural member made from stainless steel or a structural member made from carbon.

The epitaxial growth apparatus 200 according to the embodiments can simultaneously mount 3×150 mm, i.e., three 6 inch φ wafers.

Figure 10:
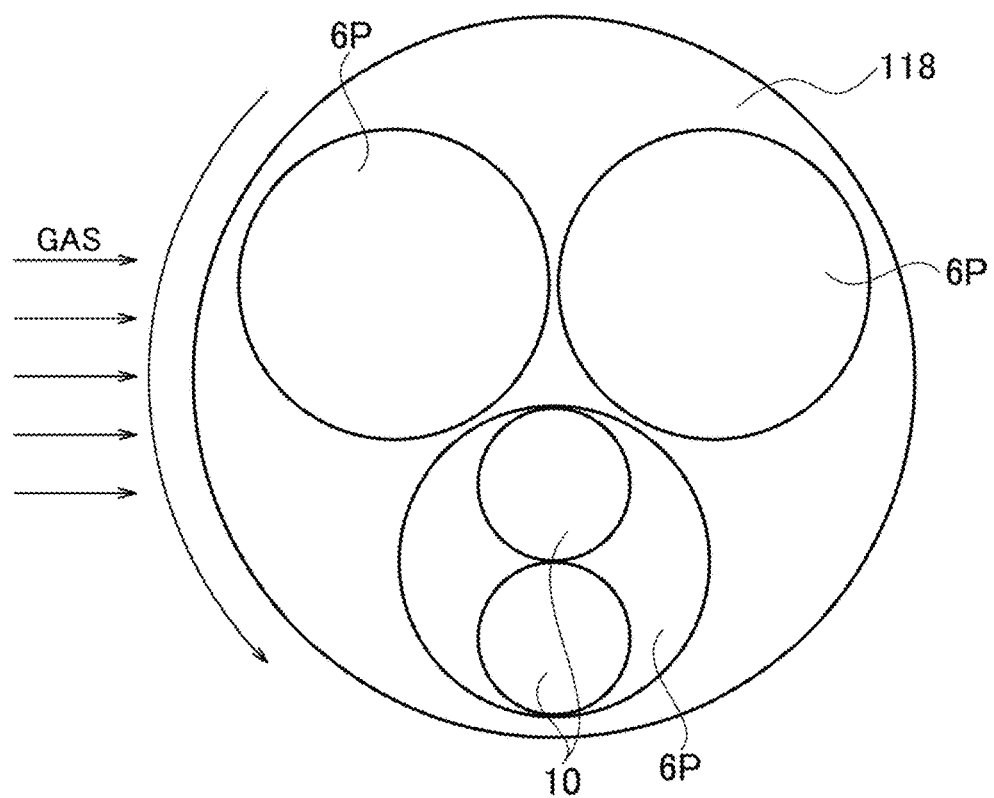
FIG. 10 is a schematic plain diagram showing a configuration of arranging two 3-inch wafers in parallel in a 6-inch wafer pocket on a holder plate at the time of epitaxial growth, in the epitaxial growth apparatus applied when forming the SiC epitaxial growth layer on the SiC substrate having the off angle of 2 degrees according to the embodiments.

FIG. 10 shows a schematic plane configuration of arranging two 3-inch wafers in parallel in a 6-inch wafer pocket 6P on the holder plate 118 at the time of the epitaxial growth, in the epitaxial growth apparatus 200 according to the embodiments. In the epitaxial growth apparatus used for the experiment, as shown in FIG. 10, two 3-inch wafers are arranged in parallel in the 6-inch wafer pocket 6P.

An apparatus configuration, operating conditions, a gas system, a reaction system, etc., of the epitaxial growth applied to the experiment are as follows.

The epitaxial growth apparatus which is used therefor is an induction heating type horizontal hot wall CVD apparatus (Probus-SiC (R) made by Tokyo Electron Limited).

The gas used therefor includes $SiH_4$ (monosilane) used as Si material, $C_3H_8$ (propane) used as C material, $N_2$ (nitrogen) used as an n type dopant, and $H_2$ (hydrogen) used as carrier gas.

As fundamental growth conditions, a growth temperature $T_g$ is within a range of 1620° C. to 1725° C., a growth pressure P is within a range of 2 kPa to 11 kPa, a flow rate of $H_2$ carrier gas is within a range of 100 slm to 150 slm. As typical values for the growth conditions, the growth temperature $T_g$ is 1680° C., the growth pressure P is 10.3 kPa, and the flow rate of $H_2$ carrier gas is 120 slm.

The growth temperature $T_g$ is changed within a range of 1620° C. to 1725° C., the C/Si ratio of the material gas is changed within a range of 0.7 to 1.0, and the growth pressure P and the flow rate of $H_2$ carrier gas are applied as the growth parameter.

Surface morphology including the defect density is observed through a confocal differential interference microscope.

The film thickness uniformity of the epitaxial growth layer is measured using a Fourier transform infrared spectrometer (FT-IR).

Moreover, the doping uniformity of the epitaxial growth layer is measured using a mercury probe C-V system.
(Surface Morphology Limit of Relationship Between Growth Temperature and C/Si Ratio)

Figure 11:
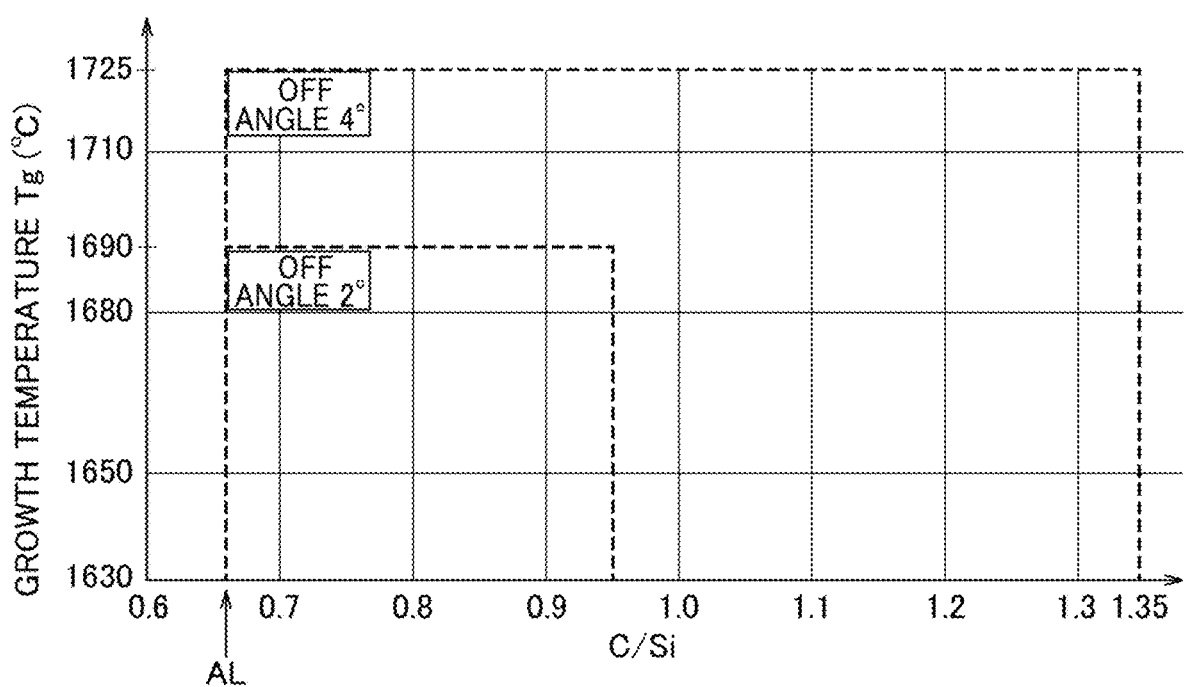
FIG. 11 is a diagram of comparing a surface morphology limit between the off angle of 4 degrees and the off angle of 2 degrees, in a relationship between a growth temperature $T_g$ and a C/Si ratio of material gas showing satisfactory surface flatness when forming the SiC epitaxial growth layer on the SiC substrate.

FIG. 11 shows a diagram of comparing a surface morphology limit between the off angle of 4 degrees and the off angle of 2 degrees, in a relationship between a growth temperature and a C/Si ratio of material gas showing satisfactory surface flatness when forming the SiC epitaxial growth layer on the SiC substrate.

In order to form the SiC epitaxial growth layer on the SiC substrate having the off angle of 2 degrees, a lower temperature and a lower C/Si ratio are required compared with a case where a SiC epitaxial growth layer is formed on the SiC substrate having an off angle of 4 degrees.

The substrate having the off angle of 4 degrees can be applied if the growth temperature is within a range of approximately 1630° C. to approximately 1725° C. and the C/Si ratio is within a range of approximately 0.7 to approximately 1.35.

On the other hand, the substrate having the off angle of 2 degrees can be applied if the growth temperature is within a range of approximately 1630° C. to approximately 1690° C.

and the C/Si ratio is within a range of approximately 0.7 to approximately 0.95. In FIG. 11, the dashed line AL shows a lower limit of the C/Si ratio of the material gas on the apparatus structure.

(Surface Morphology)

Figure 12A:
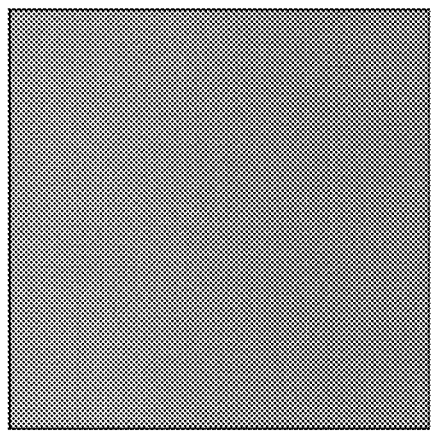
FIG. 12A shows an image of confocal differential interference microscope (field of view: 750×750 μm$^2$) of the SiC epitaxial growth layer formed on the SiC substrate having the off angle of 2 degrees shown in FIG. 11, in a case where the growth temperature $T_g$ is 1680° C., the C/Si ratio is 0.8, and a HAZE value is 5.7.
Figure 12B:
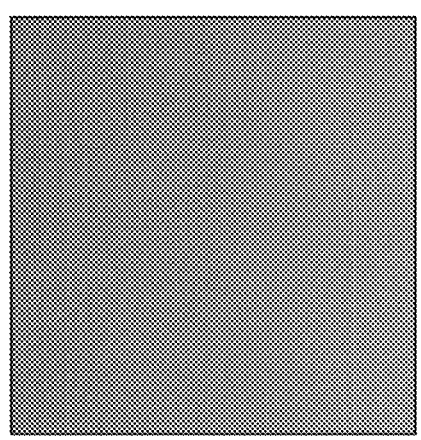
FIG. 12B shows an image of confocal differential interference microscope (field of view: 750×750 μm$^2$) of the SiC epitaxial growth layer formed on the SiC substrate having the off angle of 2 degrees shown in FIG. 11, in a case where the growth temperature $T_g$ is 1680° C., the C/Si ratio is 0.9, and a HAZE value is 5.9.
Figure 12C:
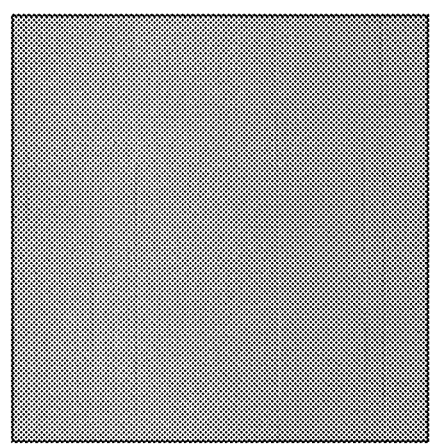
FIG. 12C shows an image of confocal differential interference microscope (field of view: 750×750 μm$^2$) of the SiC epitaxial growth layer formed on the SiC substrate having the off angle of 2 degrees shown in FIG. 11, in a case where the growth temperature $T_g$ is 1650° C., the C/Si ratio is 0.7, and a HAZE value is 5.5.
Figure 12D:
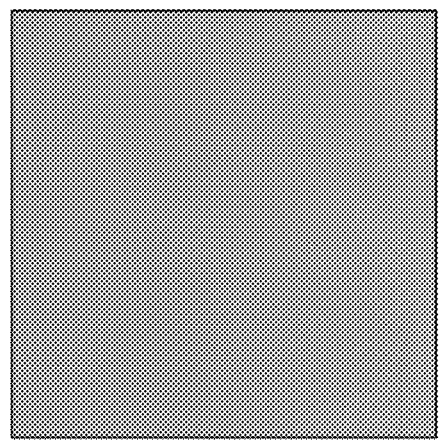
FIG. 12D shows an image of confocal differential interference microscope (field of view: 750×750 μm$^2$) of the SiC epitaxial growth layer formed on the SiC substrate having the off angle of 2 degrees shown in FIG. 11, in a case where the growth temperature $T_g$ is 1650° C., the C/Si ratio is 0.8, and a HAZE value is 5.5.
Figure 12E:
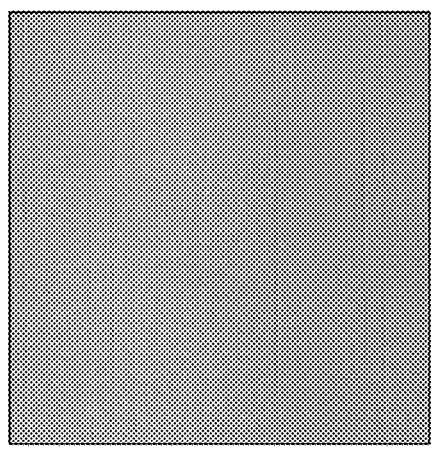
FIG. 12E shows an image of confocal differential interference microscope (field of view: 750×750 μm$^2$) of the SiC epitaxial growth layer formed on the SiC substrate having the off angle of 2 degrees shown in FIG. 11, in a case where the growth temperature $T_g$ is 1650° C., the C/Si ratio is 0.9, and a HAZE value is 5.7.

In images of confocal differential interference microscope of the SiC epitaxial growth layer formed on the SiC substrate having the off angle of 2 degrees shown in FIG. 11: FIG. 12A shows surface morphology in a case where the growth temperature $T_g$ is 1680° C., the C/Si ratio is 0.8, and a HAZE value is 5.7; FIG. 12B shows surface morphology in a case where the growth temperature $T_g$ is 1680° C., the C/Si ratio is 0.9, and a HAZE value is 5.9; FIG. 12C shows surface morphology in a case where the growth temperature $T_g$ is 1650° C., the C/Si ratio is 0.7, and a HAZE value is 5.5; FIG. 12D shows surface morphology in a case where the growth temperature $T_g$ is 1650° C., the C/Si ratio is 0.8, and a HAZE value is 5.5; and FIG. 12E shows surface morphology in a case where the growth temperature $T_g$ is 1650° C., the C/Si ratio is 0.9, and a HAZE value is 5.7. The results of FIGS. 12A to 12E are results of each forming approximately 5-μm SiC epitaxial growth layer without a buffer layer on the SiC substrate having the off angle of 2 degrees. The HAZE value is a surface roughness index by a surface inspection apparatus SICA6X. A photographic field is 750×750 μm² in each case.

Figure 13A:
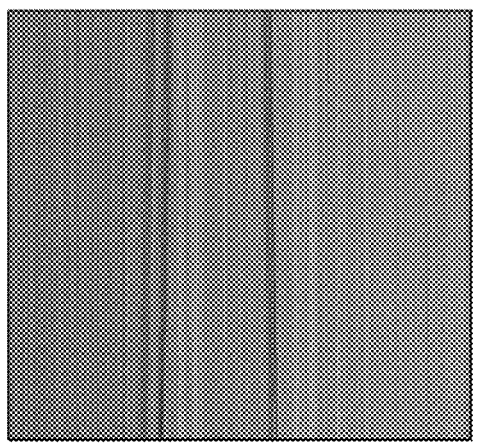
FIG. 13A shows an image of confocal differential interference microscope (field of view: 750×750 μm$^2$) of the SiC epitaxial growth layer formed on the SiC substrate having the off angle of 2 degrees shown in FIG. 11, in a case where the growth temperature $T_g$ is 1710° C., the C/Si ratio is 0.8, and a HAZE value is 19.7.
Figure 13B:
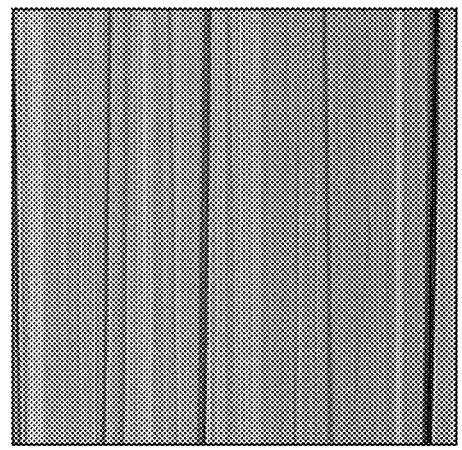
FIG. 13B shows an image of confocal differential interference microscope (field of view: 750×750 μm$^2$) of the SiC epitaxial growth layer formed on the SiC substrate having the off angle of 2 degrees shown in FIG. 11, in a case where the growth temperature $T_g$ is 1710° C., the C/Si ratio is 1.0, and a HAZE value is 27.7.
Figure 13C:
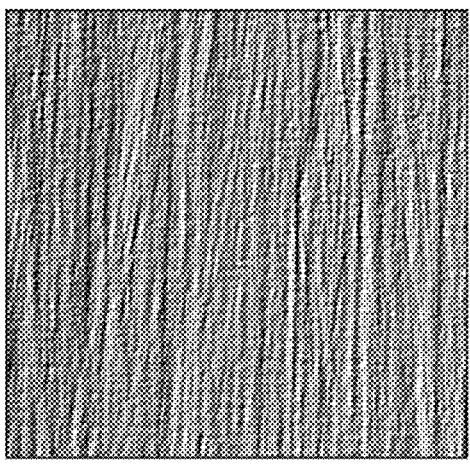
FIG. 13C shows an image of confocal differential interference microscope (field of view: 750×750 μm$^2$) of the SiC epitaxial growth layer formed on the SiC substrate having the off angle of 2 degrees shown in FIG. 11, in a case where the growth temperature $T_g$ is 1680° C., the C/Si ratio is 1.0, and a HAZE value is. 14.1.
Figure 13D:
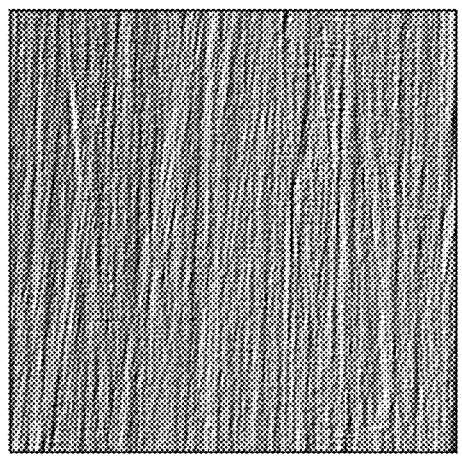
FIG. 13D shows an image of confocal differential interference microscope (field of view: 750×750 μm$^2$) of the SiC epitaxial growth layer formed on the SiC substrate having the off angle of 2 degrees shown in FIG. 11, in a case where the growth temperature $T_g$ is 1650° C., the C/Si ratio is 1.0, and a HAZE value is 15.1.

Similarly, in images of confocal differential interference microscope of the SiC epitaxial growth layer formed on the SiC substrate having the off angle of 4 degrees shown in FIG. 11: FIG. 13A shows surface morphology in a case where the growth temperature $T_g$ is 1710° C., the C/Si ratio is 0.8, and a HAZE value is 19.7; FIG. 13B shows surface morphology in a case where the growth temperature $T_g$ is 1710° C., the C/Si ratio is 1.0, and a HAZE value is 27.7; FIG. 13C shows surface morphology in a case where the growth temperature $T_g$ is 1680° C., the C/Si ratio is 1.0, and a HAZE value is 14.1; and FIG. 13D shows surface morphology in a case where the growth temperature $T_g$ is 1650° C., the C/Si ratio is 1.0, and a HAZE value is 15.1. The results of FIGS. 13A to 13D are results of each forming approximately 5-μm SiC epitaxial growth layer without a buffer layer on the SiC substrate having the off angle of 4 degrees. A photographic field is 750×750 μm² in each case.

In the SiC epitaxial growth layer formed on the SiC substrate having an off angle of 4 degrees, as shown in FIG. 13, a relative large step bunching has occurred if the C/Si ratio is equal to or greater than 1.0 and the growth temperature $T_g$ is equal to or greater than 1710° C.

On the other hand, in the SiC epitaxial growth layer formed on the SiC substrate having the off angle of 2 degrees, as shown in FIG. 12, occurrence of a relative large step bunching can be suppressed. For example, occurrence of a relative large step bunching can be suppressed if the C/Si ratio is equal to or less than approximately 0.95 and the growth temperature $T_g$ is equal to or less than 1690° C., for example.

(Dependency of Growth Pressure)

Figure 14:
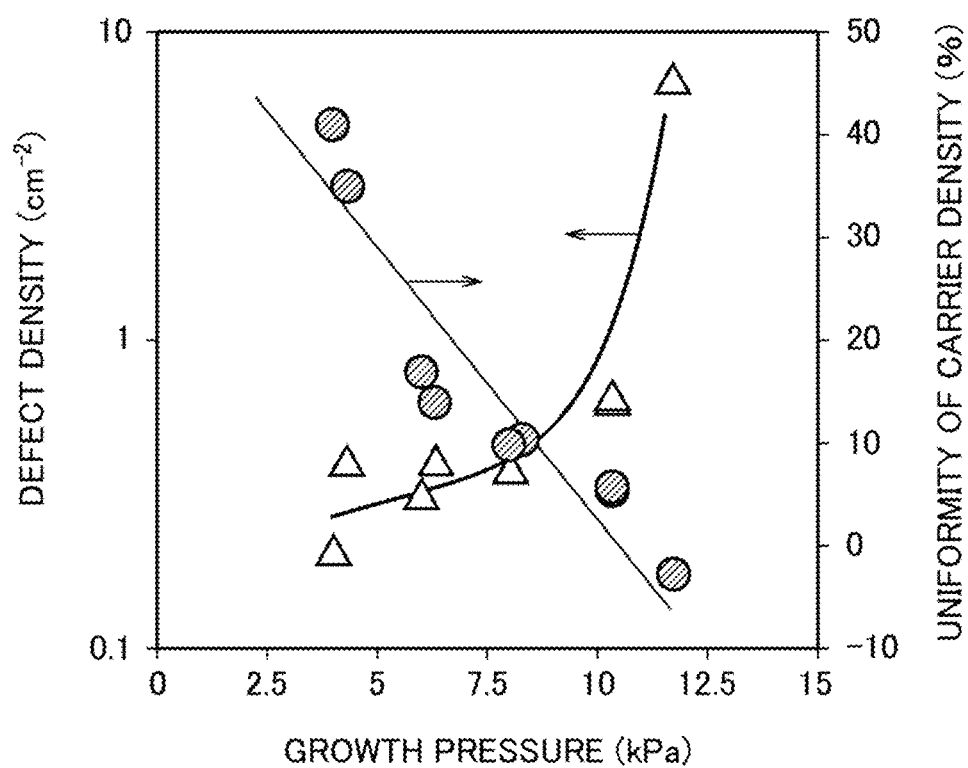
FIG. 14 shows dependency of growth pressure P (kPa) of the defect density (cm$^{-2}$) and uniformity (%) of carrier density ($N_D$-$N_A$) (the growth temperature $T_g$ is 1680° C., a flow rate of carrier gas is 120 slm-H$_2$, and a C/Si ratio is 0.9), in a result of forming the SiC epitaxial growth layer on the SiC substrate having the off angle of 2 degrees according to the embodiments.

FIG. 14 shows dependency of growth pressure P (kPa) of a triangular defect density (cm⁻²) and uniformity (a/mean) (%) of a carrier density ($N_D$-$N_A$) (120 slm-H₂, C/Si ratio=0.9), in a result of forming the SiC epitaxial growth layer on the SiC substrate having the off angle of 2 degrees according to the embodiments.

The triangular defect density (cm⁻²)<approximately 1 (cm⁻²) is satisfied if the growth pressure of the SiC epitaxial growth layer is within a range of 3 kPa to 11 kPa. Moreover, the carrier density ($N_D$-$N_A$) uniformity (σ/mean) of less than 10(%) is satisfied if the growth pressure is equal to or greater than approximately 7.5 kPa.

(Dependency of Flow Rate of Carrier Gas)

Figure 15:
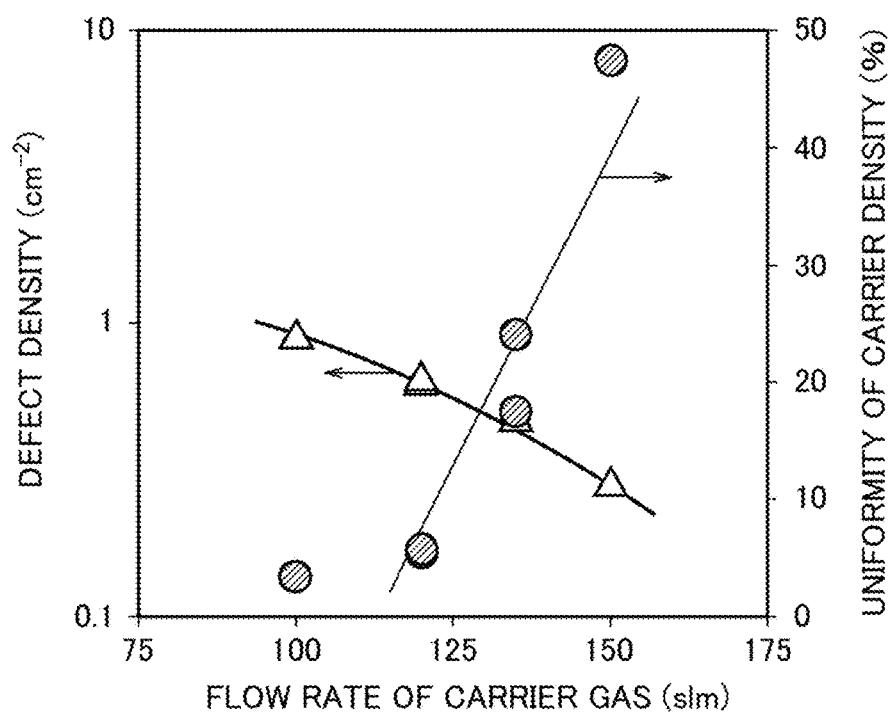
FIG. 15 shows dependency of flow rate of carrier gas (H$^2$ gas flow) (slm) of the defect density (cm$^{-2}$) and the uniformity (%) of carrier density ($N_D$-$N_A$) (the growth temperature $T_g$ is 1680° C. and the C/Si ratio is 0.9, and the growth pressure P is 10.3 (kPa)), in a result of forming the SiC epitaxial growth layer on the SiC substrate having the off angle of 2 degrees according to the embodiments.

FIG. 15 shows dependency of flow rate of carrier gas (H₂ gas flow) (slm) of a triangular defect density (cm⁻²) and uniformity (a/mean) (%) of a carrier density ($N_D$-$N_A$) (the C/Si ratio=0.9, the growth pressure P=10.3 kPa), in a result of forming the SiC epitaxial growth layer on the SiC substrate having the off angle of 2 degrees according to the embodiments.

The triangular defect density (cm⁻²)<approximately 1 (cm⁻²) is satisfied if the flow rate of the carrier gas at the time of forming the SiC epitaxial growth layer is within a range of 100 slm to 150 slm. Moreover, the carrier density ($N_D$-$N_A$) uniformity (c/mean) of less than 10(%) is satisfied if the flow rate of the carrier gas is within a range of 100 slm to 120 slm.

In the SiC epitaxial growth layer formed on the SiC substrate having the off angle of 2 degrees according to the embodiments, an effect of the growth parameter (the growth pressure P (kPa), the flow rate of carrier gas (H₂ gas flow) (slm)) to the triangular defect density (cm⁻²) and the carrier density ($N_D$-$N_A$) uniformity (σ/mean) (%) shows a tendency similar to that of the SiC epitaxial growth layer formed on the SiC substrate having an off angle of 4 degrees.

(Process Window)

An effect of the growth parameter to the surface morphology, the defect density, and the uniformity of in-epitaxial-plane carrier density (σ/mean) is carefully examined, and thereby a process window of the SiC epitaxial growth to the Si surface side of the SiC substrate having the off angle of 2 degrees is derived.

Figure 16:
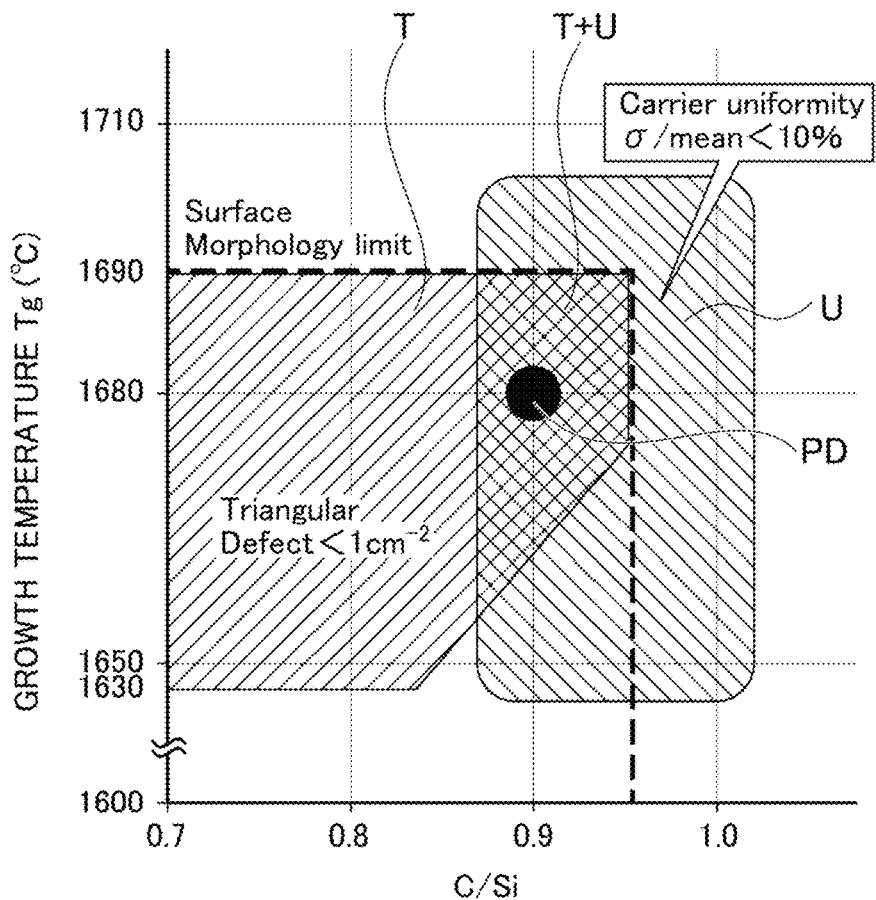
FIG. 16 is an explanatory diagram showing a process window in a relationship between the growth temperature $T_g$ (° C.) and the C/Si ratio under the growth pressure P=10.3 (kPa), in a result of forming the SiC epitaxial growth layer on the SiC substrate having the off angle of 2 degrees according to the embodiments.

FIG. 16 shows an explanation of the process window in a relationship between the growth temperature $T_g$ (° C.) and the C/Si ratio under the growth pressure P=10.3 (kPa), in a result of forming the SiC epitaxial growth layer on the SiC substrate having the off angle of 2 degrees according to the embodiments.

In FIG. 16, a surface morphology limit of the SiC substrate having the off angle of 2 degrees is within a range shown with the dashed line, i.e., the growth temperature $T_g$ (° C.) being within a range of approximately 1630° C. to approximately 1690° C., and the C/Si ratio being within a range of approximately 0.7 to approximately 0.95.

On the other hand, a range of satisfying the triangular defect density<1 count/cm² is within the range shown with the hatched region T in FIG. 16.

Moreover, a range of satisfying the carrier density ($N_D$-$N_A$) uniformity (σ/mean) (%)<10% is within the range shown with the hatched region U in FIG. 16.

Accordingly, a region of satisfying all of the surface morphology limit, the triangular defect density<1 count/cm², and the carrier density ($N_D$-$N_A$) uniformity (σ/mean) (%)<10% is the overlapped region (T+U) between the hatched region T and the hatched region U.

For example, the black circle plot ○ PD represented with the growth temperature $T_g$ (° C.)=1680° C. and the C/Si ratio=0.9 under the growth pressure P=10.3 (kPa) corresponds to an example of conditions of satisfying all of the surface morphology limit, the triangular defect density<1 count/cm², and the carrier density ($N_D$-$N_A$) uniformity (σ/mean) (%)<10%, as a result of forming the SiC epitaxial growth layer on the SiC substrate having the off angle of 2 degrees according to the embodiments.

In this context, the ($N_D$-$N_A$) in the carrier density ($N_D$-$N_A$) uniformity (σ/mean) (%) shows the carrier density (a difference between donor concentration and acceptor concentration) measured by a capacitance-voltage measurement (C-V measurement). The vertical axis in FIGS. 14, 15, and 17 indicates uniformity (σ/mean) of the value ($N_D$-$N_A$) obtained by performing the C-V measurement with respect to the entire wafer surface.

(Dependency of C/Si Ratio)

Figure 17:
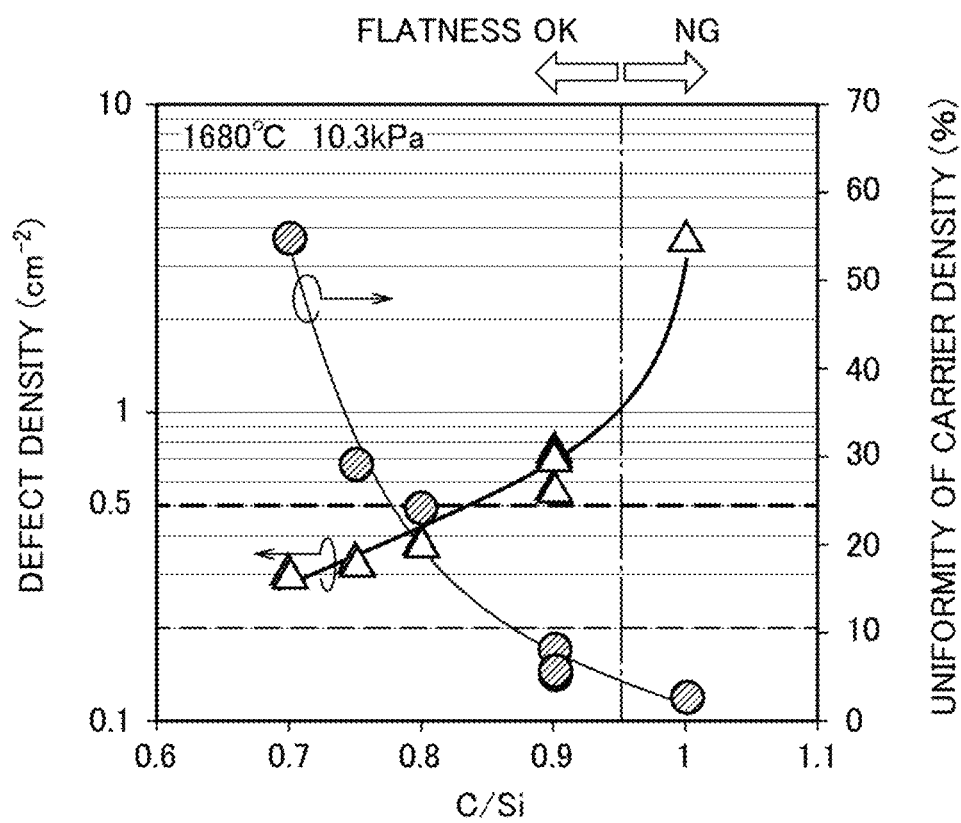
FIG. 17 shows dependency of C/Si ratio of the defect density (cm$^{-2}$) and the uniformity (%) of carrier density ($N_D$-$N_A$) (the growth temperature $T_g$ is 1680° C., the flow rate of carrier gas is 120 slm-H$_2$, and the growth pressure P is 10.3 (kPa)), in a result of forming the SiC epitaxial growth layer on the SiC substrate having the off angle of 2 degrees according to the embodiments.

FIG. 17 shows dependency of C/Si ratio of the defect density ($cm^{-2}$) and the uniformity (%) of carrier density ($N_D$-$N_A$) (the growth temperature $T_g$=1680° C., the flow rate of carrier gas 120 slm-$H_2$, the growth pressure P=10.3 (kPa)), in a result of forming the SiC epitaxial growth layer on the SiC substrate having the off angle of 2 degrees according to the embodiments.

As shown in FIG. 17, a morphology limit from which the surface flatness becomes satisfactory is a case where the value of the C/Si ratio is equal to or less than 0.95. On the other hand, if the value of the C/Si ratio is within a range of approximately 0.7 to approximately 0.95, the defect density becomes less than 1 ($cm^{-2}$). If the value of the C/Si ratio is within a range of approximately 0.7 to approximately 0.85, the defect density becomes less than 0.5 ($cm^{-2}$). Moreover, if the value of the C/Si ratio is within a range of approximately 0.85 to approximately 0.95, the carrier density ($N_D$-$N_A$) uniformity becomes less than 10(%).

In order to form the SiC epitaxial growth layer on the SiC substrate having the off angle of 2 degrees, a lower temperature and a lower C/Si ratio are required compared with a case where a SiC epitaxial growth layer is formed on the SiC substrate having an off angle of 4 degrees. On the other hand, it is known that occurrence of the triangular defect can be suppressed under a relative high growth temperature $T_g$. Accordingly, although there is a danger of increasing the probability of occurrence of the triangular defect if reducing the growth temperature, the triangular defect density can be reduced by setting a relatively low C/Si ratio under a relative high growth temperature $T_g$=1680° C. and relatively high growth pressure P=10.3 kPa, as shown in FIG. 17.

It is confirmed from an observation result of surface morphology that a surface flatness of the same degree as that of the substrate having an off angle of 4 degrees can be realized if the C/Si ratio is equal to or less than 0.9.

However, if the C/Si ratio becomes relative low, a tendency for the uniformity of carrier density (%) to deteriorate rapidly is observed, as shown in FIG. 17. The results show that the triangular defect density and the uniformity of carrier density (%) reflecting the surface morphology have a tradeoff relationship with respect to the growth parameter (the C/Si ratio, the growth pressure P, and the flow rate of carrier gas). By paying attention to a starting point of occurrence of the triangular defect, such a tradeoff relationship can be canceled.

The triangular defect is a generic name for defects having a triangular shape by wafer surface observation in defects to be extended to a down step direction in the SiC epitaxial growth layer.

The triangular defect corresponds to: 3C-inclusion to be extended as a starting point with particles on the wafer or downfall particles coming from a furnace wall of a CVD apparatus to be adhered thereto; and defects in which triangular-shaped surface morphology is observed in stacking faults on the basis of dislocation of the wafer.

—Downfall—

As defects which occurs when the SiC epitaxial growth layer is formed on the SiC substrate having the off angle of 2 degrees, an example of downfall is illustrated as shown in FIG. 18A, another example of the downfall is illustrated as shown in FIG. 18B, still another example of the downfall is illustrated as shown in FIG. 18C, yet another example of the downfall is illustrated as shown in FIG. 18D, further example of the downfall is illustrated as shown in FIG. 18E, and still further other example of the downfall is illustrated as shown in FIG. 18F.

The downfall formed as a starting point with particles on the SiC substrate having the off angle of 2 degrees or downfall particles coming from the furnace wall of the CVD apparatus to be adhered thereto has an approximate circle shape approximately measuring several μm to several tens of μm in diameter, as shown in FIGS. 18A to 18F.

—Carrot—

As defects which occurs when the SiC epitaxial growth layer is formed on the SiC substrate having the off angle of 2 degrees, an example of a carrot defect is illustrated as shown in FIG. 19A, another example of the carrot defect is shown as shown in FIG. 19B, still another example of the carrot defect is illustrated as shown in FIG. 19C, and yet another example of the carrot defect is illustrated as shown in FIG. 19D.

Although the length of the carrot defect is dependent on the layer thickness of the epitaxial growth layer, it is proved that the length thereof can be equal to or greater than approximately 100 μm, as shown in FIGS. 19A to 19D.

—Triangular Defect—

Figure 20A:
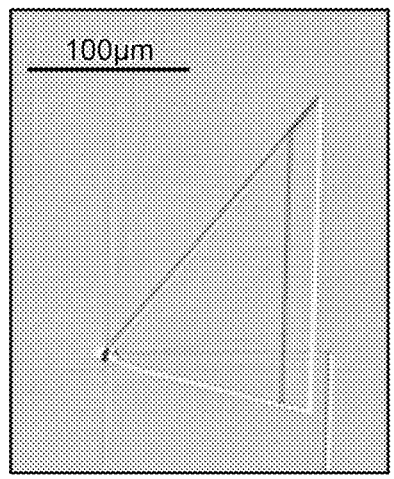
FIG. 20A shows a defect which occurs when the SiC epitaxial growth layer is formed on the SiC substrate having the off angle of 2 degrees, which is an example of a triangular defect.
Figure 20C:
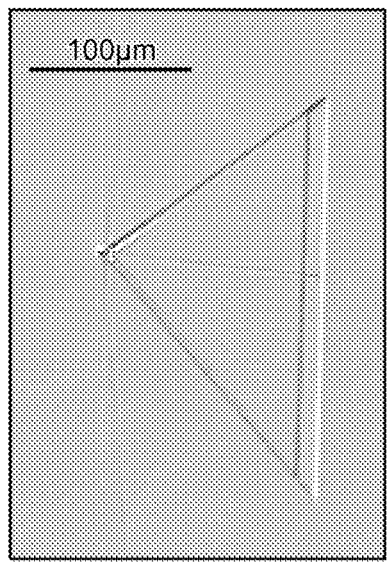
FIG. 20C shows a defect which occurs when the SiC epitaxial growth layer is formed on the SiC substrate having the off angle of 2 degrees, which is still another example of a triangular defect.
Figure 20B:
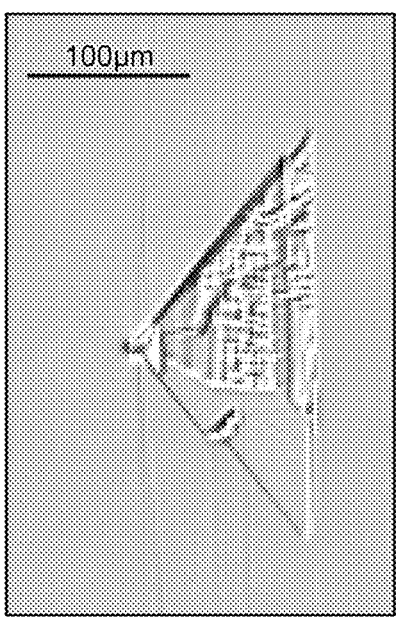
FIG. 20B shows a defect which occurs when the SiC epitaxial growth layer is formed on the SiC substrate having the off angle of 2 degrees, which is another example of a triangular defect.
Figure 20D:
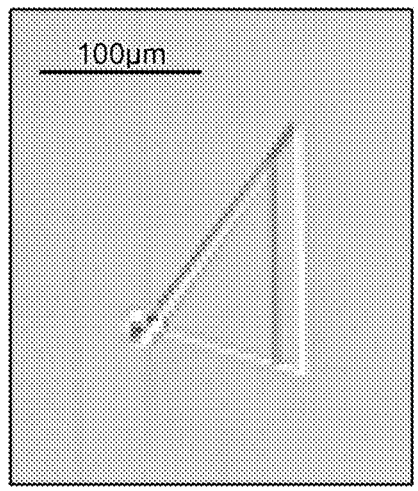
FIG. 20D shows a defect which occurs when the SiC epitaxial growth layer is formed on the SiC substrate having the off angle of 2 degrees, which is yet another example of a triangular defect.

As defects which occurs when the SiC epitaxial growth layer is formed on the SiC substrate having the off angle of 2 degrees, an example of a triangular defect is illustrated as shown in FIG. 20A, another example of the triangular defect is illustrated as shown in FIG. 20B, still another example of the triangular defect is illustrated as shown in FIG. 20C, and yet another example of the triangular defect is illustrated as shown in FIG. 20D.

Although the size of the triangular defect is determined in accordance with the layer thickness of the epitaxial growth layer grown-up after the occurrence of defect, it is proves that a length of one side of the triangular shape composing the triangular defect can be equal to or greater than approximately 100 μm, as shown in FIGS. 20A to 20D. In addition, a relationship between the size of the triangular defect and the layer thickness of the epitaxial growth layer is as explained in FIG. 22.

—Downfall and Triangular Defect—

As defects which occurs when the SiC epitaxial growth layer is formed on the SiC substrate having the off angle of 2 degrees, an example of downfall and triangular defect is illustrated as shown in FIG. 21A, and another example of the downfall and triangular defect is illustrated as shown in FIG. 21B.

As shown in FIGS. 21A and 21B, it is proved that the triangular defect can occur as a starting point with the downfall.

As a detail of the defects of the SiC epitaxial growth on the substrate having the off angle of 2 degrees, the triangular defect account for approximately 80%, the carrot defect account for approximately 10%, and the downfall defect account for approximately 10%. The aforementioned values are average values of five wafers obtained by SiC epitaxial growth on 3-inch p wafer of the substrate having the off angle of 2 degrees.

(Occurrence Mechanism of Triangular Defect)

Figure 22A:
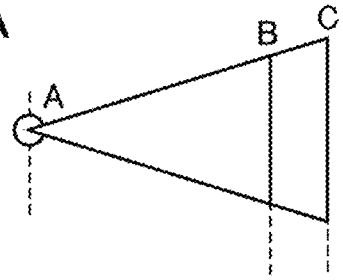
FIG. 22A is a schematic plain diagram showing a triangular defect example, in an explanatory diagram showing an occurrence mechanism of the triangular defect which occurs when the SiC epitaxial growth layer is formed on the SiC substrate having the off angle of 2 degrees.

FIG. 22A is a schematic plain diagram showing a triangular defect example, in an explanatory diagram showing an occurrence mechanism of the triangular defect which occurs when the SiC epitaxial growth layer is formed on the SiC substrate having the off angle θ. Moreover, FIG. 22B shows a schematic cross-sectional diagram of the triangular defect.

Figure 22B:
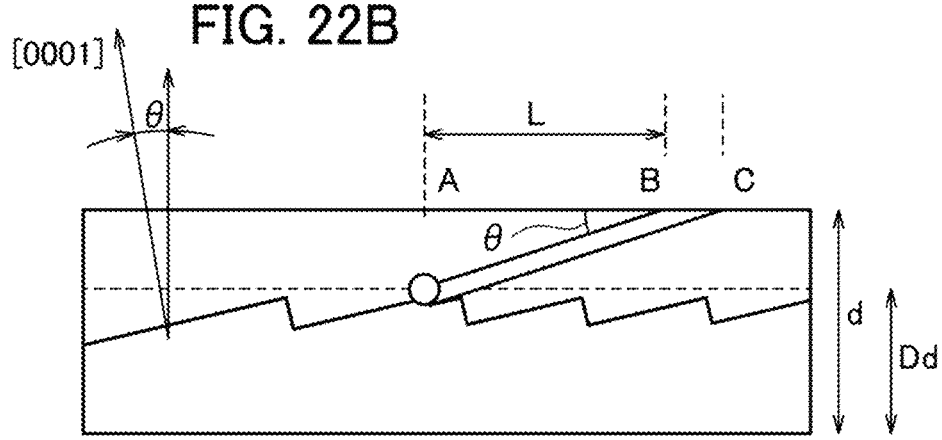
FIG. 22B is a schematic cross-sectional diagram showing the triangular defect example, in an explanatory diagram showing an occurrence mechanism of the triangular defect which occurs when the SiC epitaxial growth layer is formed on the SiC substrate having the off angle of 2 degrees.

As shown in FIGS. 22A and 22B, if there is a foreign substance which becomes inhibition of step flow growth at a starting point A, a crystal laminated structure which is different from the substrate is radially extended with step flow growth, as shown with the lines B and C.

A thickness of the epitaxial growth layer can be computed on the basis of the length of the triangular defect along in a direction of the step flow. More specifically, the layer thickness of the SiC epitaxial growth layer at the time of occurrence of defect can be estimated on the basis of an expansion width in the down step direction of the surface triangular defect.

On the basis of a relationship between the expansion width L and off angle θ in the down step direction, and the layer thickness d of the SiC epitaxial growth layer, the layer thickness $D_d$ of the SiC epitaxial growth layer at the time of the occurrence of defect is expressed by the following equation (1):

$$D_d = d - L \times \tan\theta \quad (1)$$

The expansion width L in the down step direction can be measured from a triangular defect image obtained by SICA, regular observation through optical microscope, etc. Accordingly, the layer thickness $D_d$ of the SiC epitaxial growth layer at the time of the occurrence of defect can be nondestructively estimated by measuring the expansion width L in the down step direction.

(Reduction Measures Against Triangular Defect)

Figure 23:
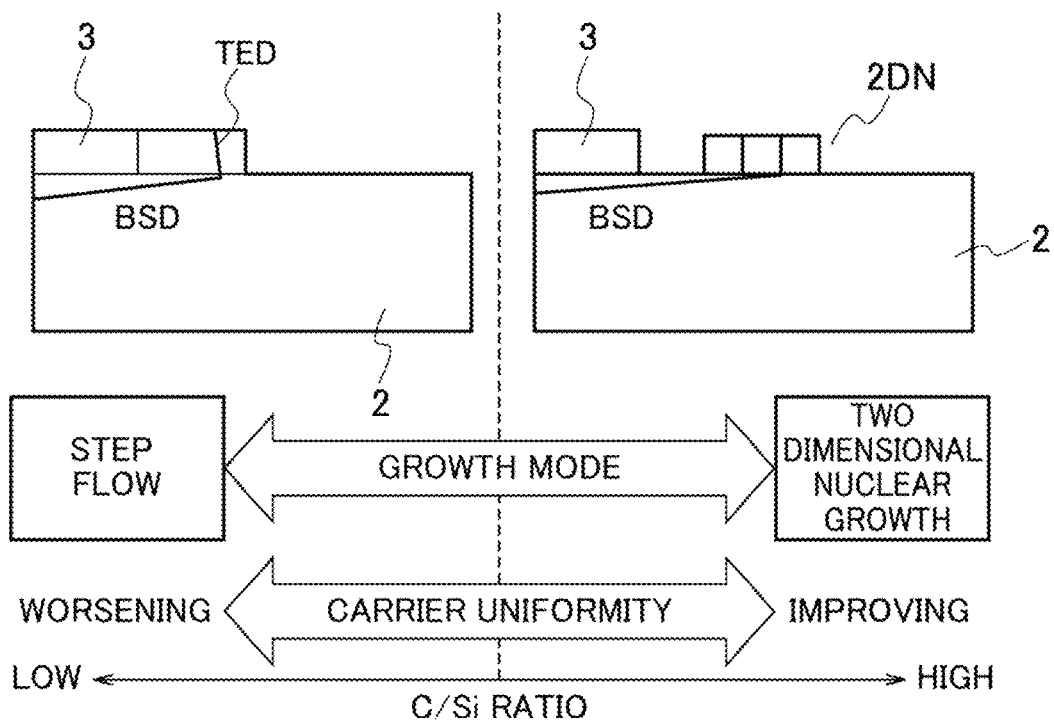
FIG. 23 is an explanatory diagram of reduction measures of a triangular defect occurring when the SiC epitaxial growth layer is formed on the off angle SiC substrate.

FIG. 23 shows an explanatory diagram of reduction measures of a triangular defect occurring when the SiC epitaxial growth layer 3 is formed on the low-off angle SiC substrate 2.

If the C/Si ratio is relative high, two Dimensional Nucleation (2DN) growing up becomes active in a growth mode, and uniformity of carrier density is also improved, as shown in FIG. 23. On the other hand, if the C/Si ratio is relative low, step flow growth becomes active in the growth mode, and the uniformity of carrier density also becomes a deteriorating tendency.

Approximately 80% or more of the defects in the triangular defect densities have occurred near an interface between the low-off angle SiC substrate (2) and the SiC epitaxial growth layer (3).

It is necessary to remove an inhibition factor of the step flow as reduction measures against the triangular defect. Countermeasure against the foreign substances as an inhibition factor of the step flow is to thoroughly perform wafer cleaning. Moreover, countermeasures against the dislocation are to optimize hydrogen etching conditions before the SiC epitaxial growth and to optimize wafer polishing conditions.

Furthermore, the C/Si ratio is set to be low and the buffer layer 3B in which the defect density is reduced is formed at an initial stage for forming the SiC epitaxial growth layer 3 on the low-off angle SiC substrate 2, and then, a drift layer 3D is formed on the buffer layer 3B under growth conditions of relative high C/Si ratio. Thereby, the SiC epitaxial wafer 1 having satisfactory uniformity of carrier density can be provided.

Figure 24:
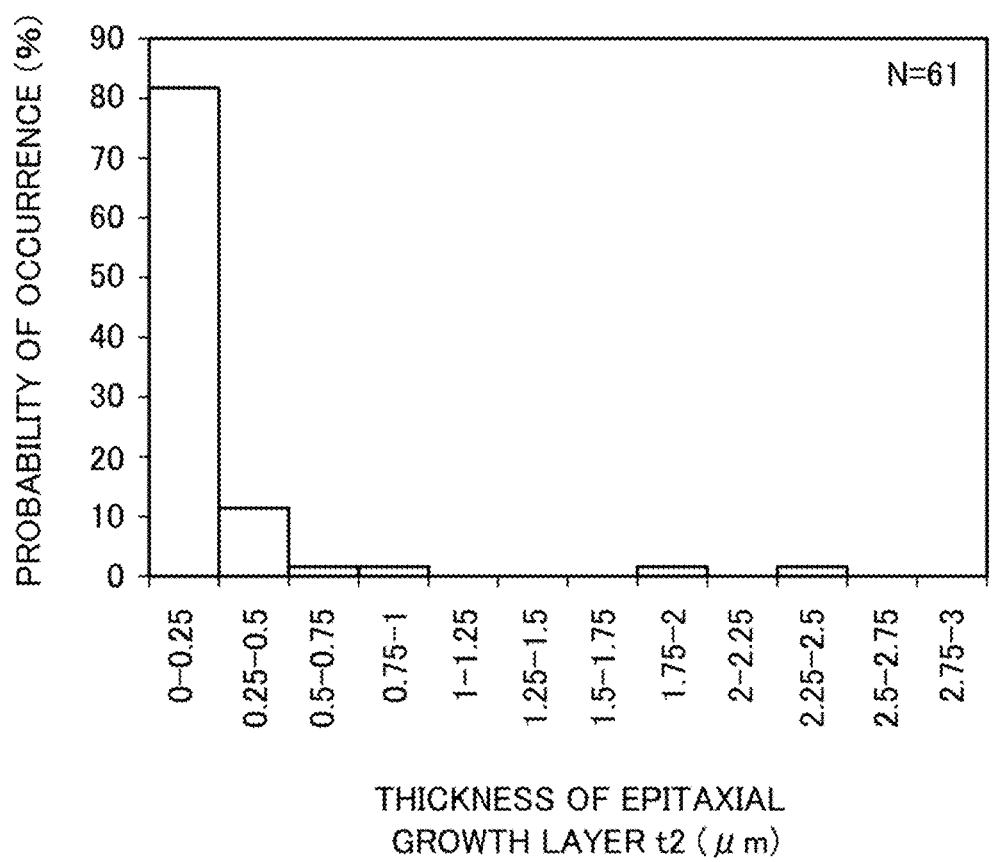
FIG. 24 is a diagram showing a relationship between a probability of occurrence (%) of a triangular defect and a thickness of the epitaxial growth layer, in a result of forming the SiC epitaxial growth layer on the SiC substrate having the off angle of 2 degrees according to the embodiments (the number N of triangular defects=61).

FIG. 24 shows a diagram of a relationship between a probability of occurrence (%) of a triangular defect and a thickness of the epitaxial growth layer 3, in a result of forming the SiC epitaxial growth layer 3 on the SiC substrate 3 having the off angle of 2 degrees according to the embodiments. The number N of the triangular defects counted in this case is 61.

As a probability of occurrence (%) of the triangular defects, 80% or more of the triangular defects has occurred near the interface between the SiC substrate and the SiC epitaxial growth layer, as shown in FIG. 24. More specifically, before the thickness of the SiC epitaxial growth layer is reached at approximately 0.25 μm, 80% or more of the triangular defects have occurred. This is based on a result of measuring three 3-inch φ wafers.

On the basis of the above-mentioned result, in order to suppress the occurrence of the triangular defect, the buffer layer 3B is formed on the SiC substrate having the off angle of 2 degrees 2, under growth conditions of the relative low C/Si ratio, as shown in FIG. 17, and then, a drift layer 3D is formed on the buffer layer 3B under growth conditions of relative high C/Si ratio. Thereby, the SiC epitaxial wafer 1 having satisfactory uniformity of carrier density can be provided. There can be provided the SiC epitaxial wafer 1: capable of reducing occurrence of such step bunching or a triangular defect density; excellent in film thickness uniformity and uniformity of carrier density in a tradeoff relationship with the reduction of the defect density; and capable of reducing the costs by the SiC substrate having the off angle of 2 degrees 2.

Figure 25A:
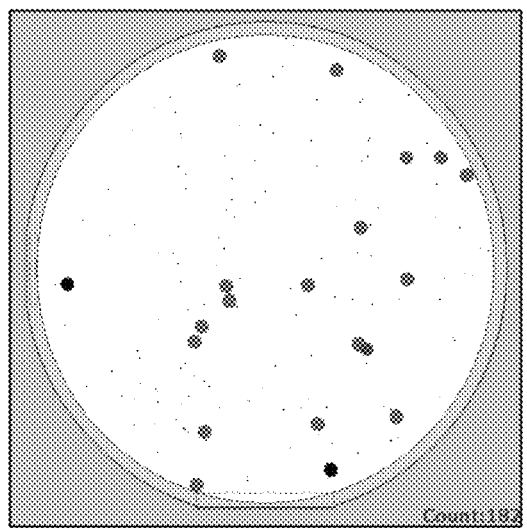
FIG. 25A shows a defect density map on a 3-inch wafer (inside) arranged side by side in a 6-inch wafer pocket, in a result of forming the SiC epitaxial growth layer on the SiC substrate having the off angle of 2 degrees according to the embodiments.
Figure 25C:
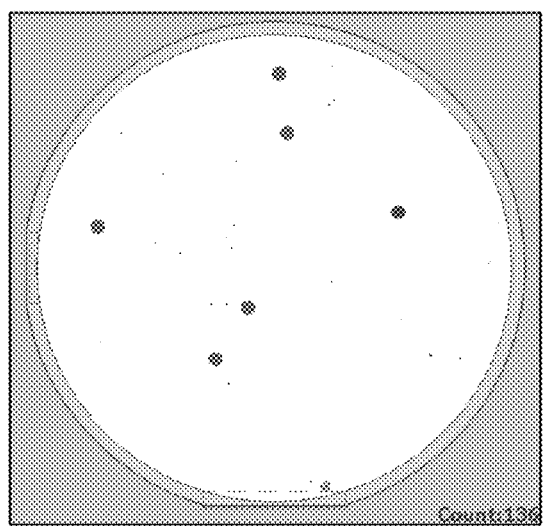
FIG. 25C shows a defect density map on the 3-inch wafer (inside) arranged side by side in the 6-inch wafer pocket, in a result of forming the SiC epitaxial growth layer (drift layer) via a buffer layer on the SiC substrate having the off angle of 2 degrees according to the embodiments.
Figure 25B:
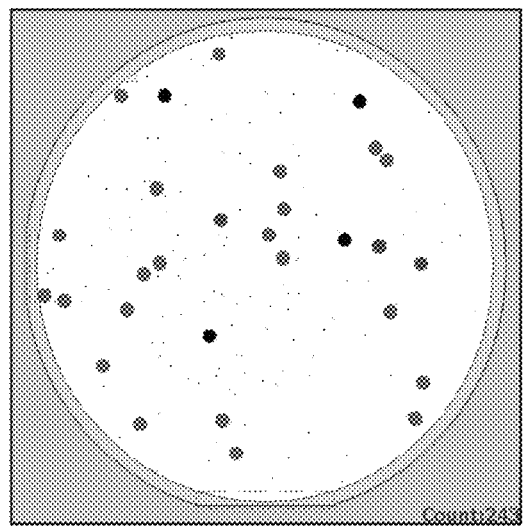
FIG. 25B shows a defect density map on a 3-inch wafer (outside) arranged side by side in a 6-inch wafer pocket, in a result of forming the SiC epitaxial growth layer on the SiC substrate having the off angle of 2 degrees according to the embodiments.
Figure 26:
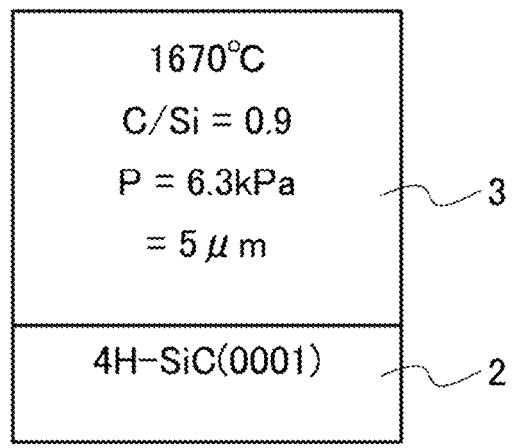
FIG. 26 shows a schematic structure example in which a SiC epitaxial growth layer is formed on the SiC substrate having the off angle of 2 degrees according to the embodiments (the growth temperature $T_g$ is 1670° C., the C/Si ratio is 0.9, the growth pressure P is 6.3 (kPa), and the thickness of the SiC epitaxial growth layer is 5 μm).

In results of forming the SiC epitaxial growth layer 3 on the SiC substrate having the off angle of 2 degrees 2 according to the embodiments, a defect density map on a 3-inch φ wafer (inside) arranged side by side in a 6 inch c wafer pocket is illustrated as shown in FIG. 25A, and a defect density map on the 3 inch φ wafer (outside) arranged side by side in the 6 inch φ wafer pocket is illustrated as shown in FIG. 25B. The results shown in FIGS. 25A and 25B correspond to a structure in which the buffer layer is not applied, as shown in FIG. 26. In this context, the C/Si ratio in the SiC epitaxial growth is 0.9. Each thickness of the SiC epitaxial growth layers 3 is approximately 10 μm. The points (black circle plots ●) in FIGS. 25A and 25B respectively indicate positions of the detected defects (triangular defects, carrot defects, and downfall).

Figure 25D:
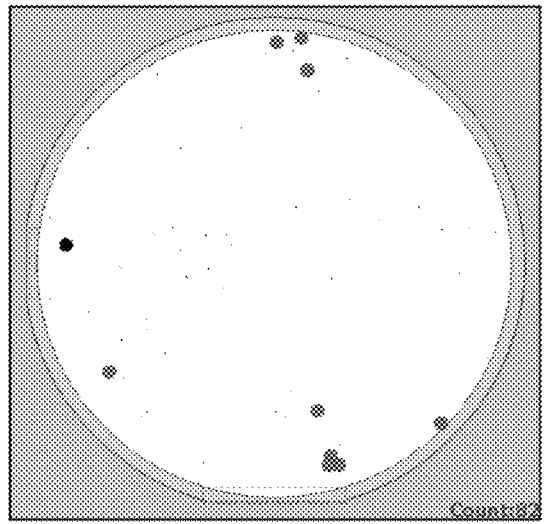
FIG. 25D shows a defect density map on the 3-inch wafer (outside) arranged side by side in the 6-inch wafer pocket, in a result of forming the SiC epitaxial growth layer (drift layer) via a buffer layer on the SiC substrate having the off angle of 2 degrees according to the embodiments.
Figure 28A:
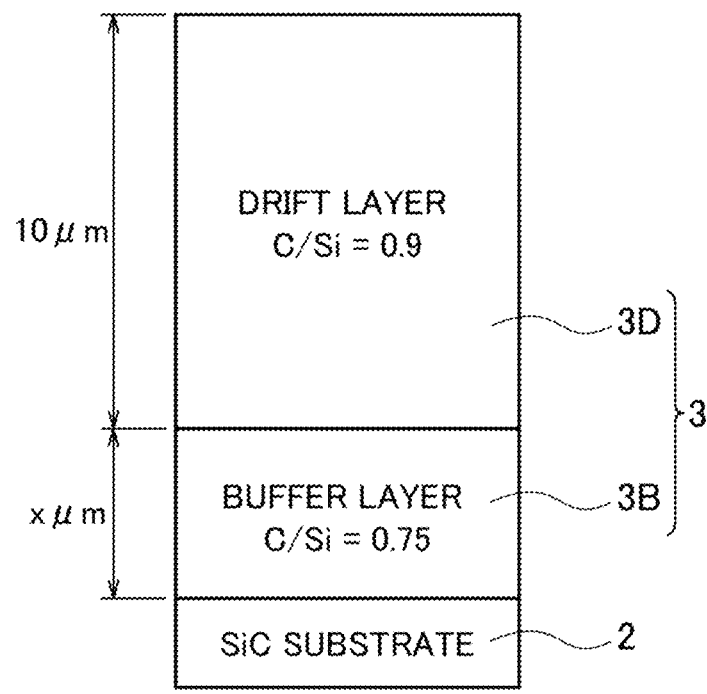
FIG. 28A is a schematic structure example in a result of forming a SiC epitaxial growth layer (drift layer) via a buffer layer on the SiC substrate having the off angle of 2 degrees according to the embodiments (the growth temperature $T_g$ is 1680° C., the growth pressure P is 10.3 (kPa), and the C/Si ratio of the buffer layer is 0.75, the thickness of the buffer layer is X μm, the C/Si ratio of the epitaxial growth layer is 0.9, and the thickness of the epitaxial growth layer is 10 μm).

On the other hand, in results of forming the drift layer 3D via the buffer layer 3B on the SiC substrate having the off angle of 2 degrees 2 according to the embodiments, a defect density map on the 3 inch φ wafer (inside) arranged side by side in the 6 inch φ wafer pocket is illustrated as shown in FIG. 25C, and a defect density map on the 3 inch φ wafer (outside) arranged side by side in the 6 inch φ wafer pocket is illustrated as shown in FIG. 25D. The results shown in FIGS. 25A and 25B correspond to a structure in which the buffer layer 3B is applied, as shown in FIG. 28A. In this case, the C/Si ratio in the SiC epitaxial growth of the buffer layer 3B is 0.75, and the C/Si ratio in the SiC epitaxial growth of the drift layer 3D is 0.9. Each thickness of the buffer layer 3B and the drift layer 3D in the SiC epitaxial growth layer 3 is approximately 10 μm. The points (black circle plots ●) in FIGS. 25C and 25D respectively indicate positions of the detected defects (triangular defects, carrot defects, and downfall).

As proved from the above-mentioned results, the defect density is approximately 0.60 count/cm² to the structure in which the buffer layer 3B is not applied, but the defect density is approximately 0.21 count/cm² in the structure to which the buffer layer 3B is applied. The occurrence of the defects can be suppressed by forming the buffer layer 3B having the low C/Si ratio at the initial stage when the SiC epitaxial growth layer 3 is formed on the SiC substrate having the off angle of 2 degrees 2.

Moreover, the film thickness uniformity of 1.2% and the uniformity of the carrier density (σ/mean) of 7% can be obtained at a growth rate of approximately 10 μm/h, in the SiC epitaxial growth on the SiC substrate having the off angle of 2 degrees, in the structure to which the buffer layer is applied.

Moreover, a defect-free chip yield of the SiC epitaxial growth layer 3 is approximately 86% in 5 mm square, and is approximately 55% in 10 mm square, before applying the reduction measures of defects (FIGS. 25A and 25B). On the other hand, the yield is improved to approximately 95% at 5 mm square and is improved to approximately 81% in 10 mm square, after applying the reduction measures of defects (FIGS. 25C and 25D).

FIG. 26 shows a schematic structure example of not including the buffer layer 3B in the SiC epitaxial growth layer 3 formed on the SiC substrate 2 having the off angle of 2 degrees according to the embodiments. In this case, the SiC substrate 2 is a 4H—SiC substrate, and the epitaxial growth is already applied on the (0001) surface thereof. Moreover, the growth temperature $T_g$ is 1670° C., the C/Si ratio is 0.9, the growth pressure P is 6.3 (kPa), and the thickness of the SiC epitaxial growth layer is 5 μm.

In addition, a holding time is changed in a water vapor atmosphere (10.6 kPa, 1655° C.) before the SiC epitaxial growth is started. If the SiC substrate 2 is held in a low pressure atmosphere including hydrogen, the SiC substrate 2 is etched. The aforementioned step is performed in order to remove adhered particles removing of the wafer surface or to remove a residual damaged layer (high-density dislocation loop) after wafer surface polishing by etching.

Figure 27:
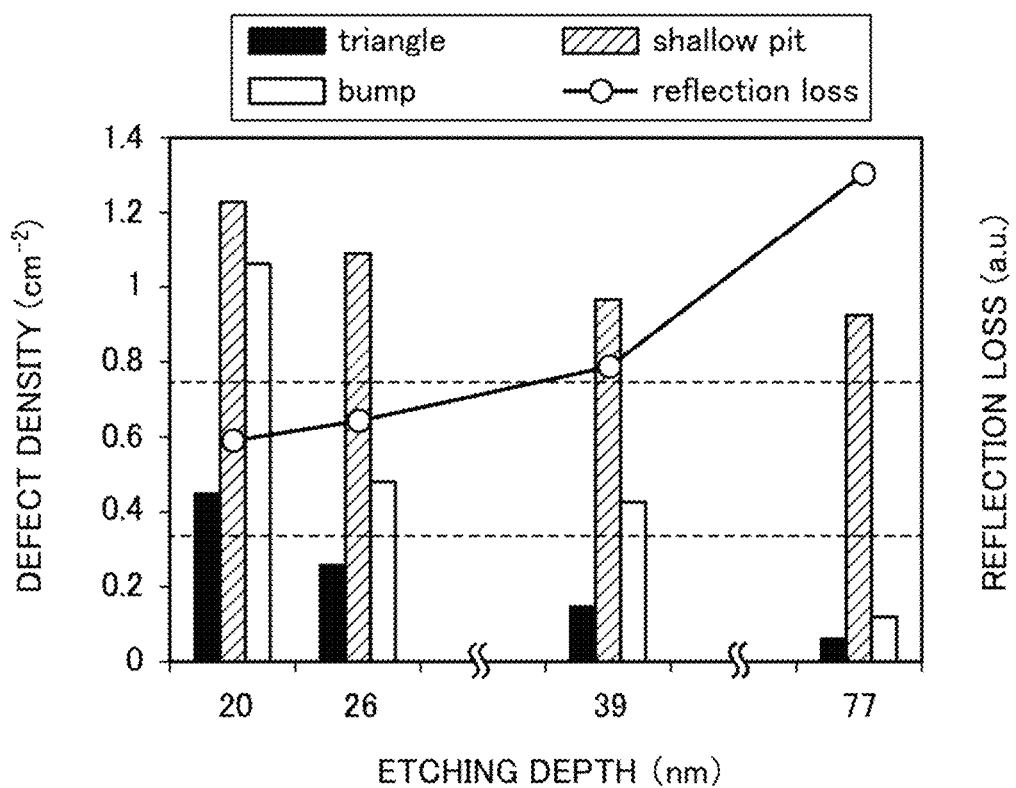
FIG. 27 shows dependency of etching depth of a defect density ($cm^{-2}$) and a reflection loss (a. u.), in a result of forming the SiC epitaxial growth layer on the SiC substrate having the off angle of 2 degrees according to the embodiments.

FIG. 27 shows dependency of etching depth of a defect density ($cm^{-2}$) and a reflection loss (a. u.), in a result of forming the SiC epitaxial growth layer 3 on the SiC substrate 2 having the off angle of 2 degrees according to the embodiments. As the defect density ($cm^{-2}$), a triangular defect density, a shallow pit density, and a bump density are measured. Moreover, the white circle plots ○ indicate reflection loss.

A reason that the reflection loss is increased as the etching depth is increased is as follows.

In the etching of SiC in the hydrogen atmosphere, the step of the wafer surface progresses so as to retreat, contrary to the step flow growth at the time of the SiC epitaxial growth.

If uniform etching is inhibited due to particles of the wafer surface or dislocation of the wafer (including derivation from processed damage) in that time, short step bunching occurs on a perimeter thereof.

The step bunching which occurs at the time of the etching is not disappeared in the subsequent epitaxial growth, but is extended in a vertical direction of the down step on the contrary.

If such a step bunching occurs with high density, the step bunching is overlapping and thereby being observed as "surface roughness."

If the etching depth is increased, a length of the short step bunching which occurs due to nonuniformity of etching becomes long. This point can be explained similarly to the relationship between the occurrence depth of the triangular defect and the thickness and off angle of the epitaxial growth layer.

The length of the step bunching of the substrate having a small off angle becomes longer also with the same etching depth.

The reflection loss in the SICA is an index indicating a degree of scattering and reduction due to the surface roughness of a reflected light from the wafer surface at the time of observation through a confocal differential interference microscope, etc. In SICA, a degree of the surface roughness derived from the step bunching can be detected, and is used as the index.

The surface roughness index HAZE obtained by the SICA is a name of the reflection loss in the inspection apparatus SICA.

(Need for Buffer Layer)

The buffer layer 3B is not necessary component, but the need therefor is determined on the basis of values of the morphology limit, the uniformity of carrier density, and the epitaxial defect density, required for the SiC epitaxial wafer 1.

In order to reduce the defect density, a low C/Si ratio of material gas (or low growth pressure P, a high flow rate of carrier gas (i.e., conditions of reducing a practical C/Si ratio on the wafer surface)) is suitable. However, such growth conditions are used, in-plane uniformity of the carrier density is reduced as a trade-off.

In the case of the 2-degree off angle epitaxial growth, and using the conditions of in-plane uniformity of carrier density σ/mean<10%, if an acceptable value of the defect density is less than 1 count/$cm^2$, the buffer layer 3B with the low C/Si ratio is needless. On the other hand, if the acceptable value of the defect density is less than 0.5 count/$cm^2$, the buffer layer 3B with the low C/Si ratio is needed.

—Conditions of Buffer Layer—

Fundamental Requirements:

The buffer layer grows up under growth conditions where the layer thickness is equal to or greater than 0.5 μm and the practical C/Si ratio is lower than that of the drift layer 3D (i.e., SiC epitaxial growth layer above the buffer layer 3B). In order to obtain a similar result, the C/Si ratio of material gas may be reduced, the growth pressure P may be reduced, and the flow rate of carrier gas may be increased.

—Other Requirements—

When the C/Si ratio at the time of the drift layer growth is 0.9, it is preferable that the C/Si ratio of material gas at the time of forming the buffer layer 3B is within a range of 0.6 to 0.9. It is more preferable that the C/Si ratio of material gas at the time of forming the buffer layer 3B is approximately 0.75. If the C/Si ratio of material gas is equal to or less than 0.6, since the Si composition of an adhered film to the furnace wall of the CVD apparatus becomes high, a film stress becomes large and thereby a furnace material is easily cracked.

—Layer Thickness of Buffer Layer—

If the layer thickness of the buffer layer 3B is formed thickly, the reduction effect of the defect density can be certainly obtained. On the other hand, since the thickness of drift layer 3D is determined in accordance with a device breakdown voltage required, the total layer thickness of the epitaxial growth layer 3 becomes thick for the amount of the thickness of the buffer layer 3B.

From a balance between a process time duration of epitaxial growth and an increment of channel resistance at the time of the device fabrication, and from a viewpoint of reproducibility of the reduction effect of defects, a lower limit of the layer thickness of the buffer layer 3B is approximately 0.5 μm.

—Doping to Buffer Layer—

A nitrogen (N) doping concentration to the buffer layer 3B is set more highly than a nitrogen (N) doping concentration to the drift layer 3D in order to suppress an increase in a channel resistance. In this case, the nitrogen (N) doping concentration to the buffer layer 3B is set as less than $4 \times 10^{19}$ cm$^{-3}$. This is because stacking faults easily occur, if the nitrogen (N) doping concentration to the buffer layer 3B becomes high.

(Relationship Between Thickness of Buffer Layer Having Low C/Si Ratio and Defect Density) FIG. 28A shows a schematic structure example of a result of forming a drift layer 3D via the buffer layer 3B on the SiC substrate having the off angle of 2 degrees 2 according to the embodiments. In this case, the growth temperature $T_g$ is 1680° C., the growth pressure P id 10.3 (kPa), the C/Si ratio of the buffer layer 3B is 0.75, the thickness of the buffer layer 3B is X μm, the C/Si ratio of the drift layer 3D is 0.9, and the thickness of the drift layer 3D is 10 μm.

Figure 28B:
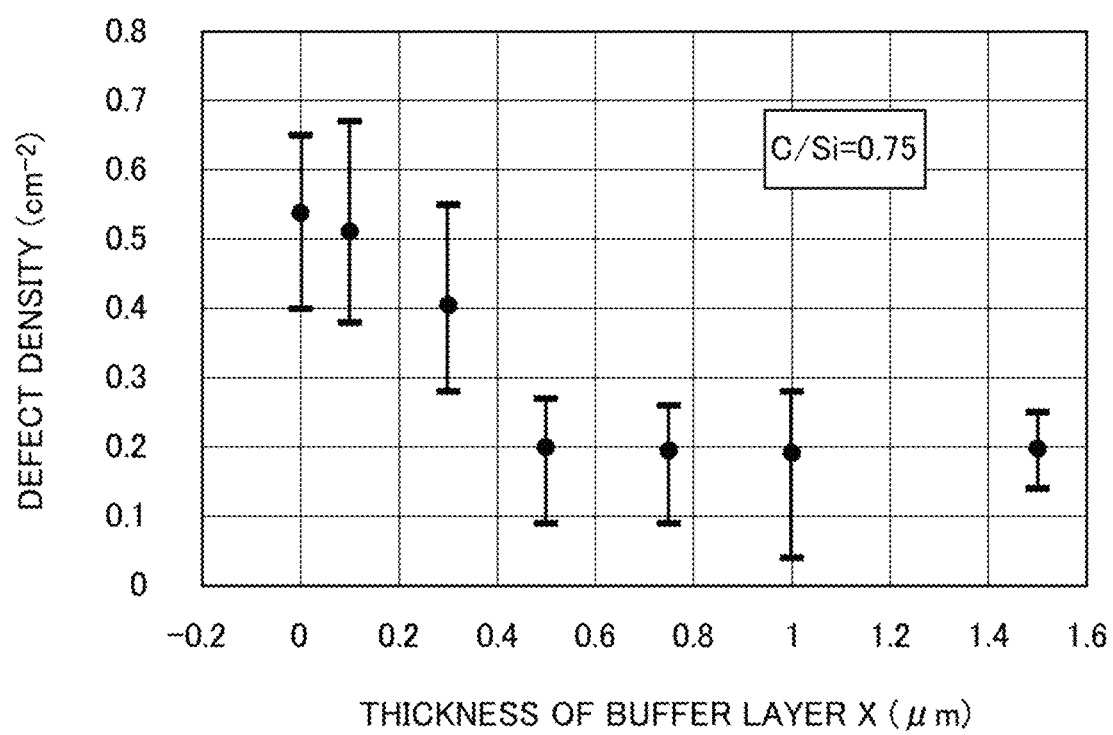
FIG. 28B shows dependency of the defect density ($cm^{-2}$) of the SiC epitaxial growth layer (drift layer) and the thickness X (μm) of the buffer layer (the C/Si ratio=0.75), in a result of forming the SiC epitaxial growth layer (drift layer) via the buffer layer on the SiC substrate having the off angle of 2 degrees according to the embodiments.

FIG. 28B shows dependency of the defect density (cm$^{-2}$) and the thickness X (μm) of the buffer layers 3B (C/Si ratio of the buffer layer is 0.75), in a result of forming the drift layer 3D via the buffer layer 3B on the SiC substrate having the off angle of 2 degrees 2 according to the embodiments.

With regard to a layer thickness level of each buffer layer 3B, FIG. 28B shows a variation range of measured results of six 3-inch φ wafers (four wafers only when the thickness of the buffer layer 3B is 1.5 μm). As surface defects of each drift layer 3D, the carrot defect density and the triangular defect density are totaled to be measured. The downfall density is excepted since it is dependent on a device condition.

Figure 29:
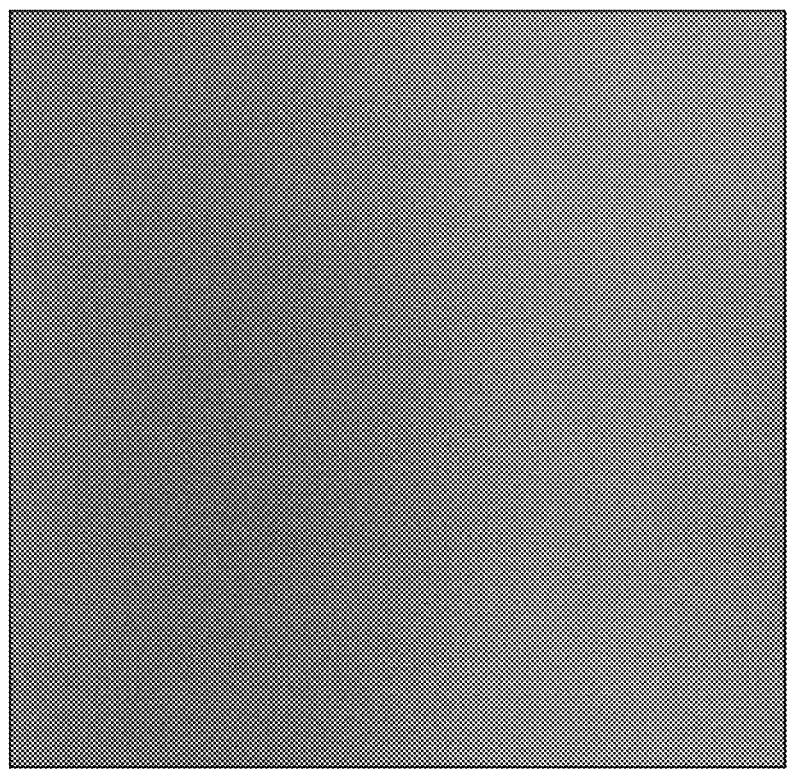
FIG. 29 shows a typical example of an image of confocal differential interference microscope (field of view: 750×750 $μm^2$) of the SiC epitaxial growth layer (drift layer) formed via the buffer layer on the SiC substrate having the off angle of 2 degrees (the growth temperature is 1680° C., the C/Si ratio of the buffer layer is 0.75, the thickness of the buffer layer is 0.5 μm, the C/Si ratio of the drift layer is 0.9, and the thickness of the drift layer is 10 μm).

FIG. 29 shows A typical example of an image of confocal differential interference microscope (field of view: 750×750 μm$^2$) of the drift layer 3D formed via the buffer layer 3B on the SiC substrate having the off angle of 2 degrees 2. In this case, the growth temperature $T_g$ is 1680° C., the C/Si ratio of the buffer layer 3B is 0.75, the thickness X of the buffer layer 3B is 0.5 μm, the C/Si ratio of the drift layer 3D is 0.9, and the thickness of the drift layer 3D is 10 μm.

The defect density (the carrot defect density and the triangular defect density) of the drift layer 3D formed via the buffer layer 3B on the SiC substrate having the off angle of 2 degrees 2 is reduced as the thickness X of the buffer layer 3B is increased, and is reduced to approximately 0.2 count/cm$^2$ if the thickness X is equal to or greater than 0.5 μm, for example.

As obvious from the relationship of the yield Y (%) and the device side length (mm) using the defect density (count (s)/cm$^2$) as a parameter shown in FIG. 7, for example, in the case of the defect density is 0.2 count/cm$^2$ if a SiC device of which the device side length is 10 mm is assumed, the yield equal to or greater than 80% can be expected, and if a SiC device of which the device side length is 5 mm is assumed, yield equal to or greater than 95% can be expected.

(First CVD Apparatus)

Figure 30:
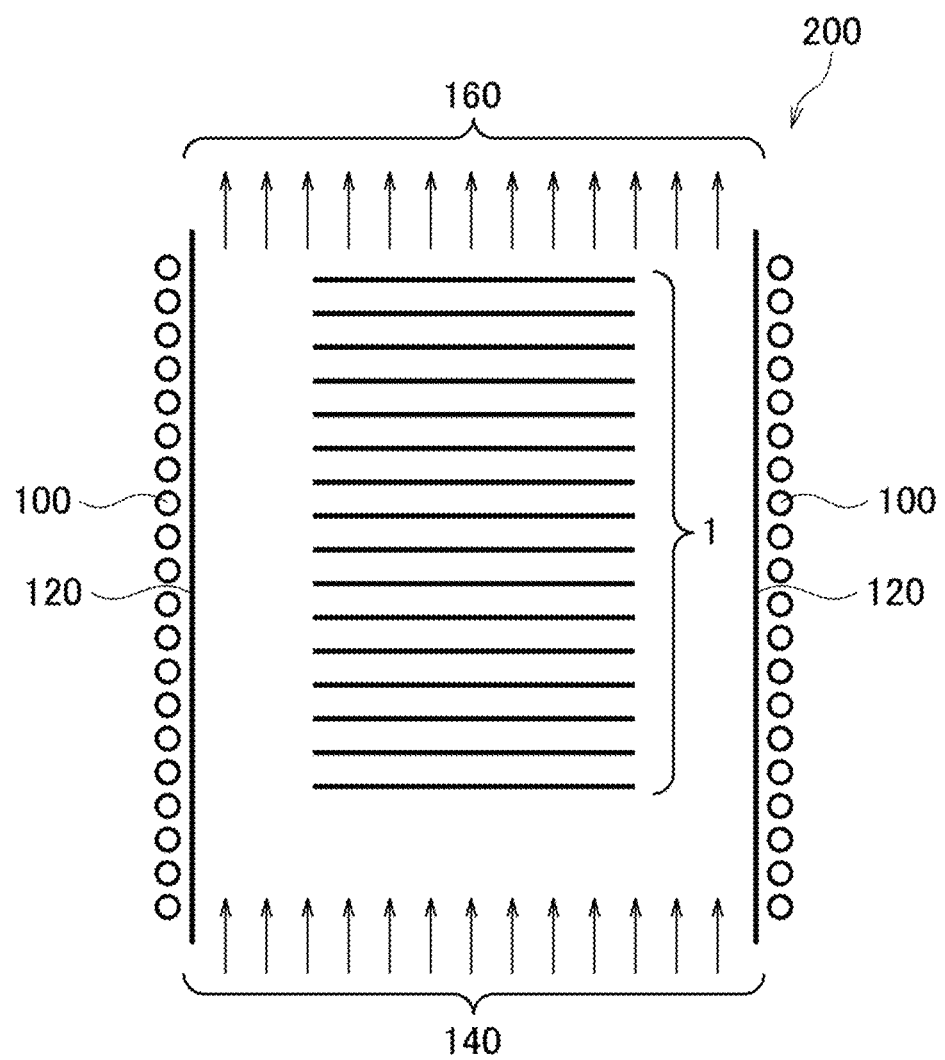
FIG. 30 is a schematic configuration diagram showing a first CVD apparatus applicable to the SiC epitaxial growth, in a manufacturing apparatus of the SiC epitaxial wafer according to the embodiments.

As shown in FIG. 30, a schematic configuration example of a first CVD apparatus applicable to the SiC epitaxial growth, in a manufacturing apparatus of the SiC epitaxial wafer according to the embodiments includes: a gas injection port 140; a gas exhaust port 160; a heating unit 100; and a vertical-type reactor 120.

As a heating method of the heating unit 100, resistance heating, induction heating using a coil, lamp heating, etc. are adoptable. In the case of the induction heating method, a structural member made from carbon (not shown in FIG. 14) disposed near the wafer, the structural member made from carbon produces heat, and then the wafer in contact with the structural member is heated or the wafer is heated with radiation from the structural member made from carbon.

In the vertical-type reactor 120, a plurality pieces of the SiC epitaxial wafers 1 can be disposed in a face up manner or face down manner.

While the material gas is supplied from the gas injection port 140 at a lower portion of the vertical-type reactor 120 and then is exhausted from the gas exhaust port 160 at an upper portion of the vertical-type reactor 120, the materials which flows on the surface of the plurality pieces of the SiC epitaxial wafers 1 react, thereby forming the SiC epitaxial growth layer.

In this case, a material gas supplied when forming the SiC epitaxial growth layer on the substrate having the off angle of less than 4 degrees contains an Si compound used as a supply source of Si, and Carbon (C) compound used as a supply source of Carbon (C). The uniformity of carrier density may be less than 10%, and the defect density may be less than 1 count/cm$^2$; and a C/Si ratio between the Si compound and the Carbon (C) compound is within a range of 0.7 to 0.95.

Moreover, the SiC epitaxial growth layer may include a buffer layer disposed on the substrate, and a drift layer disposed on the buffer layer. In this context, uniformity of carrier density may be less than 10% and a defect density is less than 0.5 count/cm$^2$; and the C/Si ratio of the buffer layer 3B may be controlled to be lower than the C/Si ratio of the drift layer 3D.

The off angle may be 2 degrees.

Moreover, a growth temperature of the SiC epitaxial growth layer may be within a range of 1630° C. to 1690° C.

Moreover, a growth pressure of the SiC epitaxial growth layer may be within a range of 3 kPa to 11 kPa.

Moreover, a flow rate of carrier gas at the time of formation of the SiC epitaxial growth layer may be within a range of 100 slm to 150 slm.

The Si compound may contain any one material of SiH$_4$, SiH$_3$F, SiH$_2$F$_2$, SiHF$_3$, or SiF$_4$, for example. Other compounds containing chlorine (Cl) may be used as the Si compound.

Moreover, the C compound may contain any one material of CF$_4$, C$_2$F$_6$, C$_3$F$_8$, C$_4$F$_6$, C$_4$F$_8$, C$_5$F$_8$, CHF$_3$, CH$_2$F$_2$, CH$_3$F, or C$_2$HF$_5$. Other compounds containing chlorine (Cl) may be used as the C compound.

Moreover, the SiC epitaxial growth layer may contain any one material of 4H—SiC, 6H—SiC, 2H—SiC, or 3C—SiC.

A diameter of the substrate 2 having an off angle of less than 4 degrees may be equal to or greater than 100 mm, for example.

The substrate 2 having an off angle of less than 4 may contain 4H—SiC or 6H—SiC. Moreover, any one BN, AlN, Al$_2$O$_3$, Ga$_2$O$_3$, diamond, carbon, or graphite may be contained instead of the SiC.

In the SiC epitaxial growth for the SiC epitaxial wafer according to the embodiments, at least one of H$_2$, Ar, HCl, and the F$_2$ is applicable as carrier gas.

As the materials for dopant, N (nitrogen) or TMA can be applied.

(Second CVD Apparatus)

Figure 31:
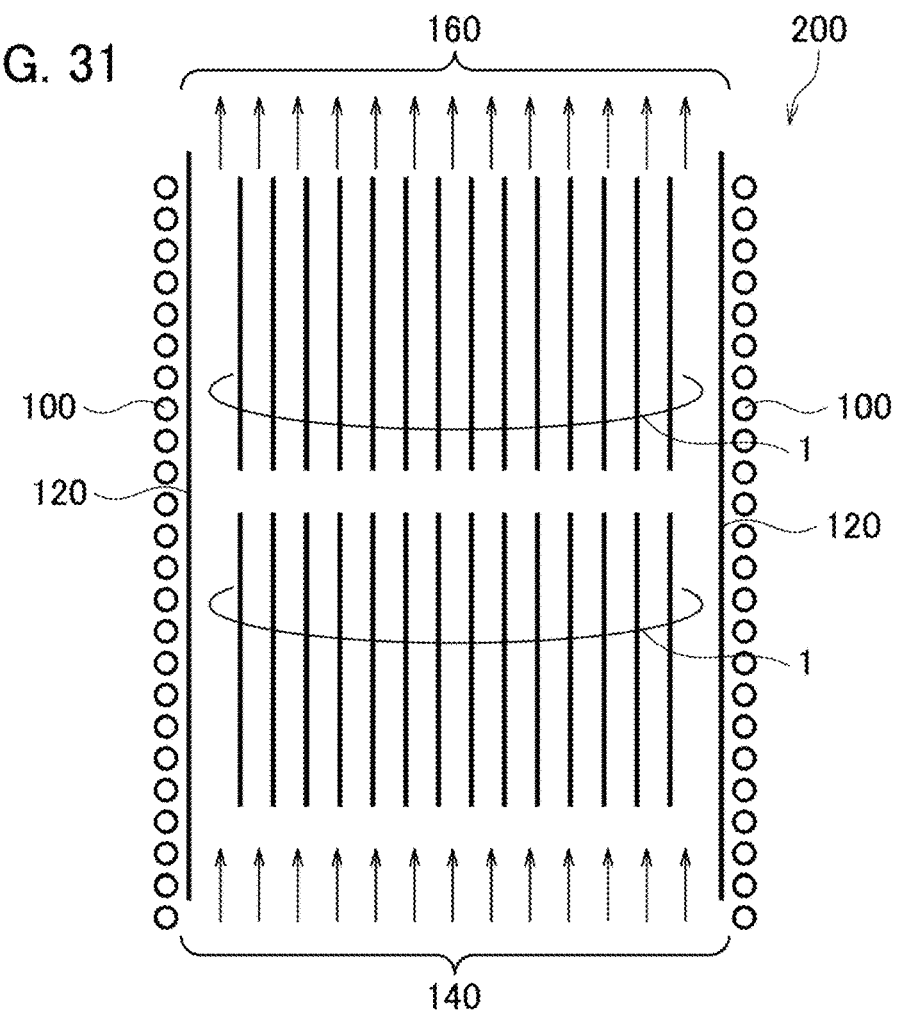
FIG. 31 is a schematic configuration diagram showing a second CVD apparatus applicable to the SiC epitaxial growth, in a manufacturing apparatus of the SiC epitaxial wafer according to the embodiments.

As shown in FIG. 31, a schematic configuration example of a second CVD apparatus applicable to the SiC epitaxial growth, in a manufacturing apparatus of the SiC epitaxial wafer according to the embodiments includes: a gas injection port 140; a gas exhaust port 160; a heating unit 100; and a vertical-type reactor 120.

As a heating method of the heating unit 100, resistance heating, induction heating using a coil, lamp heating, etc. are adoptable.

In the case of the induction heating method, a structural member made from carbon (not shown in FIG. 14) disposed near the wafer, the structural member made from carbon produces heat, and then the wafer in contact with the structural member is heated or the wafer is heated with radiation from the structural member made from carbon.

In the vertical-type reactor 120, the plurality pieces of the SiC epitaxial wafers 1 are disposed so as to be parallel to the flow of the gas.

While the material gas is supplied from the gas injection port 140 at a lower portion of the vertical-type reactor 120 and then is exhausted from the gas exhaust port 160 at an upper portion of the vertical-type reactor 120, the materials which flows on the surface of the plurality pieces of the SiC epitaxial wafers 1 react, thereby forming the SiC epitaxial growth layer.

In this case, a material gas supplied when forming the SiC epitaxial growth layer on the substrate having the off angle of less than 4 degrees contains an Si compound used as a supply source of Si, and Carbon (C) compound used as a supply source of Carbon (C). The uniformity of carrier density may be less than 10%, and the defect density may be less than 1 count/cm$^2$; and a C/Si ratio between the Si compound and the Carbon (C) compound is within a range of 0.7 to 0.95.

Moreover, the SiC epitaxial growth layer may include a buffer layer disposed on the substrate, and a drift layer disposed on the buffer layer. In this context, uniformity of carrier density may be less than 10% and a defect density is less than 0.5 count/cm$^2$; and the C/Si ratio of the buffer layer 3B may be controlled to be lower than the C/Si ratio of the drift layer 3D.

The off angle may be 2 degrees.

Moreover, a growth temperature of the SiC epitaxial growth layer may be within a range of 1630° C. to 1690° C.

Moreover, a growth pressure of the SiC epitaxial growth layer may be within a range of 3 kPa to 11 kPa.

Moreover, a flow rate of carrier gas at the time of formation of the SiC epitaxial growth layer may be within a range of 100 slm to 150 slm.

The Si compound may contain any one material of SiH$_4$, SiH$_3$F, SiH$_2$F$_2$, SiHF$_3$, or SiF$_4$, for example. Other compounds containing chlorine (Cl) may be used as the Si compound.

Moreover, the C compound may contain any one material of C$_3$H$_8$, C$_2$H$_4$, C$_2$H$_2$, CF$_4$, C$_2$F$_6$, C$_3$F$_8$, C$_4$F$_6$, C$_4$F$_8$, C$_5$F$_8$, CHF$_3$, CH$_2$F$_2$, CH$_3$F, or C$_2$HF$_5$. Other compounds containing chlorine (Cl) may be used as the C compound.

Moreover, the SiC epitaxial growth layer may contain any one material of 4H—SiC, 6H—SiC, 2H—SiC, or 3C—SiC.

A diameter of the substrate 2 having an off angle of less than 4 may be equal to or greater than 100 mm, for example.

The substrate 2 having an off angle of less than 4 may contain 4H—SiC or 6H—SiC. Any one BN, AlN, Al$_2$O$_3$, Ga$_2$O$_3$, diamond, carbon, or graphite may be contained instead of the SiC.

In the SiC epitaxial growth for the SiC epitaxial wafer according to the embodiments, at least one of H$_2$, Ar, HCl, and the F$_2$ is applicable as carrier gas.

As the materials for dopant, N (Nitrogen) or TMA can be applied.

(Third CVD Apparatus)

Figure 32:
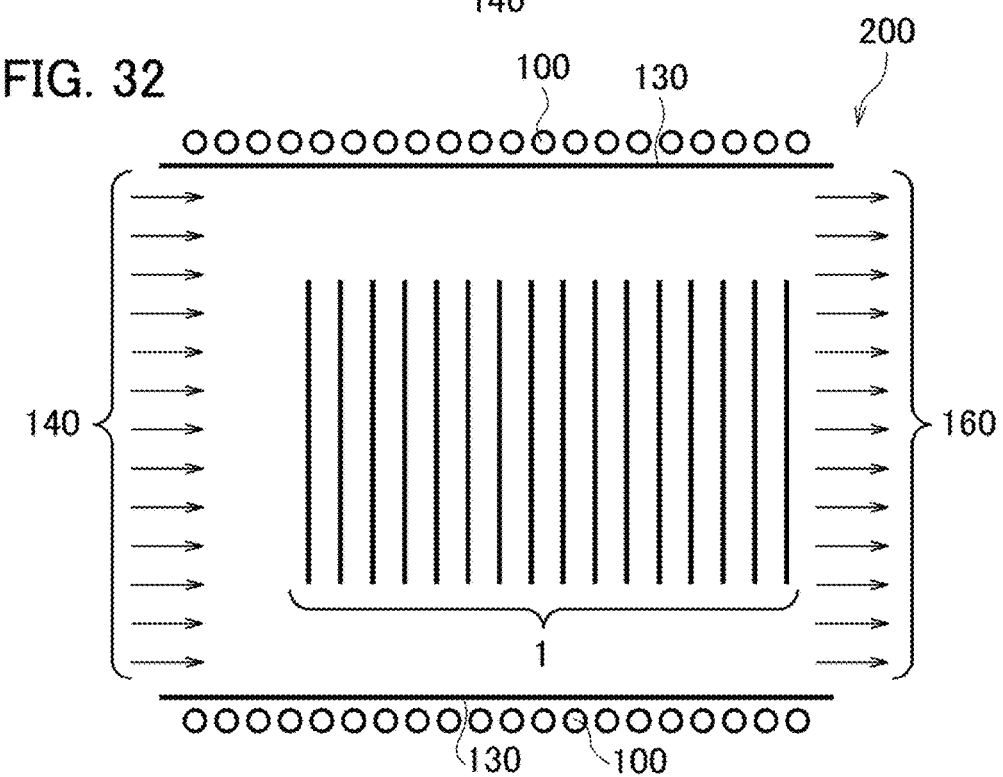
FIG. 32 is a schematic configuration diagram showing a third CVD apparatus applicable to the SiC epitaxial growth, in a manufacturing apparatus of the SiC epitaxial wafer according to the embodiments.

As shown in FIG. 32, a schematic configuration example of a third CVD apparatus applicable to the SiC epitaxial growth, in a manufacturing apparatus 200 of the SiC epitaxial wafer according to the embodiments includes: a gas injection port 140; a gas exhaust port 160; a heating unit 100; and a horizontal-type reactor 130.

As a heating method of the heating unit 100, resistance heating, induction heating using a coil, lamp heating, etc. are adoptable. In the case of the induction heating method, a structural member made from carbon (not shown in FIG. 14) disposed near the wafer, the structural member made from carbon produces heat, and then the wafer in contact with the structural member is heated or the wafer is heated with radiation from the structural member made from carbon.

In the horizontal-type reactor 130, the plurality pieces of the SiC epitaxial wafers 1 can be vertically arranged in the upward direction stand so as to be opposite to the flow of gas.

While the material gas is supplied from the gas injection port 140 of the horizontal-type reactor 130, passes through the plurality pieces of the SiC epitaxial wafers 1, and then is exhausted from the gas exhaust port 160, the materials which flows on the surface of the plurality pieces of the SiC epitaxial wafers 1 react, thereby forming the SiC epitaxial growth layer.

In this case, a material gas supplied when forming the SiC epitaxial growth layer on the substrate having the off angle of less than 4 degrees contains an Si compound used as a supply source of Si, and Carbon (C) compound used as a supply source of Carbon (C). The uniformity of carrier density may be less than 10%, and the defect density may be less than 1 count/cm$^2$; and a C/Si ratio between the Si compound and the Carbon (C) compound is within a range of 0.7 to 0.95.

Moreover, the SiC epitaxial growth layer may include a buffer layer disposed on the substrate, and a drift layer disposed on the buffer layer. In this context, uniformity of carrier density may be less than 10% and a defect density is less than 0.5 count/cm$^2$; and the C/Si ratio of the buffer layer 3B may be controlled to be lower than the C/Si ratio of the drift layer 3D.

The off angle may be 2 degrees.

Moreover, a growth temperature of the SiC epitaxial growth layer may be within a range of 1630° C. to 1690° C.

Moreover, a growth pressure of the SiC epitaxial growth layer may be within a range of 3 kPa to 11 kPa.

Moreover, a flow rate of carrier gas at the time of formation of the SiC epitaxial growth layer may be within a range of 100 slm to 150 slm.

The Si compound may contain any one material of SiH$_4$, SiH$_3$F, SiH$_2$F$_2$, SiHF$_3$, or SiF$_4$, for example. Other compounds containing chlorine (Cl) may be used as the Si compound.

Moreover, the C compound may contain any one material of C$_3$H$_8$, C$_2$H$_4$, C$_2$H$_2$, CF$_4$, C$_2$F$_6$, C$_3$F$_8$, C$_4$F$_6$, C$_4$F$_8$, C$_5$F$_8$, CHF$_3$, CH$_2$F$_2$, CH$_3$F, or C$_2$HF$_5$. Other compounds containing chlorine (Cl) may be used as the C compound.

Moreover, the SiC epitaxial growth layer may contain any one material of 4H—SiC, 6H—SiC, 2H—SiC, or 3C—SiC.

A diameter of the substrate 2 having an off angle of less than 4 may be equal to or greater than 100 mm, for example.

The substrate 2 having an off angle of less than 4 may contain 4H—SiC or 6H—SiC. Any one BN, AlN, Al$_2$O$_3$, Ga$_2$O$_3$, diamond, carbon, or graphite may be contained instead of the SiC.

In the SiC epitaxial growth for the SiC epitaxial wafer according to the embodiments, at least one of H$_2$, Ar, HCl, and the F$_2$ is applicable as carrier gas.

As the materials for dopant, N (nitrogen) or TMA can be applied.

(Fourth CVD Apparatus)

Figure 33:
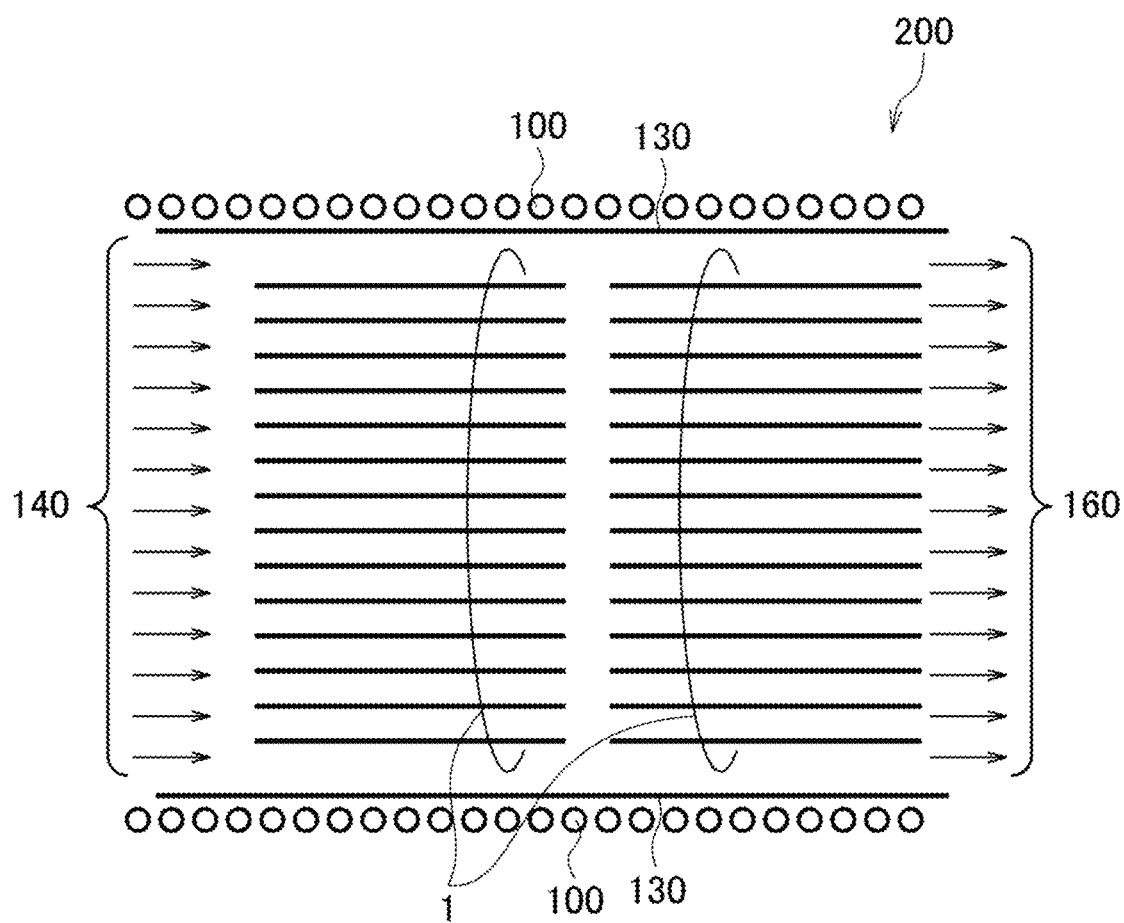
FIG. 33 is a schematic configuration diagram showing a fourth CVD apparatus applicable to the SiC epitaxial growth, in a manufacturing apparatus of the SiC epitaxial wafer according to the embodiments.

As shown in FIG. 33, a schematic configuration example of a fourth CVD apparatus applicable to the SiC epitaxial growth, in a manufacturing apparatus 200 of the SiC epitaxial wafer according to the embodiments includes: a gas injection port 140; a gas exhaust port 160; a heating unit 100; and a horizontal-type reactor 130.

As a heating method of the heating unit 100, resistance heating, induction heating using a coil, lamp heating, etc. are adoptable. In the case of the induction heating method, a structural member made from carbon (not shown in FIG. 14) disposed near the wafer, the structural member made from carbon produces heat, and then the wafer in contact with the structural member is heated or the wafer is heated with radiation from the structural member made from carbon.

In the horizontal-type reactor 130, a plurality pieces of the SiC epitaxial wafers 1 can be disposed in a face up manner or face down manner.

While the material gas is supplied from the gas injection port 140 of the horizontal-type reactor 130, passes through the plurality pieces of the SiC epitaxial wafers 1, and then is exhausted from the gas exhaust port 160, the materials which flows on the surface of the plurality pieces of the SiC epitaxial wafers 1 react, thereby forming the SiC epitaxial growth layer.

In this case, a material gas supplied when forming the SiC epitaxial growth layer on the substrate having the off angle of less than 4 degrees contains an Si compound used as a supply source of Si, and Carbon (C) compound used as a supply source of Carbon (C). The uniformity of carrier density may be less than 10%, and the defect density may be less than 1 count/cm$^2$; and a C/Si ratio between the Si compound and the Carbon (C) compound is within a range of 0.7 to 0.95.

Moreover, the SiC epitaxial growth layer may include a buffer layer disposed on the substrate, and a drift layer disposed on the buffer layer. In this context, uniformity of carrier density may be less than 10% and a defect density is less than 0.5 count/cm$^2$; and the C/Si ratio of the buffer layer 3B may be controlled to be lower than the C/Si ratio of the drift layer 3D.

The off angle may be 2 degrees.

Moreover, a growth temperature of the SiC epitaxial growth layer may be within a range of 1630° C. to 1690° C.

Moreover, a growth pressure of the SiC epitaxial growth layer may be within a range of 3 kPa to 11 kPa.

Moreover, a flow rate of carrier gas at the time of formation of the SiC epitaxial growth layer may be within a range of 100 slm to 150 slm.

The Si compound may contain any one material of SiH$_4$, SiH$_3$F, SiH$_2$F$_2$, SiHF$_3$, or SiF$_4$, for example. Other compounds containing chlorine (Cl) may be used as the Si compound.

Moreover, the C compound may contain any one material of C$_3$H$_8$, C$_2$H$_4$, C$_2$H$_2$, CF$_4$, C$_2$F$_6$, C$_3$F$_8$, C$_4$F$_6$, C$_4$F$_8$, C$_5$F$_8$, CHF$_3$, CH$_2$F$_2$, CH$_3$F, or C$_2$HF$_5$. Other compounds containing chlorine (Cl) may be used as the C compound.

Moreover, the SiC epitaxial growth layer may contain any one material of 4H—SiC, 6H—SiC, 2H—SiC, or 3C—SiC.

A diameter of the substrate 2 having an off angle of less than 4 may be equal to or greater than 100 mm, for example.

The substrate 2 having an off angle of less than 4 may contain 4H—SiC or 6H—SiC. Any one BN, AlN, Al$_2$O$_3$, Ga$_2$O$_3$, diamond, carbon, or graphite may be contained instead of the SiC.

In the SiC epitaxial growth for the SiC epitaxial wafer according to the embodiments, at least one of H$_2$, Ar, HCl, and the F$_2$ is applicable as carrier gas.

As the materials for dopant, N (nitrogen) or TMA can be applied.

The above-mentioned SiC epitaxial wafer 1 according to the embodiments is applicable to fabricating of various kinds of SiC semiconductor elements, for example. Hereinafter, there will be shown examples of a SiC Schottky Barrier Diode (SiC-SBD), a SiC Trench-gate type Metal Oxide Semiconductor Field Effect Transistor (Sic-TMOSFET), and a SiC planar-gate type MOSFET, as those examples.

(SiC-SBD)

Figure 34:
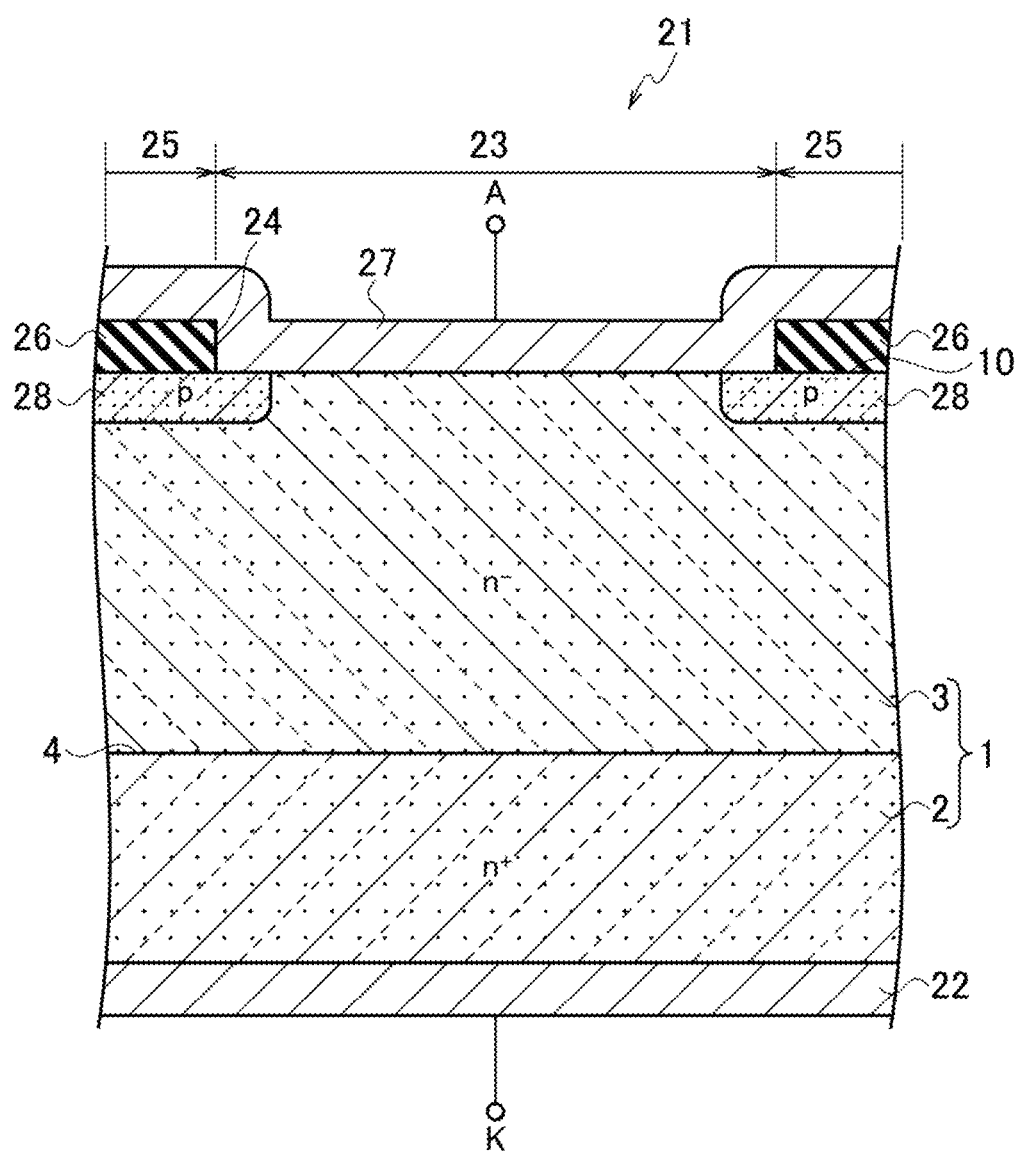
FIG. 34 is a schematic cross-sectional structure diagram showing a Schottky barrier diode fabricated with the SiC epitaxial wafer according to the embodiments.

FIG. 34 shows a schematic cross-sectional structure of SiC-SBD 21 fabricated using the SiC epitaxial wafer according to the embodiments.

As shown in FIG. 34, the SiC-SBD 21 fabricated using the SiC epitaxial wafer according to the embodiments includes a SiC epitaxial wafer 1. The SiC epitaxial wafer 1 includes: an n$^+$ type SiC substrate 2 having the off angle of less than 2 degrees (of which an impurity concentration is approximately 1×10$^{18}$ cm$^{-3}$ to approximately 1×10$^{21}$ cm$^{-3}$, for example); and an n$^-$ type SiC epitaxial growth layer 3 (of which an impurity concentration is approximately 5×10$^{14}$ cm$^{-3}$ to approximately 5×10$^{16}$ cm$^{-3}$, for example).

In this case, a material gas supplied when forming the SiC epitaxial growth layer 3 on the SiC substrate having the off angle of less than 4 degrees contains an Si compound used as a supply source of Si, and Carbon (C) compound used as a supply source of Carbon (C). The uniformity of carrier density may be less than 10%, and the defect density may be less than 1 count/cm$^2$; and a C/Si ratio between the Si compound and the Carbon (C) compound is within a range of 0.7 to 0.95.

Moreover, the SiC epitaxial growth layer 3 may include a buffer layer disposed on the SiC substrate having the off angle of less than 4 degrees, and a drift layer disposed on the buffer layer. In this context, uniformity of carrier density may be less than 10% and a defect density is less than 0.5 count/cm$^2$; and the C/Si ratio of the buffer layer 3B may be controlled to be lower than the C/Si ratio of the drift layer 3D.

The off angle may be 2 degrees.

Moreover, a growth temperature of the SiC epitaxial growth layer 3 may be within a range of 1630° C. to 1690° C.

Moreover, a growth pressure of the SiC epitaxial growth layer 3 may be within a range of 3 kPa to 11 kPa.

Moreover, a flow rate of carrier gas at the time of formation of the SiC epitaxial growth layer 3 may be within a range of 100 slm to 150 slm.

The Si compound may contain any one material of SiH$_4$, SiH$_3$F, SiH$_2$F$_2$, SiHF$_3$, or SiF$_4$, for example. Other compounds containing chlorine (Cl) may be used as the Si compound.

Moreover, the C compound may contain any one material of C$_3$H$_8$, C$_2$H$_4$, C$_2$H$_2$, CF$_4$, C$_2$F$_6$, C$_3$F$_8$, C$_4$F$_6$, C$_4$F$_8$, C$_5$F$_8$, CHF$_3$, CH$_2$F$_2$, CH$_3$F, or C$_2$HF$_5$. Other compounds containing chlorine (Cl) may be used as the C compound.

Moreover, the SiC epitaxial growth layer may contain any one material of 4H—SiC, 6H—SiC, 2H—SiC, or 3C—SiC.

A diameter of the substrate 2 having an off angle of less than 4 may be equal to or greater than 100 mm, for example.

The substrate 2 having an off angle of less than 4 may contain 4H—SiC or 6H—SiC. Any one BN, AlN, Al$_2$O$_3$, Ga$_2$O$_3$, diamond, carbon, or graphite may be contained instead of the SiC.

In the SiC epitaxial growth for the SiC epitaxial wafer according to the embodiments, at least one of H$_2$, Ar, HCl, and the F$_2$ is applicable as carrier gas.

As an n type doping impurities, nitrogen (N), phosphorus (P), arsenic (As), etc. are applicable, for example.

As p type doping impurities, TMA etc. are applicable, for example.

A back side surface ((000-1) C surface) of the SiC substrate 2 includes a cathode electrode 22 so as to cover the whole region of the back side surface, and the cathode electrode 22 is connected to a cathode terminal K.

A surface 10 ((0001) Si surface) of the SiC epitaxial growth layer 3 includes a contact hole 24 to which a part of the SiC epitaxial growth layer 3 is exposed as an active region 23, and a field insulating film 26 is formed at a field region 25 which surrounding the active region 23.

Although the field insulating film 26 includes silicon oxide ($SiO_2$), the field insulating film 26 may include other insulating materials, e.g. silicon nitride (SiN). An anode electrode 27 is formed on the field insulating film 26, and the anode electrode 27 is connected to an anode terminal A.

Near the surface 10 (surface portion) of the SiC epitaxial growth layer 3, a p type Junction Termination Extension (JTE) structure 28 is formed so as to be contacted with the anode electrode 27. The JTE structure 28 is formed along an outline of the contact hole 24 so as to extend from the outside to inside of the contact hole 24 of the field insulating film 26.

According to the SiC-SBD 21 fabricated using the SiC epitaxial wafer according to the embodiments, a leakage current can be reduced.

(SiC-TMOSFET)

Figure 35:
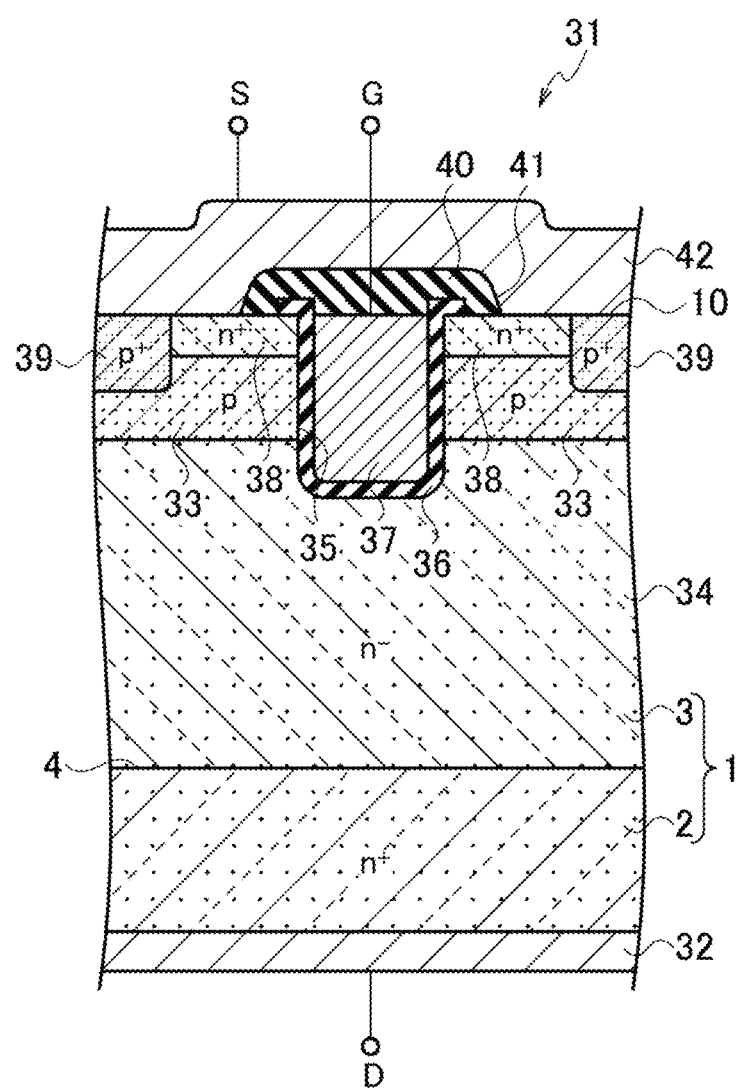
FIG. 35 is a schematic cross-sectional structure diagram showing a trench-gate type MOSFET fabricated with the SiC epitaxial wafer according to the embodiments.

FIG. 35 shows a schematic cross-sectional structure of the SiC-TMOSFET 31 fabricated using the SiC epitaxial wafer according to the embodiments.

As shown in FIG. 35, the SiC-TMOSFET 31 fabricated using the SiC epitaxial wafer according to the embodiments includes a SiC epitaxial wafer 1. The SiC epitaxial wafer 1 includes: an $n^+$ type SiC substrate 2 having the off angle of less than 2 degrees (of which an impurity concentration is approximately $1 \times 10^{18}$ $cm^{-3}$ to approximately $1 \times 10^{21}$ $cm^{-3}$, for example); and an $n^-$ type SiC epitaxial growth layer 3 (of which an impurity concentration is approximately $5 \times 10^{14}$ $cm^{-3}$ to approximately $5 \times 10^{16}$ $cm^{-3}$, for example).

In this case, a material gas supplied when forming the SiC epitaxial growth layer 3 on the SiC substrate having the off angle of less than 4 degrees contains an Si compound used as a supply source of Si, and Carbon (C) compound used as a supply source of Carbon (C). The uniformity of carrier density may be less than 10%, and the defect density may be less than 1 count/$cm^2$; and a C/Si ratio between the Si compound and the Carbon (C) compound is within a range of 0.7 to 0.95.

Moreover, the SiC epitaxial growth layer 3 may include a buffer layer disposed on the SiC substrate having the off angle of less than 4 degrees, and a drift layer disposed on the buffer layer. In this context, uniformity of carrier density may be less than 10% and a defect density is less than 0.5 count/$cm^2$; and the C/Si ratio of the buffer layer 3B may be controlled to be lower than the C/Si ratio of the drift layer 3D.

The off angle may be 2 degrees.

Moreover, a growth temperature of the SiC epitaxial growth layer 3 may be within a range of 1630° C. to 1690° C.

Moreover, a growth pressure of the SiC epitaxial growth layer 3 may be within a range of 3 kPa to 11 kPa.

Moreover, a flow rate of carrier gas at the time of formation of the SiC epitaxial growth layer 3 may be within a range of 100 slm to 150 slm.

The Si compound may contain any one material of $SiH_4$, $SiH_3F$, $SiH_2F_2$, $SiHF_3$, or $SiF_4$, for example. Other compounds containing chlorine (Cl) may be used as the Si compound.

Moreover, the C compound may contain any one material of $C_3H_8$, $C_2H_4$, $C_2H_2$, $CF_4$, $C_2F_6$, $C_3F_8$, $C_4F_6$, $C_4F_8$, $C_5F_8$, $CHF_3$, $CH_2F_2$, $CH_3F$, or $C_2HF_5$. Other compounds containing chlorine (Cl) may be used as the C compound.

Moreover, the SiC epitaxial growth layer may contain any one material of 4H—SiC, 6H—SiC, 2H—SiC, or 3C—SiC.

A diameter of the substrate 2 having an off angle of less than 4 may be equal to or greater than 100 mm, for example.

The substrate 2 having an off angle of less than 4 may contain 4H—SiC or 6H—SiC. Any one BN, AlN, $Al_2O_3$, $Ga_2O_3$, diamond, carbon, or graphite may be contained instead of the SiC.

In the SiC epitaxial growth for the SiC epitaxial wafer according to the embodiments, at least one of $H_2$, Ar, HCl, and the $F_2$ is applicable as carrier gas.

As an n type doping impurities, nitrogen (N), phosphorus (P), arsenic (As), etc. are applicable, for example.

As p type doping impurities, TMA etc. are applicable, for example.

A back side surface ((000-1) C surface) of the SiC substrate 2 includes a drain electrode 32 so as to cover the whole region of the back side surface, and the drain electrode 32 is connected to a drain terminal D.

Near the surface 10 ((0001) Si surface) (surface portion) of the SiC epitaxial growth layer 3, a p type body region 33 (of which an impurity concentration is approximately $1 \times 10^{26}$ $cm^{-3}$ to approximately $1 \times 10^{19}$ $cm^{-3}$, for example) is formed. In the SiC epitaxial growth layer 3, a portion at a side of the SiC substrate 2 with respect to the body region 33 is an $n^-$ type drain region 34 where a state after the epitaxial growth is still kept.

A gate trench 35 is formed in the SiC epitaxial growth layer 3. The gate trench 35 passes through the body region 33 from the surface 10 of the SiC epitaxial growth layer 3, and a deepest portion of the gate trench 35 extends to the drain region 34.

A gate insulating film 36 is formed on an inner surface of the gate trench 35 and the surface 10 of the SiC epitaxial growth layer 3 so as to cover the whole of the inner surface of the gate trench 35. Moreover, a gate electrode 37 is embedded in the gate trench 35 by filling up the inside of the gate insulating film 36 with polysilicon, for example. A gate terminal G is connected to the gate electrode 37.

An $n^+$ type source region 38 forming a part of a side surface of the gate trench 35 is formed on a surface portion of the body region 33.

Moreover, a $p^+$ type body contact region 39 (of which an impurity concentration is approximately $1 \times 10^{18}$ $cm^{-3}$ to approximately $1 \times 10^{21}$ $cm^{-3}$, for example) which passes through the source region 38 from the surface 10 and is connected to the body region 33 is formed on the SiC epitaxial growth layer 3.

An interlayer insulating film 40 including $SiO_2$ is formed on the SiC epitaxial growth layer 3. A source electrode 42 is connected to the source region 38 and the body contact region 39 through a contact hole 41 formed in the interlayer insulating film 40. A source terminal S is connected to the source electrode 42.

A predetermined voltage (voltage equal to or greater than a gate threshold voltage) is applied to the gate electrode 37 in a state where a predetermined potential difference is generated between the source electrode 42 and the drain electrode 32 (between the source and the drain). Thereby, a channel can be formed by an electric field from the gate electrode 37 near the interface between the gate insulating film 36 and the body region 33. Thus, an electric current can be flowed between the source electrode 42 and the drain electrode 32, and thereby SiC-TMOSFET 31 can be turned ON state.

The SiC-TMOSFET 31 fabricated using the SiC epitaxial wafer according to the embodiments can improve a carrier mobility and can offer enhanced speed.

(SiC Planar-Gate Type MOSFET)

Figure 36:
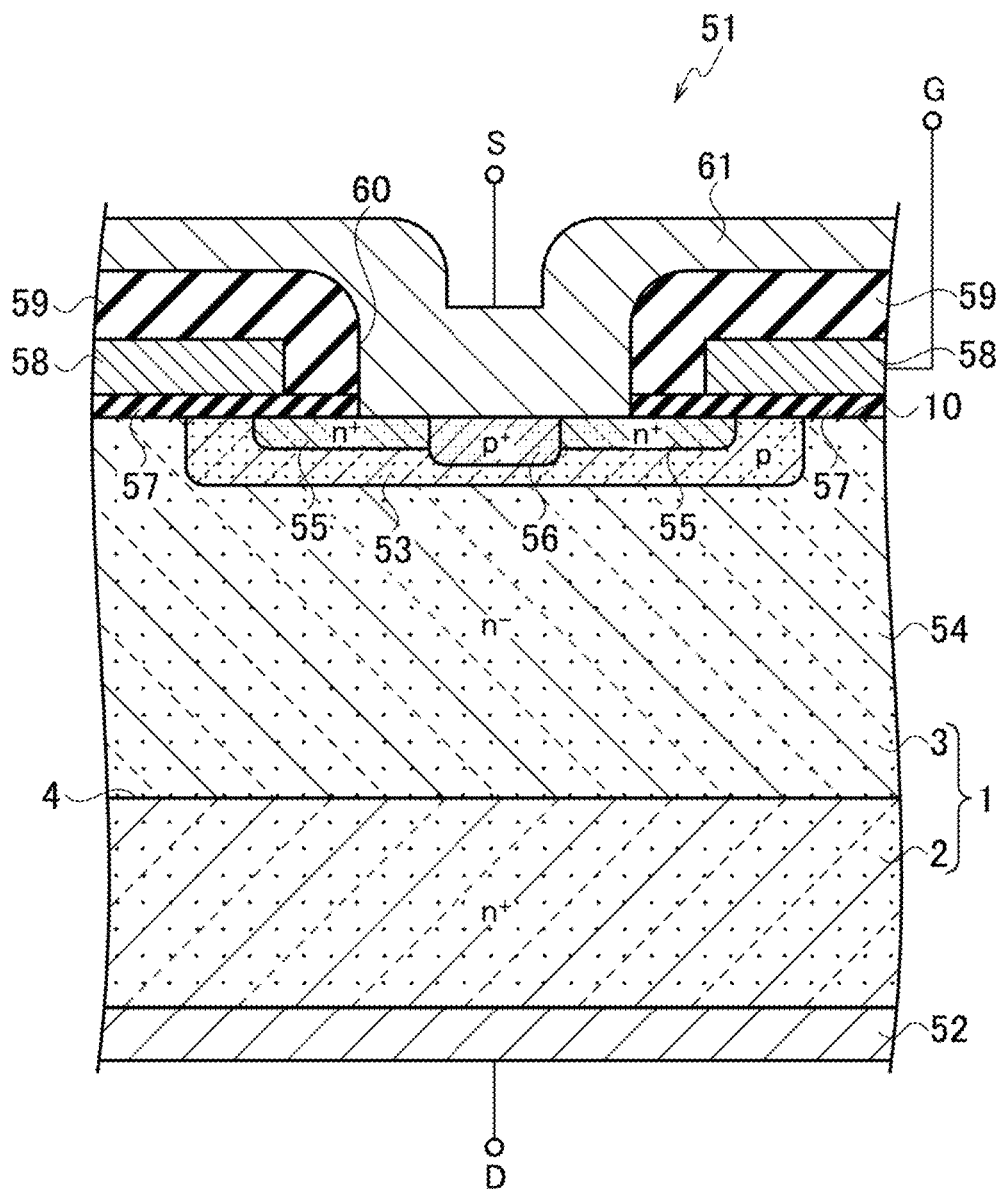
FIG. 36 is a schematic cross-sectional structure diagram showing a planar-gate type MOSFET fabricated with the SiC epitaxial wafer according to the embodiments.

FIG. 36 shows a schematic cross-sectional structure of the planar-gate type SiC-MOSFET fabricated using the SiC epitaxial wafer according to the embodiments.

As shown in FIG. 36, the planar-gate-type SiC-TMOSFET 51 fabricated using the SiC epitaxial wafer according to the embodiments includes a SiC epitaxial wafer 1. The SiC epitaxial wafer 1 includes: an n$^+$ type SiC substrate 2 having the off angle of less than 2 degrees (of which an impurity concentration is approximately $1\times10^{18}$ cm$^{-3}$ to approximately $1\times10^{21}$ cm$^{-3}$, for example); and an n$^-$ type SiC epitaxial growth layer 3 (of which an impurity concentration is approximately $5\times10^{14}$ cm$^{-3}$ to approximately $5\times10^{16}$ cm$^{-3}$, for example).

In this case, a material gas supplied when forming the SiC epitaxial growth layer 3 on the SiC substrate having the off angle of less than 4 degrees contains an Si compound used as a supply source of Si, and Carbon (C) compound used as a supply source of Carbon (C). The uniformity of carrier density may be less than 10%, and the defect density may be less than 1 count/cm$^2$; and a C/Si ratio between the Si compound and the Carbon (C) compound is within a range of 0.7 to 0.95.

Moreover, the SiC epitaxial growth layer 3 may include a buffer layer disposed on the SiC substrate having the off angle of less than 4 degrees, and a drift layer disposed on the buffer layer. In this context, uniformity of carrier density may be less than 10% and a defect density is less than 0.5 count/cm$^2$; and the C/Si ratio of the buffer layer 3B may be controlled to be lower than the C/Si ratio of the drift layer 3D.

The off angle may be 2 degrees.

Moreover, a growth temperature of the SiC epitaxial growth layer 3 may be within a range of 1630° C. to 1690° C.

Moreover, a growth pressure of the SiC epitaxial growth layer 3 may be within a range of 3 kPa to 11 kPa.

Moreover, a flow rate of carrier gas at the time of formation of the SiC epitaxial growth layer 3 may be within a range of 100 slm to 150 slm.

The Si compound may contain any one material of SiH$_4$, SiH$_3$F, SiH$_2$F$_2$, SiHF$_3$, or SiF$_4$, for example. Other compounds containing chlorine (Cl) may be used as the Si compound.

Moreover, the C compound may contain any one material of C$_3$H, C$_2$H$_4$, C$_2$H$_2$, CF$_4$, C$_2$F$_6$, C$_3$F$_8$, C$_4$F$_6$, C$_4$F$_8$, C$_5$F$_8$, CHF$_3$, CH$_2$F$_2$, CH$_3$F, or C$_2$HF$_5$. Other compounds containing chlorine (Cl) may be used as the C compound.

Moreover, the SiC epitaxial growth layer may contain any one material of 4H—SiC, 6H—SiC, 2H—SiC, or 3C—SiC.

A diameter of the substrate 2 having an off angle of less than 4 may be equal to or greater than 100 mm, for example.

The substrate 2 having an off angle of less than 4 may contain 4H—SiC or 6H—SiC. Any one BN, AlN, Al$_2$O$_3$, Ga$_2$O$_3$, diamond, carbon, or graphite may be contained instead of the SiC.

In the SiC epitaxial growth for the SiC epitaxial wafer according to the embodiments, at least one of H$_2$, Ar, HCl, and the F$_2$ is applicable as carrier gas.

As an n type doping impurities, nitrogen (N), phosphorus (P), arsenic (As), etc. are applicable, for example.

As p type doping impurities, TMA etc. are applicable, for example.

A back side surface ((000-1) C surface) of the SiC substrate 2 includes a drain electrode 52 so as to cover the whole region of the back side surface, and the drain electrode 52 is connected to a drain terminal D.

Near the surface 10 ((0001) Si surface) (surface portion) of the SiC epitaxial growth layer 3, a p type body region 53 (of which an impurity concentration is approximately $1\times10^{16}$ cm$^{-3}$ to approximately $1\times10^{19}$ cm$^{-3}$, for example) is formed in a well shape. In the SiC epitaxial growth layer 3, a portion at a side of the SiC substrate 2 with respect to the body region 53 is an n-type drain region 54 where a state after the epitaxial growth is still kept.

An n$^+$ type source region 55 is formed on a surface portion of the body region 53 with a certain space from a periphery of the body region 53.

A p$^+$ type body contact region 56 (of which an impurity concentration is approximately $1\times10^{18}$ cm$^{-3}$ to approximately $1\times10^{21}$ cm$^{-3}$, for example) is formed inside of the source region 55. The body contact region 56 passes through the source region 55 in a depth direction, and is connected to the body region 53.

A gate insulating film 57 is formed on the surface 10 of the SiC epitaxial growth layer 3. The gate insulating film 57 covers the portion surrounding the source region 55 in the body region 53 (peripheral portion of the body region 53), and an outer peripheral portion of the source region 55.

A gate electrode 58 including polysilicon, for example, is formed on the gate insulating film 57. The gate electrode 58 is opposed to the peripheral portion of the body region 53 by sandwiching the gate insulating film 57. A gate terminal G is connected to the gate electrode 58.

An interlayer insulating film 59 including SiO$_2$ is formed on the SiC epitaxial growth layer 3. A source electrode 61 is connected to the source region 55 and the body contact region 56 through a contact hole 60 formed in the interlayer insulating film 59. A source terminal S is connected to the source electrode 61.

A predetermined voltage (voltage equal to or greater than a gate threshold voltage) is applied to the gate electrode 58 in a state where a predetermined potential difference is generated between the source electrode 61 and the drain electrode 52 (between the source and the drain). Thereby, a channel can be formed by an electric field from the gate electrode 58 near the interface between the gate insulating film 57 and the body region 53. Thus, an electric current can be flowed between the source electrode 61 and the drain electrode 52, and thereby the planar-gate type MOSFET 51 can be turned ON state.

The planar-gate type MOSFET 51 also can improve a carrier mobility and can offer enhanced speed, similarly to the SiC-TMOSFET 31 shown in FIG. 35.

Although the embodiments have been explained above, the embodiments can also be implemented with other configurations.

For example, the principal surface 4 (substrate surface) of the SiC substrate 2 may be inclined in the OFF direction of [−1100] axis with respect to the (0001) surface by the off angle θ less than 4 degrees. Although illustration is omitted, MOS capacitors can also be fabricated using the SiC epitaxial wafer 1 according to the embodiments. According to the MOS capacitors, a yield and reliability can be improved. Moreover, with regard to the reliability, initial failures can be reduced.

Although illustration is omitted, bipolar junction transistors can also be fabricated using the SiC epitaxial wafer according to the embodiments. In addition, the SiC epitaxial wafer according to the embodiments can also be used for fabricating of SiC-pn diodes, SiC Insulated Gate Bipolar Transistor (IGBT), SiC complementary MOSFET, etc.

According to the SiC epitaxial wafer according to the embodiments, defect regions on the surface or interface of the SiC epitaxial growth layer can be reduced. Therefore, a leakage current, nonuniformity of the oxide film thickness, interface state density, surface recombination, etc. are reduced, and thereby field effect mobility can be improved. Accordingly, there can be provided the high quality SiC semiconductor device having high reliability.

As explained above, the embodiments provide: the high-quality SiC epitaxial wafer excellent in film thickness uniformity and uniformity of carrier density, having the small number of surface defects, and capable of reducing costs, also in low-off angle SiC substrates on SiC epitaxial growth; the manufacturing apparatus of such a SiC epitaxial wafer; the fabrication method of such a SiC epitaxial wafer; and the semiconductor device.

Other Embodiments

As mentioned above, although the SiC epitaxial wafer, the manufacturing apparatus of the SiC epitaxial wafer, the fabrication method of the SiC epitaxial wafer, and the semiconductor device have been described, as a disclosure including associated description and drawings to be construed as illustrative, not restrictive. This disclosure makes clear a variety of alternative embodiments, working examples, and operational techniques for those skilled in the art.

Such being the case, the embodiments cover a variety of embodiments, whether described or not.

INDUSTRIAL APPLICABILITY

The semiconductor device to which the SiC epitaxial wafer according to the embodiments is applied can be applied to wide applicable fields, e.g., power modules for inverter circuits for driving electric motors utilized as sources of power of electric vehicles (including hybrid cars), trains, industrial robots; and power modules for inverter circuits for transforming electric power generated by electric generators (e.g., solar cells, wind power generators, and the like (in particular private electric generators)) into electric power for commercial power sources, etc.

What is claimed is:

1. A SiC epitaxial wafer comprising:
a substrate having off angle;
a first SiC epitaxial growth layer disposed on the substrate; and
a second SiC epitaxial growth layer disposed on the first SiC epitaxial growth layer, wherein
the first SiC epitaxial growth layer is thinner than the SiC second epitaxial growth layer and has a lower defect density than a defect density of the second epitaxial growth layer, wherein
the uniformity of carrier density of the second SiC epitaxial growth layer is less than 10%, and the defect density of the second SiC epitaxial growth layer is less than 1 count/cm$^2$.

2. The SiC epitaxial wafer according to claim 1, wherein the first SiC epitaxial growth layer comprises a buffer layer disposed on the substrate, and
the second SiC epitaxial growth layer comprises a drift layer disposed on the buffer layer, wherein
a Si (silicon) compound is used for a supply source of Si, and a C (carbon) compound is used as a supply source of C, for the first and second SiC epitaxial growth layers;
the uniformity of carrier density is less than 10%, and the defect density is less than 0.5 count/cm$^2$; and
the C/Si ratio of the Si compound and the C compound in the buffer layer is controlled to be lower than the C/Si ratio of the Si compound and the C compound in the drift layer.

3. The SiC epitaxial wafer according to claim 1, wherein the off angle is equal to or less than 4 degrees.

4. The SiC epitaxial wafer according to claim 1, wherein the Si compound comprises at least one material selected from the group consisting of SiH$_4$, SiH$_3$F, SiH$_2$F$_2$, SiHF$_3$, and SiF$_4$.

5. The SiC epitaxial wafer according to claim 1, wherein the C compound comprises at least one material selected from the group consisting of C$_3$H$_8$, C$_2$H$_4$, C$_2$H$_2$, CF$_4$, C$_2$F$_6$, C$_3$F$_8$, C$_4$F$_6$, C$_4$F$_8$, C$_5$F$_8$, CHF$_3$, CH$_2$F$_2$, CH$_3$F, and C$_2$HF$_5$.

6. The SiC epitaxial wafer according to claim 1, wherein the first and second SiC epitaxial growth layers comprise one material selected from the group consisting of 4H—SiC, 6H—SiC, 2H—SiC, and 3C—SiC.

7. The SiC epitaxial wafer according to claim 1, wherein a diameter of the substrate is equal to or greater than 100 mm.

8. The SiC epitaxial wafer according to claim 1, wherein the substrate comprises one material selected from the group consisting of 4H—SiC, 6H—SiC, BN, AlN, Al$_2$O$_3$, Ga$_2$O$_3$, diamond, carbon, and graphite.

9. A semiconductor device comprising a SiC epitaxial wafer, wherein the SiC epitaxial wafer comprises:
a substrate having low-off angle of less than 4 degrees; and
a SiC epitaxial growth layer disposed on the substrate, wherein
a Si (silicon) compound is used for a supply source of Si, and a C (carbon) compound is used as a supply source of C, for the SiC epitaxial growth layer, wherein
the uniformity of carrier density is less than 10%, and the defect density is less than 1 count/cm$^2$; and a C/Si ratio between the Si compound and the C compound is within a range of 0.7 to 0.95.

10. The semiconductor device according to claim 9, wherein
the semiconductor device comprises one selected from the group consisting of a SiC Schottky barrier diode, a SiC-MOSFET, a SiC bipolar junction transistor, a SiC diode, a SiC thyristor, and a SiC insulated gate bipolar transistor.

* * * * *